United States Patent
Moroz et al.

(10) Patent No.: US 10,312,229 B2
(45) Date of Patent: Jun. 4, 2019

(54) MEMORY CELLS INCLUDING VERTICAL NANOWIRE TRANSISTORS

(71) Applicant: Synopsys, Inc., Mountain View, CA (US)

(72) Inventors: Victor Moroz, Saratoga, CA (US); Jamil Kawa, Campbell, CA (US); Thu Nguyen, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/789,870

(22) Filed: Oct. 20, 2017

(65) Prior Publication Data
US 2018/0122793 A1 May 3, 2018

Related U.S. Application Data

(60) Provisional application No. 62/414,461, filed on Oct. 28, 2016.

(51) Int. Cl.
*H01L 27/02* (2006.01)
*H01L 27/11* (2006.01)
(Continued)

(52) U.S. Cl.
CPC ...... *H01L 27/0207* (2013.01); *G06F 17/5072* (2013.01); *H01L 23/535* (2013.01);
(Continued)

(58) Field of Classification Search
CPC ............. H01L 27/0688; H01L 27/1104; H01L 27/1108
See application file for complete search history.

(56) References Cited

U.S. PATENT DOCUMENTS 5,406,497 A    4/1995 Altheimer et al.
5,610,833 A    3/1997 Chang et al.
(Continued)

FOREIGN PATENT DOCUMENTS

EP    1804286 A1    7/2007
EP    2254149 A2    11/2010
(Continued)

OTHER PUBLICATIONS

Nanowire', Wikipedia, The Free Encyclopedia, Apr. 29, 2014, 20:58 UTC, <<http://en.wikipedia.org/w/index.php?title=Nanowire&oldid=606387154>> [accessed May 20, 2014].
(Continued)

*Primary Examiner* — Thao P Le
(74) *Attorney, Agent, or Firm* — Haynes Beffel & Wolfeld LLP; Yiding Wu

(57) ABSTRACT

A circuit including an SRAM cell with a set of vertical nanowire transistor columns is provided. Each member of the set includes a vertical nanowire transistor and at least one member of the set is a vertical nanowire transistor column including two vertical nanowire transistors in series. The set can consist of four vertical nanowire transistor columns, a first column including two n-type vertical nanowire transistors, a second column including two n-type vertical nanowire transistors, a third column including one p-type vertical nanowire transistor and a fourth column including one p-type vertical nanowire transistor. EDA tools for such circuits are also provided.

36 Claims, 38 Drawing Sheets

(51) Int. Cl.
*G06F 17/50* (2006.01)
*H01L 29/786* (2006.01)
*H01L 23/535* (2006.01)
*H01L 29/06* (2006.01)
*H01L 29/775* (2006.01)
*H01L 29/423* (2006.01)
*H01L 29/66* (2006.01)
*H01L 27/06* (2006.01)
*H01L 21/8238* (2006.01)

(52) U.S. Cl.
CPC ...... *H01L 27/1104* (2013.01); *H01L 27/1108* (2013.01); *H01L 29/0676* (2013.01); *H01L 29/4238* (2013.01); *H01L 29/66439* (2013.01); *H01L 29/775* (2013.01); *H01L 29/78642* (2013.01); *H01L 29/78696* (2013.01); *H01L 21/823885* (2013.01); *H01L 27/0688* (2013.01)

(56) References Cited

U.S. PATENT DOCUMENTS

| | | | |
|---|---|---|---|
| 5,612,563 | A | 3/1997 | Fitch et al. |
| 6,155,725 | A | 12/2000 | Scepanovic et al. |
| 6,314,019 | B1 | 11/2001 | Kuekes et al. |
| 6,340,882 | B1 | 1/2002 | Chung et al. |
| 6,601,220 | B1 | 7/2003 | Allen et al. |
| 6,845,494 | B2 | 1/2005 | Burks et al. |
| 6,897,098 | B2 | 5/2005 | Hareland et al. |
| 7,378,702 | B2 | 5/2008 | Lee |
| 7,709,827 | B2 | 5/2010 | Graham et al. |
| 7,908,571 | B2 | 3/2011 | Bowers et al. |
| 8,212,235 | B2 | 7/2012 | Wang et al. |
| 8,237,228 | B2 | 8/2012 | Or-Bach et al. |
| 8,490,244 | B1 | 7/2013 | Joshi et al. |
| 8,492,208 | B1 | 7/2013 | Cohen et al. |
| 8,549,455 | B2 | 10/2013 | Quandt et al. |
| 8,581,349 | B1 | 11/2013 | Sekar et al. |
| 8,587,989 | B2 | 11/2013 | Manning et al. |
| 8,595,661 | B2 | 11/2013 | Kawa et al. |
| 8,649,202 | B2 | 2/2014 | Sakaguchi et al. |
| 8,667,443 | B2 | 3/2014 | Smayling et al. |
| 8,669,778 | B1 | 3/2014 | Or-Bach et al. |
| 8,791,446 | B2 | 7/2014 | Ishibashi |
| 8,839,175 | B2 | 9/2014 | Smayling et al. |
| 8,863,063 | B2 | 10/2014 | Becker et al. |
| 8,875,071 | B2 | 10/2014 | Wang et al. |
| 8,890,117 | B2 | 11/2014 | Wernersson |
| 8,932,915 | B2 | 1/2015 | Saitoh et al. |
| 9,009,638 | B1 | 4/2015 | Hook et al. |
| 9,021,414 | B1 | 4/2015 | Or-Bach et al. |
| 9,361,418 | B2 | 6/2016 | Moroz et al. |
| 9,378,320 | B2 | 6/2016 | Kawa et al. |
| 9,400,862 | B2 | 7/2016 | Kawa et al. |
| 9,419,003 | B1 | 8/2016 | Colinge et al. |
| 9,472,468 | B2 | 10/2016 | van Dal et al. |
| 9,472,551 | B2 | 10/2016 | Oxland |
| 9,515,077 | B1 | 12/2016 | Liaw |
| 9,530,863 | B1 * | 12/2016 | Zhang ............... H01L 29/66545 |
| 9,558,809 | B1 | 1/2017 | Liaw |
| 9,620,509 | B1 | 4/2017 | Pao et al. |
| 9,711,511 | B1 | 7/2017 | Lim et al. |
| 9,721,957 | B2 | 8/2017 | Nakanishi et al. |
| 2001/0045670 | A1 | 11/2001 | Nojiri |
| 2003/0009734 | A1 | 1/2003 | Burks et al. |
| 2003/0229866 | A1 | 12/2003 | Allen et al. |
| 2004/0031975 | A1 | 2/2004 | Kern et al. |
| 2005/0023633 | A1 | 2/2005 | Yeo et al. |
| 2006/0064665 | A1 | 3/2006 | Zhang |
| 2006/0086958 | A1 | 4/2006 | Eimori |
| 2007/0052012 | A1 | 3/2007 | Forbes |
| 2007/0146008 | A1 | 6/2007 | Tak et al. |
| 2008/0224122 | A1 | 9/2008 | Saitoh et al. |
| 2008/0246076 | A1 | 10/2008 | Chen |
| 2008/0272361 | A1 | 11/2008 | Lim |
| 2008/0315430 | A1 | 12/2008 | Weber et al. |
| 2009/0020787 | A1 | 1/2009 | Shioya et al. |
| 2009/0055789 | A1 | 2/2009 | McIlrath |
| 2010/0155702 | A1 | 6/2010 | Wernersson |
| 2010/0264496 | A1 | 10/2010 | Thomas et al. |
| 2010/0295024 | A1 | 11/2010 | Pernel et al. |
| 2011/0012085 | A1 | 1/2011 | Deligianni et al. |
| 2011/0031473 | A1 | 2/2011 | Chang et al. |
| 2011/0185323 | A1 | 7/2011 | Hogan et al. |
| 2011/0188281 | A1 | 8/2011 | Siau et al. |
| 2011/0231811 | A1 | 9/2011 | Tang et al. |
| 2011/0233512 | A1 | 9/2011 | Yang et al. |
| 2011/0249489 | A1 | 10/2011 | Bangsaruntip et al. |
| 2011/0252392 | A1 | 10/2011 | Saika |
| 2012/0091587 | A1 | 4/2012 | Or-Bach et al. |
| 2012/0129301 | A1 | 5/2012 | Or-Bach et al. |
| 2012/0326119 | A1 | 12/2012 | Ju et al. |
| 2013/0154027 | A1 | 6/2013 | Liaw |
| 2013/0174115 | A1 | 7/2013 | Tang et al. |
| 2013/0207199 | A1 | 8/2013 | Becker et al. |
| 2013/0272056 | A1 | 10/2013 | Liaw |
| 2013/0313513 | A1 | 11/2013 | Cappellani et al. |
| 2013/0334613 | A1 | 12/2013 | Moroz |
| 2014/0003133 | A1 | 1/2014 | Lin et al. |
| 2014/0015135 | A1 | 1/2014 | Rieger et al. |
| 2014/0040843 | A1 | 2/2014 | Postman et al. |
| 2014/0073063 | A1 | 3/2014 | Lieber et al. |
| 2014/0084249 | A1 | 3/2014 | Basker et al. |
| 2014/0087523 | A1 | 3/2014 | Basker et al. |
| 2014/0097502 | A1 | 4/2014 | Sun et al. |
| 2014/0151639 | A1 | 6/2014 | Chang et al. |
| 2014/0166981 | A1 | 6/2014 | Doyle et al. |
| 2014/0239255 | A1 | 8/2014 | Kang et al. |
| 2014/0315363 | A1 | 10/2014 | Balakrishnan et al. |
| 2014/0353574 | A1 | 12/2014 | Li et al. |
| 2015/0037094 | A1 | 2/2015 | Williford |
| 2015/0069328 | A1 | 3/2015 | Leobandung |
| 2015/0112646 | A1 | 4/2015 | Kamal et al. |
| 2015/0295040 | A1 | 10/2015 | Tsai et al. |
| 2015/0318288 | A1 | 11/2015 | Lim et al. |
| 2015/0356223 | A1 | 12/2015 | Balakrishnan et al. |
| 2015/0370947 | A1 | 12/2015 | Moroz et al. |
| 2015/0370948 | A1 | 12/2015 | Kawa et al. |
| 2015/0370950 | A1 * | 12/2015 | Kawa ................ G06F 17/5072 716/119 |
| 2015/0370951 | A1 * | 12/2015 | Kawa ................ G06F 17/5072 716/119 |
| 2015/0380547 | A1 | 12/2015 | Liaw |
| 2015/0380548 | A1 * | 12/2015 | Wang ................ H01L 29/7827 257/329 |
| 2016/0063163 | A1 * | 3/2016 | Moroz ............... H01L 29/0676 716/110 |
| 2016/0078922 | A1 | 3/2016 | Liaw |
| 2016/0172246 | A1 | 6/2016 | van Dal et al. |
| 2017/0025412 | A1 * | 1/2017 | Jun .................. H01L 21/82348 |
| 2017/0221884 | A1 | 8/2017 | Machkaoutsan et al. |

FOREIGN PATENT DOCUMENTS

| | | |
|---|---|---|
| EP | 2378557 A1 | 10/2011 |
| KR | 100585157 B1 | 5/2006 |
| KR | 10-1076767 B1 | 10/2011 |
| TW | 201407396 A | 2/2014 |
| TW | 201614529 A | 4/2016 |
| WO | 2012069606 A2 | 5/2012 |
| WO | 2013095646 A1 | 6/2013 |
| WO | 2013101230 A1 | 7/2013 |
| WO | 2014018201 A1 | 1/2014 |

OTHER PUBLICATIONS

Avci, et al., "Energy Efficiency Comparison of Nanowire Heterojunction TFET and Si MOSFET at Lg=13nm, Including P-TFET and Variation Considerations," 2013 IEEE, IEDM13-830, pp. 33.4.1-33.4.4.

Bernard, et al., "Novel integration process and performances analysis of Low STandby Power (LSTP) 3D multi-channel CMOSFET

(56) References Cited

OTHER PUBLICATIONS (MCFET) on SOI with metal / high-K gate stack," 2008 Symp. on VLSI Technology, Jun. 17-19, 2008, 2 pages.
Ernst, et al., (Jun. 2008). 3D multichannels and stacked nanowires technologies for new design opportunities in nanoelectronics. In Integrated Circuit Design and Technology and Tutorial, 2008. ICICDT 2008. IEEE International Conference on (pp. 265-268). IEEE.
Geim et al., "Van der Waals Heterostructures," Jul. 25, 2013, vol. 499, Nature 419-425.
Gholipour et al., "Design Investigation of Nanoelectronic Circuits using Crossbar-based Nanoarchitectures", Feb. 2013, Elsevier Ltd., Microelectronics Journal 44, pp. 199-200.
Gholipour et al., "A Comparative Study of Nanowire Crossbar and MOSFET Logic Implementations", International Conference on Computer as a Tool (EUROCON), 2011 IEEE, pp. 1-4, Apr. 27-29, 2011.
Goldberger et al., "Silicon Vertically Integrated Nanowire Field Effect Transistors," American Chemical Society, Nano Letters 2006, vol. 6, No. 5, 973-977.
Goldberger et al., "Vertically Integrated Nanowire Field Effect Transistors," 2006, consisting of 7 pages.
Hochbaum et al., "Controlled Growth of Si Nanowire Arrays for Device Integration," American Chemical Society, Nano Letters 2005, vol. 5, No. 3, 457-460.
Ma, et al., "Modeling of stress-retarded orientation-dependent oxidation: shape engineering of silicon nanowire channels," 2009 IEEE Electron Devices Meeting, Dec. 7-9, 2009, 4 pages.
Panchapakeshan, et al., "N3ASICs: Designing nanofabrics with fine-grained CMOS integration," 2011 IEEE/ACM Int'l Symp. on Nanoscale Architectures (NANOARCH), pp. 196-202, Jun. 8-9, 2011.
PCT/US15/037169—International Preliminary Report on Patentability dated Dec. 27, 2016, 5 pages.
PCT/US15/037169—International Search Report dated Aug. 31, 2015, 9 pages.
PCT/US2015/037217—International Preliminary Report on Patentability dated Dec. 27, 2016, 11 pages.
PCT/US2015/037217—International Search Report dated Sep. 30, 2015, 15 pages.
PCT/US2015/037252—International Preliminary Report on Patentabiity dated Dec. 27, 2016, 8 pages.
PCT/US2015/037252—International Search Report dated Oct. 8, 2015, 10 pages.
PCT/US2015/046891—International Search Report and Written Opinion dated Mar. 18, 2016, 11 pages.
Snider, et al., "Nano/CMOS architectures using a field-programmable nanowire interconnect," Nanotechnology 18 (3), Jan. 3, 2007, 11 pages.
Strukov et al., "Monlithically Stackable Hybrid FPGA", 2010, EDAA, Proceedings of Conference on Design, Automation and Test in Europe, pp. 661-666.
TW 104120193—Notice of Allowance dated Oct. 13, 2016, 4 pages.
TW 104127906—First Office Action dated Aug. 22, 2016, 12 pages.
TW 104127906—Notice of Allowance dated Nov. 30, 2016, 2 pages.
TW 104127906—Response to First Office Action dated Aug. 22, 2016 filed Nov. 22, 2016, 18 pages.
U.S. Appl. No. 14/312,040—Final Office Action dated Dec. 15, 2016, 60 pages.
U.S. Appl. No. 14/312,040—Office Action dated Feb. 10, 2017, 62 pages.
U.S. Appl. No. 14/312,040—Office Action dated Aug. 12, 2016, 72 pages.
U.S. Appl. No. 14/312,040—Response to Final Office Action dated Dec. 15, 2016 filed Jan. 24, 2017, 23 pages.
U.S. Appl. No. 14/312,040—Response to Office Action dated Aug. 12, 2016 filed Nov. 14, 2016, 21 pages.
U.S. Appl. No. 14/312,141—Office Action dated Oct. 20, 2016, 59 pages.
U.S. Appl. No. 14/312,141—Response to Office Action dated Oct. 20, 2016 filed Jan. 23, 2017, 22 pages.
U.S. Appl. No. 14/312,186—Notice of Allowance dated Feb. 5, 2016, 13 pages.
U.S. Appl. No. 14/312,186—Office Action dated Sep. 11, 2015, 11 pages.
U.S. Appl. No. 14/312,186—Response to Office Action dated Sep. 11, 2015 filed Jan. 6, 2016, 14 pages.
U.S. Appl. No. 14/312,285—Notice of Allowance dated Feb. 25, 2016, 14 pages.
U.S. Appl. No. 14/312,285—Office Action dated Sep. 16, 2015, 8 pages.
U.S. Appl. No. 14/312,285—Response to Office Action dated Sep. 16, 2015 filed Jan. 5, 2016, 9 pages.
U.S. Appl. No. 14/312,352—Notice of Allowance dated Dec. 2, 2015, 9 pages.
U.S. Appl. No. 14/312,352—Notice of Allowance dated Mar. 23, 2016, 11 pages.
U.S. Appl. No. 14/312,352—Office Action dated Aug. 17, 2015, 12 pages.
U.S. Appl. No. 14/312,352—Response to Office Action dated Aug. 17, 2015 filed Nov. 3, 2015, 8 pages.
U.S. Appl. No. 15/174,493—Office Action dated Feb. 2, 2017, 11 pages.
U.S. Appl. No. 15/222,760—Office Action dated Sep. 23, 2016, 32 pages.
U.S. Appl. No. 15/222,760—Response to Office Action dated Sep. 23, 2016 filed Jan. 23. 2017, 18 pages.
Wang et al., Silicon p-FETs from Ultrahigh Density Nanowire Arrays, Nano Lett. 6, May 2, 2006, 1096-1100.
Whang et al., "Large-Scale Hierarchical Organization of Nanowires for Functional Nanosystems," Japanese Journal of Applied Physics, vol. 43, No. 7B, Jul. 2004, pp. 4465-4470.
Wong et al., "Carbon Nanotube Field Effect Transistors—Fabrication, Device Physics, and Circuit Implications," 2003 IEEE Int'l Solid-State Circuits Conference, ISSCC Feb. 13, 2003, pp. 370-500.
U.S. Appl. No. 15/174,493—Response to Office Action dated Feb. 2, 2017 filed Feb. 22, 2017, 14 pages.
U.S. Appl. No. 15/174,493—Notice of Allowance dated Mar. 15, 2017, 19 pages.
PCT/US2015/046891—International Preliminary Report on Patentability dated Feb. 28, 2017, 7 pages.
EP 15811255.7—Rule 161(2) EPC Communication dated Feb. 3, 2017, 2 pages.
EP 15810985.0—Rule 161(2) EPC Communication dated Feb. 3, 2017, 2 pages.
EP 15811947.9—Rule 161(2) EPC Communication dated Feb. 3, 2017, 2 pages.
U.S. Appl. No. 14/312,040—Response to Office Action dated Feb. 10, 2017 filed May 4, 2017, 23 pages.
U.S. Appl. No. 14/312,040—Final Office Action dated May 18, 2017, 90 pages.
U.S. Appl. No. 15/222,760—Final Office Action dated May 19, 2017, 63 pages.
U.S. Appl. No. 14/834,780—Office Action dated May 19, 2017, 50 pages.
U.S. Appl. No. 14/312,141—Final Office Action dated Jun. 2, 2017, 61 pages.
CN 201580044071.4—Voluntary Amendments filed Jul. 27, 2017, 17 pages.
EP 15811255.7—Response to Rule 161(2) EPC Communication dated Feb. 3, 2017 filed Aug. 7, 2017, 13 pages.
EP 15810985.0—Response to Rule 161(2) EPC Communication dated Feb. 3, 2017 filed Aug. 7, 2017, 10 pages.
EP 15811947.9—Response to Rule 161(2) EPC Communication dated Feb. 3, 2017 filed Aug. 7, 2017, 22 pages.
CN 201580044064.4—Voluntary Amendments filed Aug. 17, 2017, 16 pages.
CN 201580044065.9—Voluntary Amendments filed Sep. 1, 2017, 39 pages.

(56) References Cited

OTHER PUBLICATIONS

Dong et al., "Nanowire Crossbar Logic and Standard Cell-Based Integration," IEEE Transactions on Very Large Scale Integration (VLSI) Systems, vol. 17, No. 8, Aug. 2009, pp. 997-1007.

N. Shen et al., "Fabrication and Characterization of Poly-Si Vertical Nanowire Thin Film Transistor," International Journal of Chemical, Molecular, Nuclear, Materials and Metallurgical Engineering, 2011, vol. 5, No. 9, pp. 784-786.

U.S. Appl. No. 14/312,141—Office Action dated Oct. 20, 2017, 32 pages.

EP 15835735-0—Voluntary Amendments filed Oct. 9, 2017, 9 pages.

U.S. Appl. No. 14/312,040—Office Action dated Nov. 3, 2017, 20 pages.

CN—201580045916.1—Voluntary Amendments filed Nov. 29, 2017, 25 pages.

Shen et al., "Fabrication and Characterization of Poly-Si Vertical Nanowire Thin Film Transistor," International Journal of Materials and Metallurgical Engineering, vol. 5, No. 9, 2011.

EP 15811255.7—Extended European Search Report dated Jan. 16, 2018, 13 pages.

Bobba et al, "Design Methodologies and CAD for Emerging Nanotechnologies", Jul. 4, 2013, XP055437003, URL: http://icww.epfl.ch/-demichel/graduates/these/shashi.pdf, p. 104, lines 3-7.

EP 15810985.0—Extended European Search Report dated Jan. 26, 2018, 13 pages.

Gaillardon, et al.—"Vertically-Stacked Double-Gate Nanowire FETs with Controllable Polarity: From Devices to Regular ASICs", Design, Automation & Test in Europe Conference & Exhibition, 2013, IEEE, Mar. 18, 2013, pp. 625-630, XP032395789, ISBN: 978-1-4673-5071-6.

EP 15811947.9—Partial Supplementary European Search Report dated Feb. 27, 2018, 13 pages.

EP 15835735.0—Extended Search Report dated Mar. 23, 2018, 14 pages.

Gaillardon, et al., "Reconfigurable Logic Architectures based on Disruptive Technologies", PhD Thesis, Sep. 15, 2011, pp. 1-145, URL: http://bibli.ec-lyon.fr/exl-doc/TH_T2224_pgaillardon.pdf.

Rahman et al., "Skybridge: 3-D Integrated Circuit Technology Alternative to CMOS", Apr. 2, 2014, pp. 1-52, XP055459125, URL: https://arxiv.org/ftp/arxiv/papers/1404/1404.0607.pdf.

Gaillardon et al., "Can we go Towards True 3-D Architectures?", Design Automation Conference (DAC) 2011, Jun. 5-10, 2011, pp. 282-283, XP031927752, San Diego, CA, USA, ISBN: 978-1-4503-0636-2.

Li et al., "Vertically Stacked and Independently Controlled Twin-Gate MOSFETs on a Single Si Nanowire", IEEE Electron Device Letters, IEEE Service Center, NY, NY, US, vol. 32, No. 11, Sep. 26, 2011, pp. 1492-1494, XP011358287, ISSN: 0741-3106.

U.S. Appl. No. 14/312,141—Final Office Action dated Mar. 26, 2018, 33 pages.

U.S. Appl. No. 14/312,040—Notice of Allowance dated Apr. 4, 2018, 17 pages.

U.S. Appl. No. 14/834,780—Office Action dated May 2, 2018, 23 pages.

EP 15811947.9—Extended European Search Report dated Jun. 7, 2018, 17 pages.

Agarwal, et al, "Design Optimization of Gate-All-Around Vertical Nanowire Transistors for Future Memory Applications", 2013 IEEE International Conference of Electron Devices and Solid-State Circuits, IEEE, Jun. 3, 2013, pp. 1-2, XP032502464.

EP 15811255.7—Response to Extended European Search Report dated Jan. 16, 2018 filed Aug. 10, 2018, 27 pages.

TW 106136679—First Office Action dated Aug. 14, 2018, 23 pages.

EP 15810985.0—Response to Extended European Search Report dated Jan. 26, 2018 filed Aug. 23, 2018, 18 pages.

U.S. Appl. No. 14/312,141—Office Action dated Sep. 7, 2018, 19 pages.

EP 15835735.0—Response to Extended Search Report dated Mar. 23, 2018, as filed Oct. 10, 2018, 39 pages.

U.S. Appl. No. 14/834,780—Final Office Action dated Sep. 24, 2018, 28 pages.

TW 106136679—Response to First Office Action dated Aug. 14, 2018, as filed on Oct. 26, 2018, 56 pages.

U.S. Appl. No. 15/217,252—Notice of Allowance dated Nov. 20, 2018, 17 pages.

EP 15811947.9—Response to Extended European Search Report dated Jun. 7, 2018, filed Jan. 4, 2019, 19 pages.

* cited by examiner

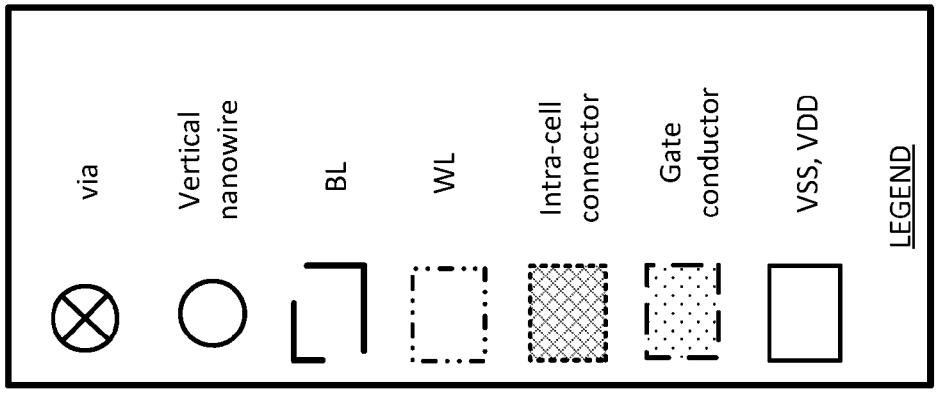
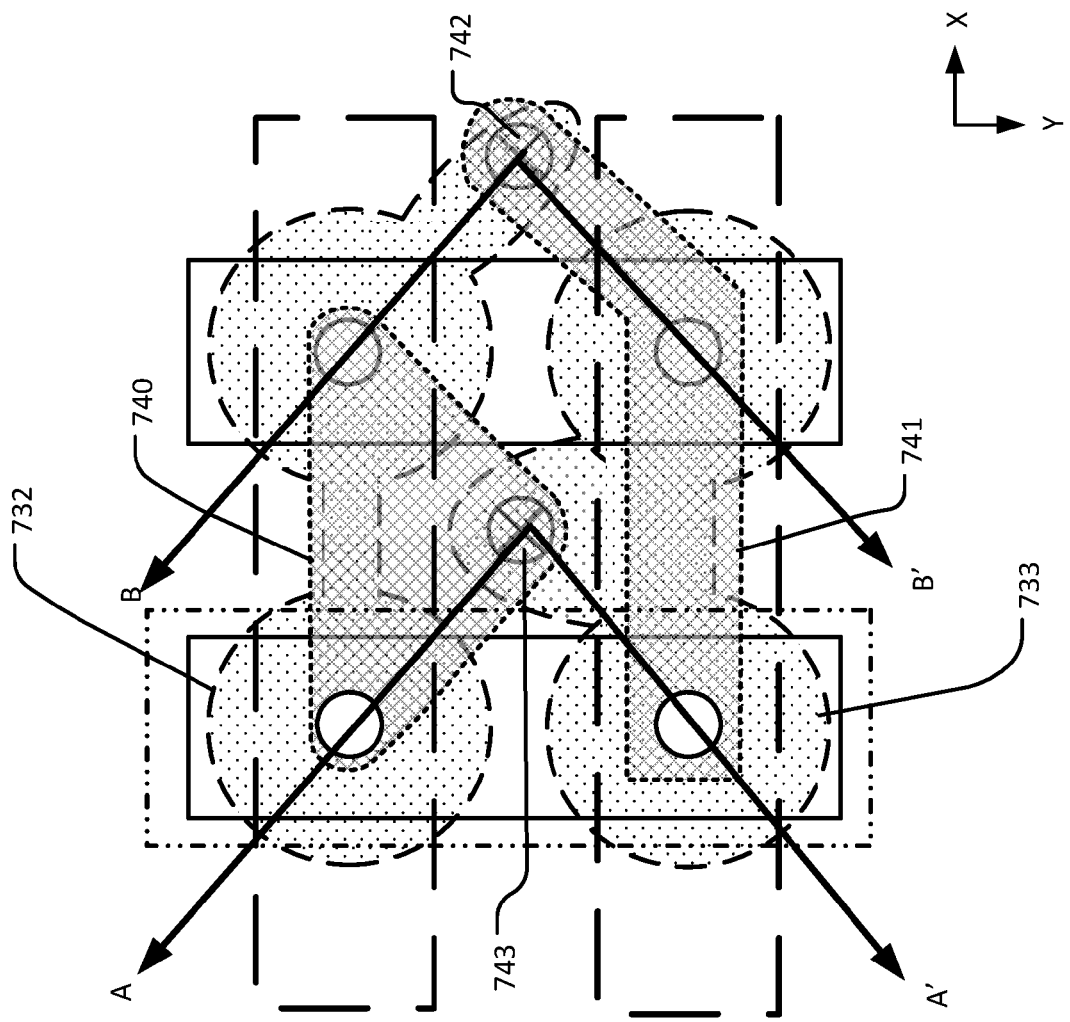
FIG. 7

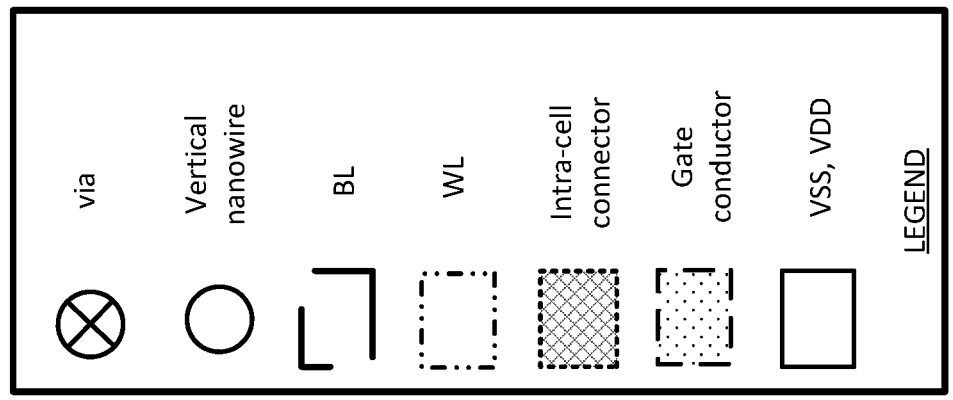
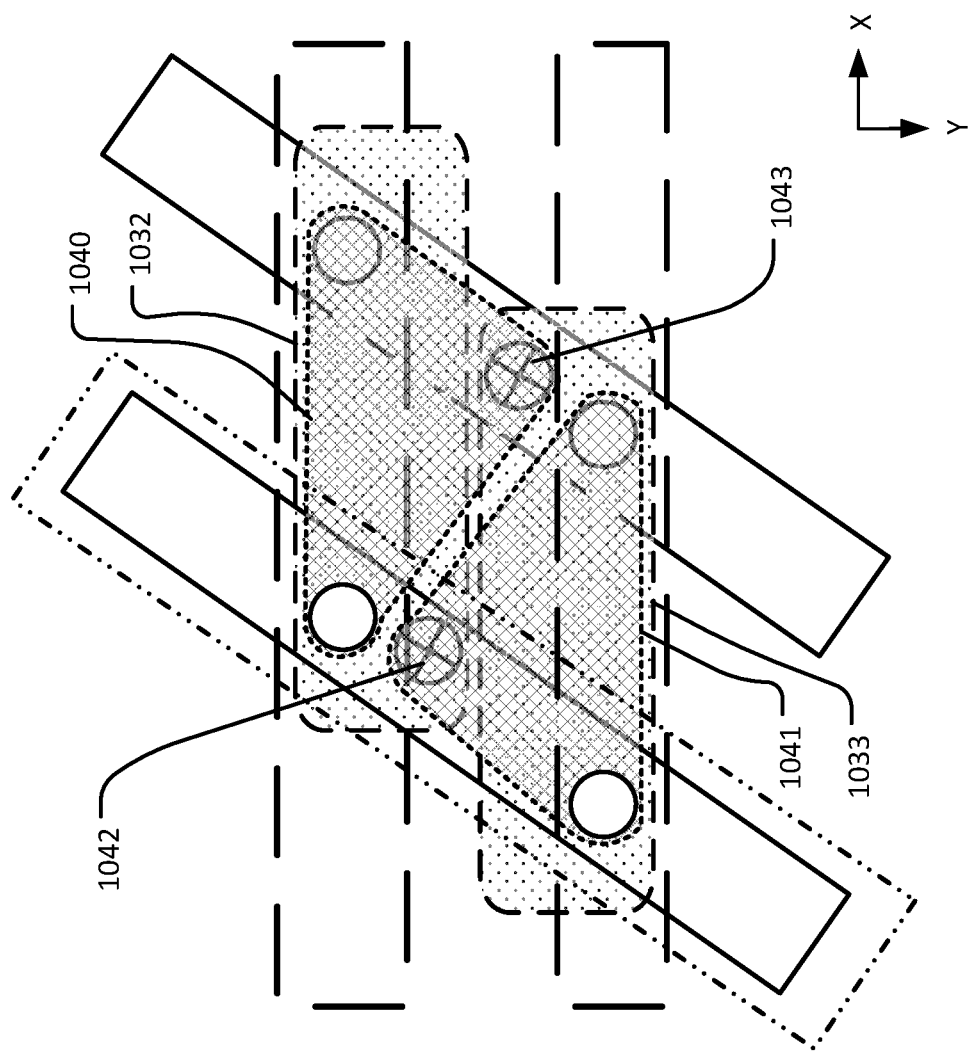
FIG. 10

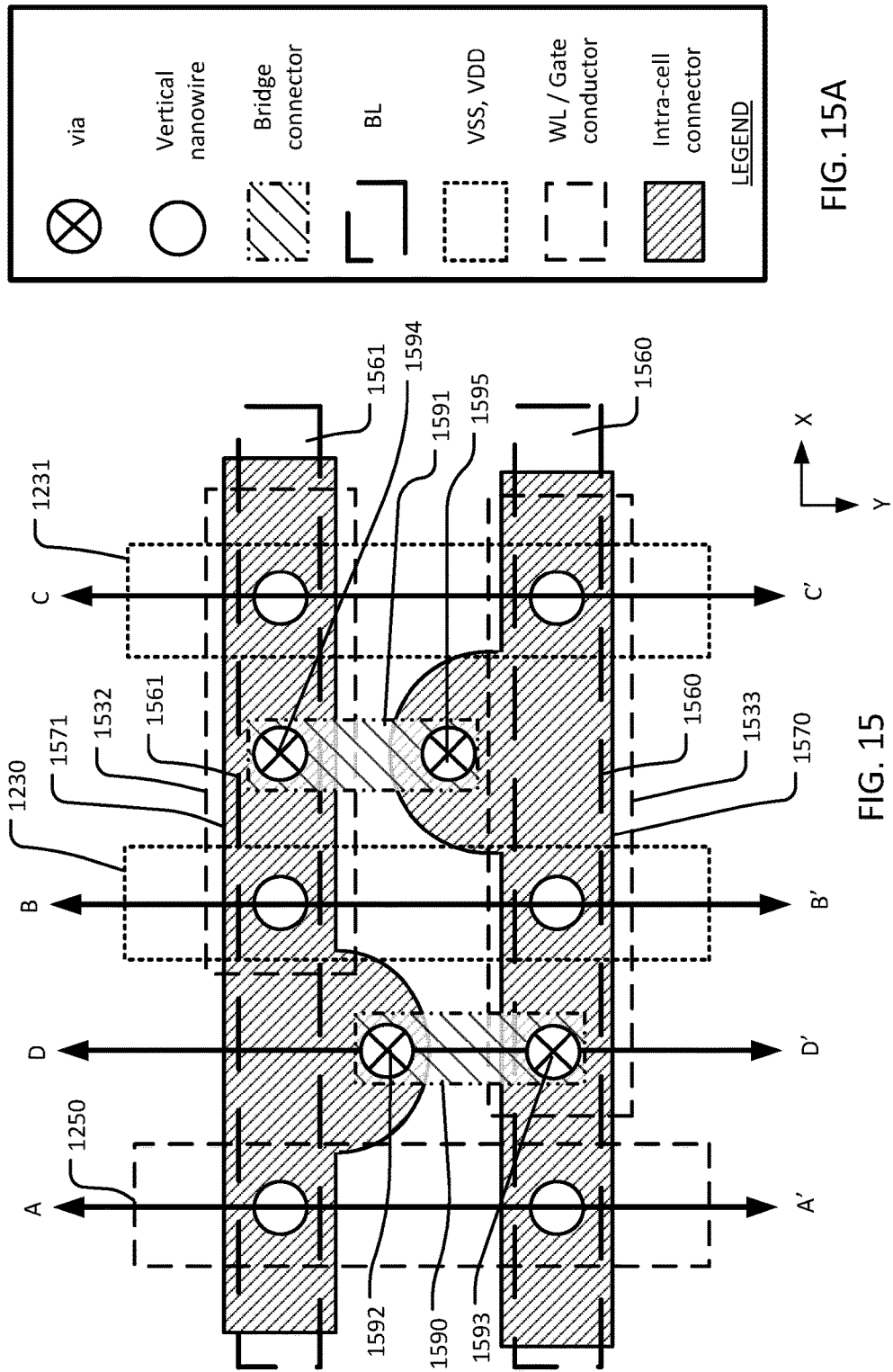

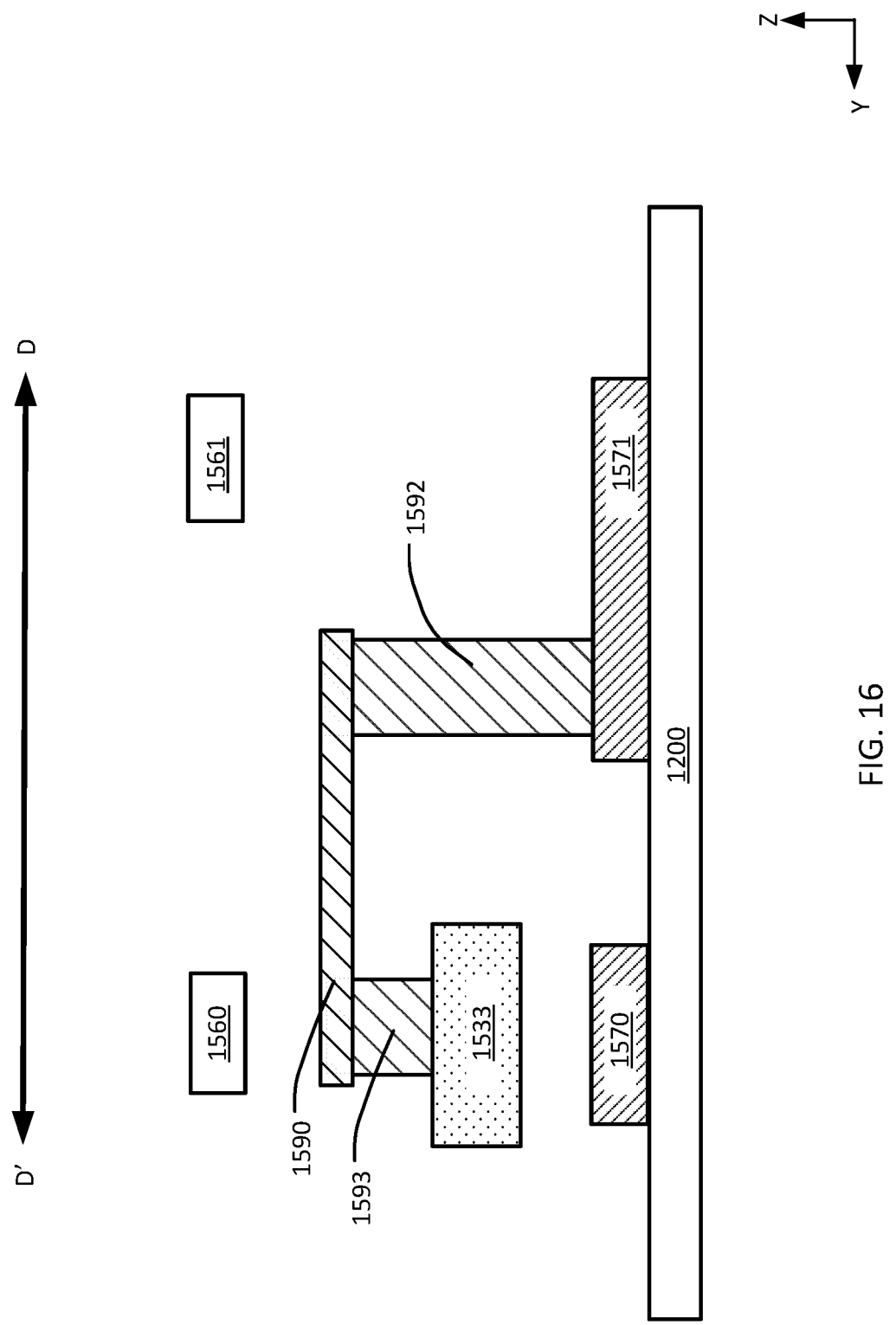

MEMORY CELLS INCLUDING VERTICAL NANOWIRE TRANSISTORS

PRIORITY APPLICATION

This application claims the benefit of U.S. Provisional Patent Application No. 62/414,461 filed 28 Oct. 2016 which application is incorporated herein by reference.

BACKGROUND

Field of the Invention

The present invention relates to memory cells, and more particularly relates to memory cells including nanowire transistors.

Description of Related Art

In the design of integrated circuits, standard cell libraries are often utilized. The process of designing the cells specified by entries in the cell libraries can be intensive, where trade-offs among variables such as the size of the cells, the drive power of the cells, the speed of the cells and so on, are made by adjusting the materials, geometry and size of the components of the cell. The procedure of designing cells to be specified in a cell library is often a labor-intensive process, requiring highly skilled designers to manually design and refine the designs of the cells.

The development of finFETs has provided some additional flexibility for designers which can be applied in the efficient design of variations of specific cells. Thus, some functional libraries are based on finFETs. FinFETs have been implemented in block structures having a grid structure, in which fins are laid out in parallel in a first direction on a substrate with a narrow pitch, and gates are laid out in an orthogonal direction across the fins. The individual cells are formed using sets of complementary n-channel and p-channel transistors having their source, drain and channel in the fins. The drive power and other characteristics of individual transistors in a cell utilizing finFETs can be adjusted by increasing or decreasing the number of identical fins utilized in parallel as the channel structure for a given transistor. This provides some granularity of design in the development of a cell library. However, many circuit parameters can benefit from finer tuning of circuit structures. To fine tune finFET type circuits, complex reconfiguration of the fins or other structures may be required.

The following documents describe developments in the nanowire and 2D material field, and are incorporated by reference for all information presented therein:
Van der Waals Heterostructures, A. K. Geim et al., 25 Jul. 2013|VOL 499|NATURE|419-425;
Vertically Integrated Nanowire Field Effect Transistors, Josh Goldberger et al., Department of Chemistry, University of California, Berkeley, and Materials Science Division, Lawrence Berkeley National Laboratory;
Silicon Vertically Integrated Nanowire Field Effect Transistors, Josh Goldberger et al., Nano Letters, 2006 Vol. 6, No. 5 973-977;
Controlled Growth of Si Nanowire Arrays for Device Integration, Allon I. Hochbaum et al., Nano Letters, 2005 Vol. 5, No. 3 457-460;
Modeling of Stress-retarded Orientation-dependent Oxidation: Shape Engineering of Silicon Nanowire Channels, F.-J ma et al., 97-4244-5640-6/09 ©2009 IEEE, IEDM09-517-520, 21.5.1-21.5.4;
Energy Efficiency Comparison of Nanowire Heterojunction TFET and Si MOSFET at Lg=13 nm, Including P-TFET and Variation Considerations, Uygar E. Avci et al., 978-1-4799-2306-9/13 ©2013 IEEE, IEDM13-830-833, 33.4.1-33.3.4;
US Patent Application Publication No. 2014/0015135, Pub. Date Jan. 16, 2014, titled Self-Aligned Via Interconnect Using Relaxed Patterning Exposure, Michael L. Rieger et al.;
Novel integration process and performances analysis of Low STandby Power (LSTP) 3D Multi-Channel CMOSFET (MCFET) on SOI with Metal/High-K Gate stack, E. Bernard et al., 978-1-4244-1805-3/08 ©2008, 16-17.
U.S. Pub. No.: US 2015/0370948, published 24 Dec. 2015, entitled MEMORY CELLS HAVING TRANSISTORS WITH DIFFERENT NUMBERS OF NANOWIRES OR 2D MATERIAL STRIPS by Kawa and Moroz, describes circuit structures implemented using nanowires and 2D material strips, including SRAM cells implemented using these materials. In one embodiment, an SRAM cell is configured using vertical transistors with nanowire interconnects (See, FIG. 28). However, the area of the SRAM cell is relatively large in these examples. For SRAM cells, the size of the cell is a critical factor in operating speed and in power consumption. One reason the size of the cell is critical in SRAM arrays arises because each cell much have sufficient power to pull down or pull up the capacitance of the bit line coupled to the cell. With smaller cells, the length of the bit line for a given number of cells in the array can be reduced, reducing the bit line capacitance.

These issues relating to compact layouts also apply in many respects to logic cells, in general and other circuit components.

It is desirable to provide a cell design architecture suitable for implementation of cells for a cell library that can provide for smaller layouts, permitting finer variations in circuit parameters.

SUMMARY

Circuit structures are described based on vertical nanowire columns including one or more vertical nanowire transistors, which have features enabling compact layouts.

A circuit described herein comprises an SRAM cell, the SRAM cell comprising a set of vertical nanowire transistor columns, each member of the set including a vertical nanowire transistor, and at least one member of the set being a vertical nanowire transistor column including two vertical nanowire transistors in series. In one embodiment described herein, the set consists of four vertical nanowire transistor columns, a first column including two n-type vertical nanowire transistors, a second column including two n-type vertical nanowire transistors, a third column including one p-type vertical nanowire transistor and a fourth column including one p-type vertical nanowire transistor.

A circuit described herein comprises an SRAM cell, the SRAM cell comprising a set consisting of six vertical nanowire transistor columns arranged in layout in a parallelogram, each member of the set including a single vertical nanowire transistor, the six columns including first through fourth columns including n-type vertical nanowire transistors, and fifth and sixth columns including p-type vertical nanowire transistors The SRAM cell includes a first intra-cell connector including a conductor below the first, third and fifth columns, and connecting a current path terminal of the p-type vertical nanowire transistor ($PU_L$) in the fifth column to a current path terminal of the n-type vertical nanowire transistor (PD$_L$) in the first column, and the n-type vertical nanowire transistor (PG$_L$) in the third column, and a connection to gates of the n-type vertical nanowire transistor (PD$_R$) in the second column, and of the p-type vertical nanowire transistor (PU$_R$) in the sixth column, and a second intra-cell connector including a conductor below the second, fourth and sixth columns, and connecting a current path terminal of the p-type vertical nanowire transistor (PU$_R$) in the sixth column to a current path terminal of the n-type vertical nanowire transistor (PD$_R$) in the second column, and the n-type vertical nanowire transistor (PG$_R$) in the fourth column, and a connection to gates of the n-type vertical nanowire transistor (PD$_L$) in the first column, and of the p-type vertical nanowire transistor (PU$_L$) in the fifth column.

A circuit described herein comprises a logic cell, such as a tri-state buffer, the logic cell comprising a set of vertical nanowire transistor columns, each member of the set including a vertical nanowire transistor, and at least one member of the set being a vertical nanowire transistor column including two vertical nanowire transistors in series.

The vertical nanowire columns used in embodiments of circuit cells described herein can be formed on conductive pads, such as doped semiconductor pads, disposed over an insulating layer and used as circuit wiring for the sets of vertical nanowire columns. The conductive pads can be incorporated into the circuit cell as a component of an intra-cell connector. The conductive pads can be incorporated into the circuit cell as a power conductor (V$_{SS}$ or V$_{DD}$).

BRIEF DESCRIPTION OF THE DRAWINGS

FIG. 7 is a layout diagram showing a top view of an SRAM implemented with a set consisting of four nanowires arranged in a 2×2 layout according to yet another embodiment.

FIG. 10 is a layout diagram showing a top view of an SRAM implemented with a set consisting of four nanowires arranged in a 2×2 layout according to yet another alternative embodiment.

FIG. 15 is a simplified layout diagram showing a top view of an SRAM implemented with 3×2 vertical nanowires according to another embodiment.

FIG. 15A is a legend applicable to FIG. 15.

FIG. 16 is a cross-sectional view of the SRAM in FIG. 15 taken at D-D'.

DETAILED DESCRIPTION

Figure 1:
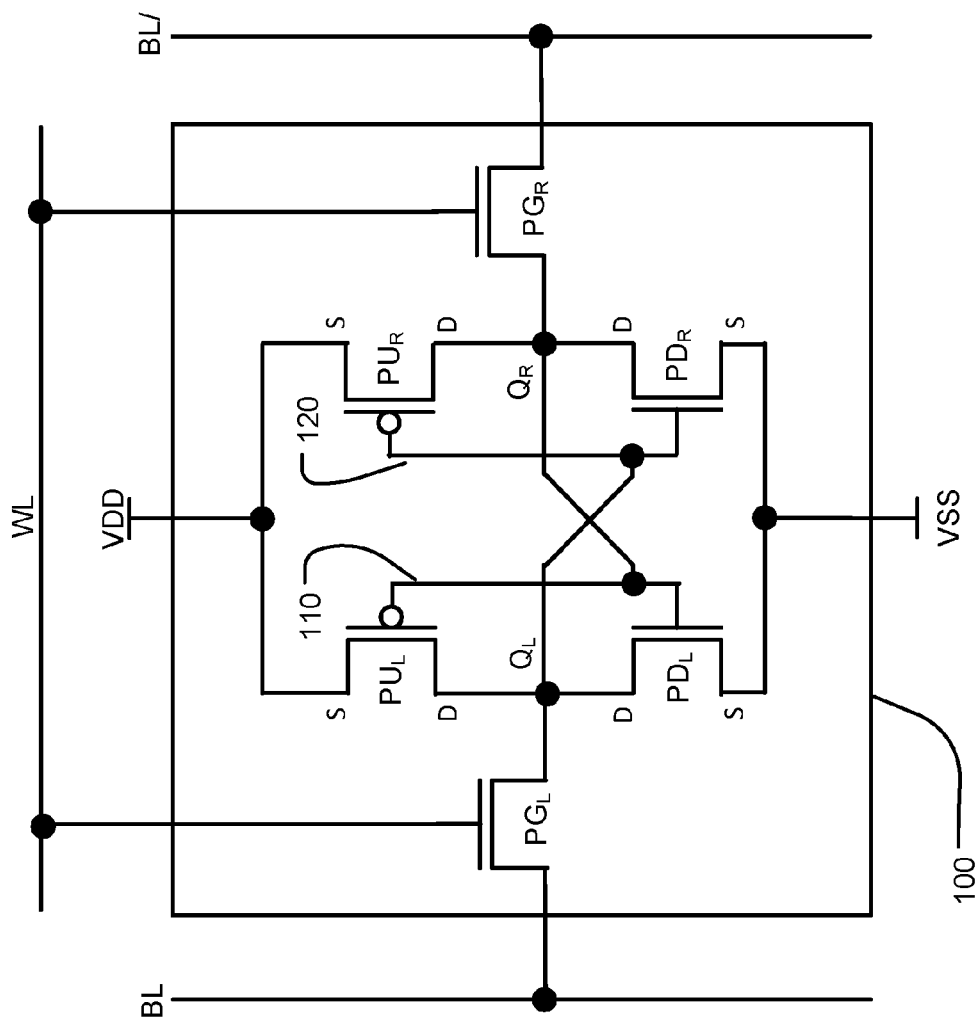
FIG. 1 illustrates a circuit schematic diagram of a 6T SRAM (six-transistor static random access memory).

A detailed description of embodiments of the present invention is provided with reference to the figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

The term "nanowire" as used herein is a length of material, for example silicon, which has a minimum cross-sectional dimension of less than 10 nm, and which is sheathed by insulating material (which could be air). The term "nanowire" itself, as used herein, does not imply any particular doping profile. Thus, as used herein, a "nanowire"

is a nanowire containing a longitudinal segment or segments having a conductivity, and if appropriate for the particular material of the nanowire, a doping concentration, suitable for operation as a channel of a transistor, a source of a transistor, a drain of a transistor or as an interconnect.

A "2D material strip" as used herein is a length of material that includes fibers or strips that consist essentially of one or more layers of doped or undoped "2D materials," such as graphene, phosphine ($PH_3$) or $MoS_2$ (molybdenum disulfide). A 2D material can be considered to be a material which tends to form strong bonds, such as covalent bonds, in planes with relatively weaker bonds, such as Van der Waals bonds, between the planes like graphene. Strips of 2D materials can be configured in ribbon form (single or multi-layer), nanotube form and woven form, for example.

The term "nanowire or 2D material strip interconnect" as used herein is a segment of nanowire or 2D material strip, or set of nanowires or 2D material strips, which extends from one out-of-plane turn to another.

The term "nanowire or 2D material strip interconnect" as used herein can be oriented either horizontally or vertically relative to a surface of a substrate. For a horizontal nanowire or 2D material strip, the out-of-plane turns can be horizontal-to-vertical turns from one material to another, or in the same material, such as a turn at a via connection to the horizontal nanowire or 2D material strip. For a vertical nanowire or 2D material strip, the out-of-plane turns can be a vertical-to-horizontal turn, such as a connection from the vertical nanowire to a horizontal conductor on the layer above or below. Note that the conductor on the far side of the turn can be a metal contact, in which case the turn occurs at a "contact." Alternatively, it can be more nanowires or 2D material strips, in which case the "turn" does not necessarily constitute an actual "contact."

As used herein, a "nanowire transistor" includes a gate conductor over a set of nanowires (which cannot be an empty set, and may have a single member) connected in parallel, and two current path terminals on the nanowires in the set, and on either side of the gate conductor. The two current path terminals are referred to as a source terminal and a drain terminal, or more generally as source/drain terminals. As used herein, a current path in a nanowire used in a nanowire transistor is between the two current path terminals, through the channel, and controlled by an electric field that is produced when a voltage is applied between the gate conductor and the source terminal of the nanowire. A drain-to-source current can flow through the current path. A "2D material strip transistor" can be defined in the same way, replacing nanowire in the definition with 2D material strip.

As used herein, a "nanowire transistor column" includes at least one nanowire transistor. A nanowire transistor in a given nanowire transistor column has a nanowire channel disposed vertically relative to an underlying substrate. If there are more than one nanowire transistors in a nanowire transistor column, then all of the transistor nanowire channels can be implemented in one continuous nanowire, or alternatively in more than one separate nanowires stacked in the nanowire transistor column.

FIG. 1 illustrates a circuit schematic diagram of a 6T SRAM (six-transistor static random access memory). A 6T SRAM cell 100 uses a pair of cross-coupled inverters as a storage element to store a single bit of data. The pair includes a first inverter (e.g. 110) configured with a pull-down transistor $PD_L$ and a pull-up transistor $PU_L$, and a second inverter (e.g. 120) configured with a pull-down transistor $PD_R$ and a pull-up transistor $PU_R$. The first inverter has an output node $Q_L$, which is connected to a gate conductor of the second inverter, at which an input signal to the second inverter is applied. The second inverter has an output node $Q_R$, which is connected to a gate conductor of the first inverter, at which an input signal to the first inverter is applied. The SRAM cell includes pass gates $PG_L$ and $PG_R$ as access devices to provide a switchable data path for data into and out of the SRAM cell. A word line (WL) controls the SRAM cell for reading or writing. Complementary bit lines BL and BL/ provide the data path to the pass gates $PG_L$ and $PG_R$.

Sources of the pull-up transistors $PU_L$ and $PU_R$ are connected to the SRAM cell supply voltage (e.g. $V_{DD}$), while sources of the pull-down transistors $PD_L$ and $PD_R$ are connected to the SRAM cell ground voltage (e.g. $V_{SS}$). Drains of the pull-up transistor $PU_L$ and pull-down transistor $PD_L$ are connected together and to the output node $Q_L$ of the first inverter. The pass gate $PG_L$ is connected between the output node $Q_L$ of the first inverter and the bit line BL. A gate terminal of the pass gate $PG_L$ is connected to the word line WL. Drains of the pull-up transistor $PU_R$ and pull-down transistor $PD_R$ are connected together and to the output node $Q_R$ of the second inverter. The pass gate $PG_R$ is connected between the output node $Q_R$ of the second inverter and the bit line BL/. A gate terminal of the pass gate $PG_R$ is connected to the word line WL.

For the simplified description below about the read and write operations of an SRAM cell, it is assumed that a high data value stored in the SRAM cell corresponds to a state when the output $Q_L$ of the first inverter is at a high data value and the output $Q_R$ of the second inverter is at a low data value. At the beginning of a read or write operation, the word line WL selects the SRAM cell by turning on the pass gates $PG_L$ and $PG_R$. At the end of the read or write operation, the word line WL deselects the SRAM cell by turning off the pass gates $PG_L$ and $PG_R$.

In a write operation, a voltage corresponding to a low data value is applied to one of BL and BL/, while a voltage corresponding to a high data value is applied to another of BL and BL/, to change the state of the storage element. For instance, to write a high data value, a voltage corresponding to a high data value is applied to the bit line BL, while a voltage corresponding to a low data value is applied to the bit line BL/. To write a low data value, a voltage corresponding to a low data value is applied to the bit line BL, while a voltage corresponding to a high data value is applied to the bit line BL/.

When a high data value is stored in the SRAM cell, in the first inverter, the pull-down transistor $PD_L$ is turned off and the pull-up transistor $PU_L$ is turned on so that output $Q_L$ exhibits a high data value while, in the second inverter, the pull-down transistor $PD_R$ is turned on and the pull-up transistor $PU_R$ is turned off so that output $Q_R$ exhibits a low data value. When a low data value is stored in the SRAM cell, in the first inverter, the pull-down transistor $PD_L$ is turned on and the pull-up transistor $PU_L$ is turned off so that output $Q_L$ exhibits a low data value while, in the second inverter, the pull-down transistor $PD_R$ is turned off and the pull-up transistor $PU_R$ is turned on so that output $Q_R$ exhibits a high data value.

In a read operation, a voltage corresponding to a high data value is applied to the bit lines BL and BL/, and the SRAM cell is selected by the word line WL. If a high data value is stored in the SRAM cell, current flows through the pass gate $PG_R$ and the pull-down transistor $PD_R$ to ground, and through the pull-up transistor $PU_L$ and the pass gate $PG_L$ to the bit line BL. If a low data value is stored in the SRAM cell, current flows through the pull-down transistor $PD_R$ and the pass gate $PG_R$ to the bit line BL/, and through the pass gate $PG_L$ and the pull-down transistor $PD_L$ to ground.

Figure 2A:
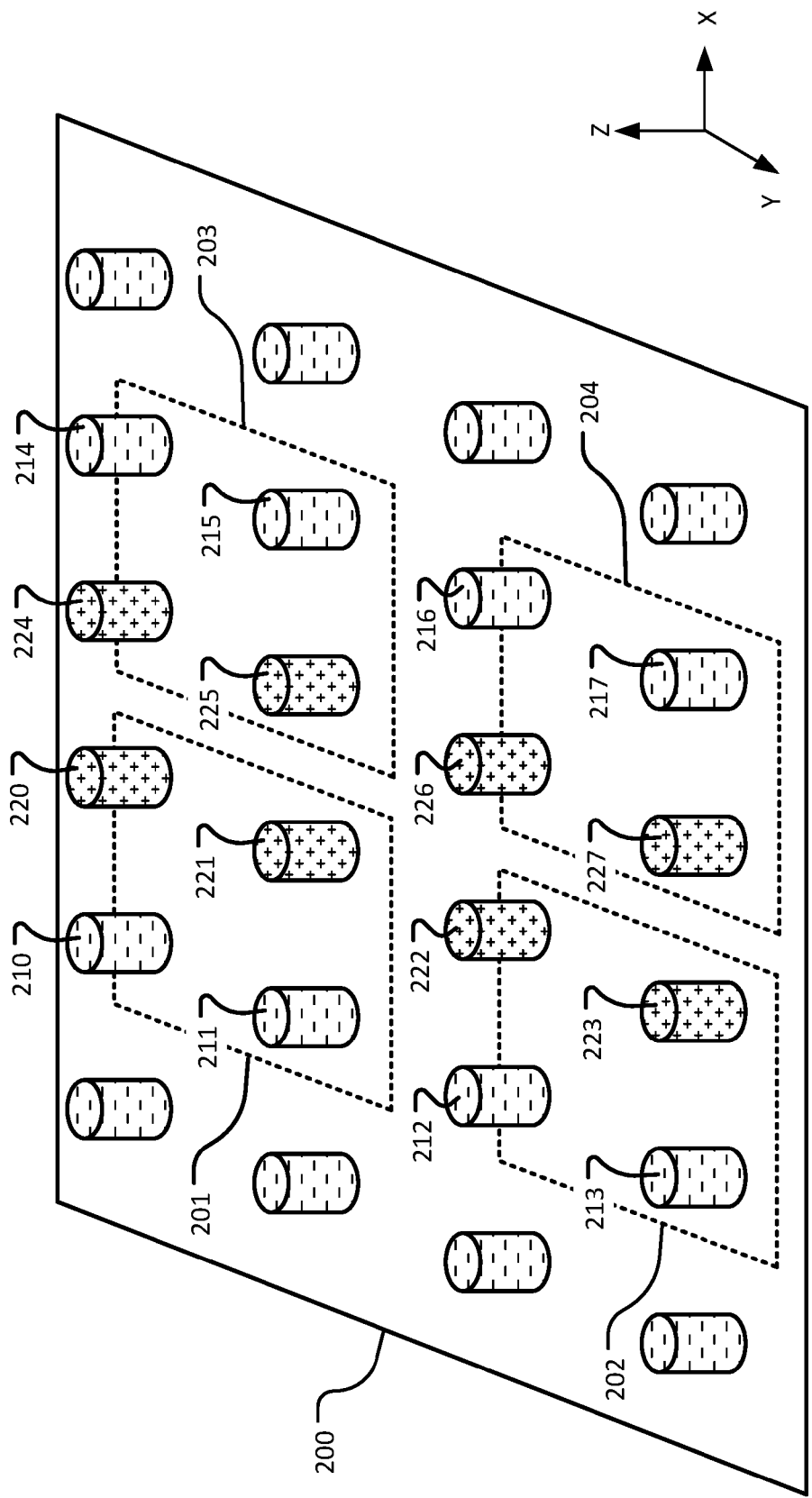
FIG. 2A illustrates a perspective view of an array of vertical nanowires on a substrate 200.

FIG. 2A illustrates a perspective view of an array of vertical nanowires on a substrate 200. The vertical nanowires in the array used to form transistors implemented in an SRAM comprise a plurality of nanowires for n-channel transistors, referred to herein as n-type nanowires (e.g. 210, 211, 212, 213, 214, 215, 216 and 217) and a plurality of nanowires for p-channel transistors, referred to herein as p-type nanowires (e.g. 220, 221, 222, 223, 224, 225, 226 and 227).

The nanowires described herein can be replaced with 2D material strips.

In a first embodiment described herein, each SRAM cell (e.g. 201, 202, 203 and 204) is implemented with a set consisting of four nanowires arranged in a 2×2 layout. In a second embodiment described herein, each SRAM cell is implemented with a set consisting of six nanowires arranged in a 3×2 layout.

In the illustration of FIG. 2A, the vertical nanowires in the array are arranged such that two columns of n-type vertical nanowires (−) alternate with two columns of p-type vertical nanowires (+). In another embodiment, the arrangement of the nanowires can be different.

Figure 2B:
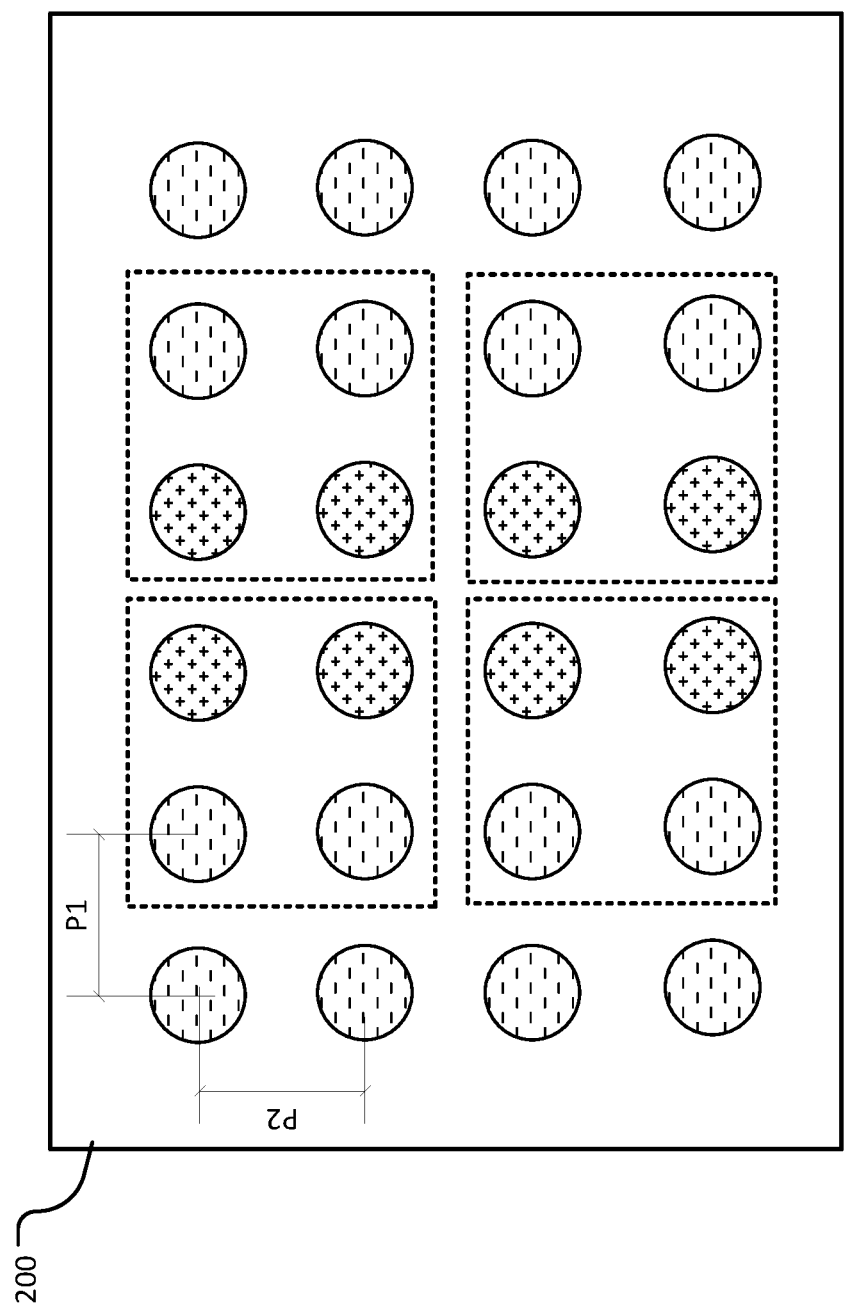
FIG. 2B illustrates a top view of an array of vertical nanowires.

FIG. 2B illustrates a top view of an array of vertical nanowires. As illustrated, the vertical nanowires in the array have a first pitch P1 defining the center-to-center distance between the vertical nanowires along the x-axis. Likewise, a second pitch P2 defines center-to-center distance between the vertical nanowires along the y-axis. P1 can be the same as P2 and can be determined by the minimum feature of the manufacturing process. P1 and P2 can be on the order of 20 nm for example.

In another example, P1 can be different from P2 for a particular layout design purpose.

Figure 3A:
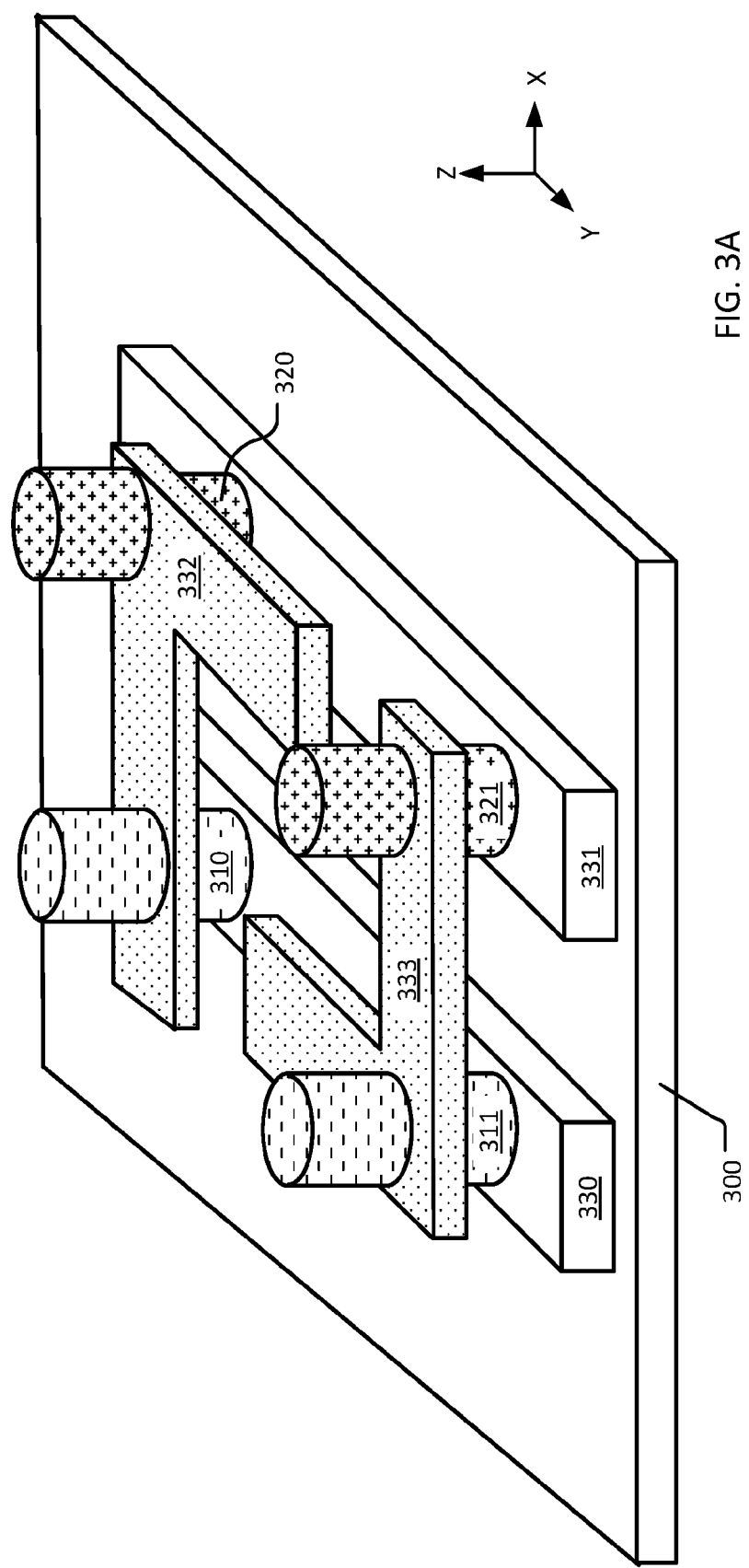
FIGS. 3A, 3B, 3C, and 3D illustrate layers of SRAMs implemented with a set of four nanowires arranged in a 2×2 layout.

FIGS. 3A through 3D illustrate layers of structure of an SRAM cell implemented with a set consisting of four vertical nanowires arranged in a 2×2 layout. The same reference numerals used in FIG. 3A are generally applied to FIGS. 3B-3D to refer to the same or like elements of an embodiment. Description about the same or like elements is not repeated FIG. 3A illustrates a perspective view showing a first level of nanowire transistors. A substrate 300 having an insulating surface area is provided, on which a first conductor 330 and a second conductor 331 are formed using for example standard photolithography or other patterning techniques. First and second conductors 330, 331 can comprise epitaxial silicon, polysilicon, doped polysilicon, and tungsten silicide, titanium silicide, or combinations of materials.

Next, a plurality of n-type nanowire transistors is formed on first conductor 330, and a plurality of p-type nanowires transistors is formed on second conductor 331.

Methods of formation of nanowire transistors are described in the following documents, which are incorporated by reference for all information presented therein.

Vertically Integrated Nanowire Field Effect Transistors, Josh Goldberger et al., Department of Chemistry, University of California, Berkeley, and Materials Science Division, Lawrence Berkeley National Laboratory;

Silicon Vertically Integrated Nanowire Field Effect Transistors, Josh Goldberger et al., Nano Letters, 2006 Vol. 6, No. 5 973-977;

Controlled Growth of Si Nanowire Arrays for Device Integration, Allon 1. Hochbaum et al., Nano Letters, 2005 Vol. 5, No. 3 457-460;

Fabrication and Characterization of Poly-Si Vertical Nanowire Thin Film Transistor, N Shen et al., International Journal of Chemical, Molecular, Nuclear, Materials and Metallurgical Engineering, 2011 Vol. 5, No. 9 784-786;

A gate conductor film is patterned to form a plurality of gate conductors, including a first gate conductor 332 and a second gate conductor 333. A fill step is applied with an insulating material (not shown), such as silicon oxide, to fill the space between nanowire transistors, followed by a planarization technique, such as CMP, to form an even surface.

Figure 3B:
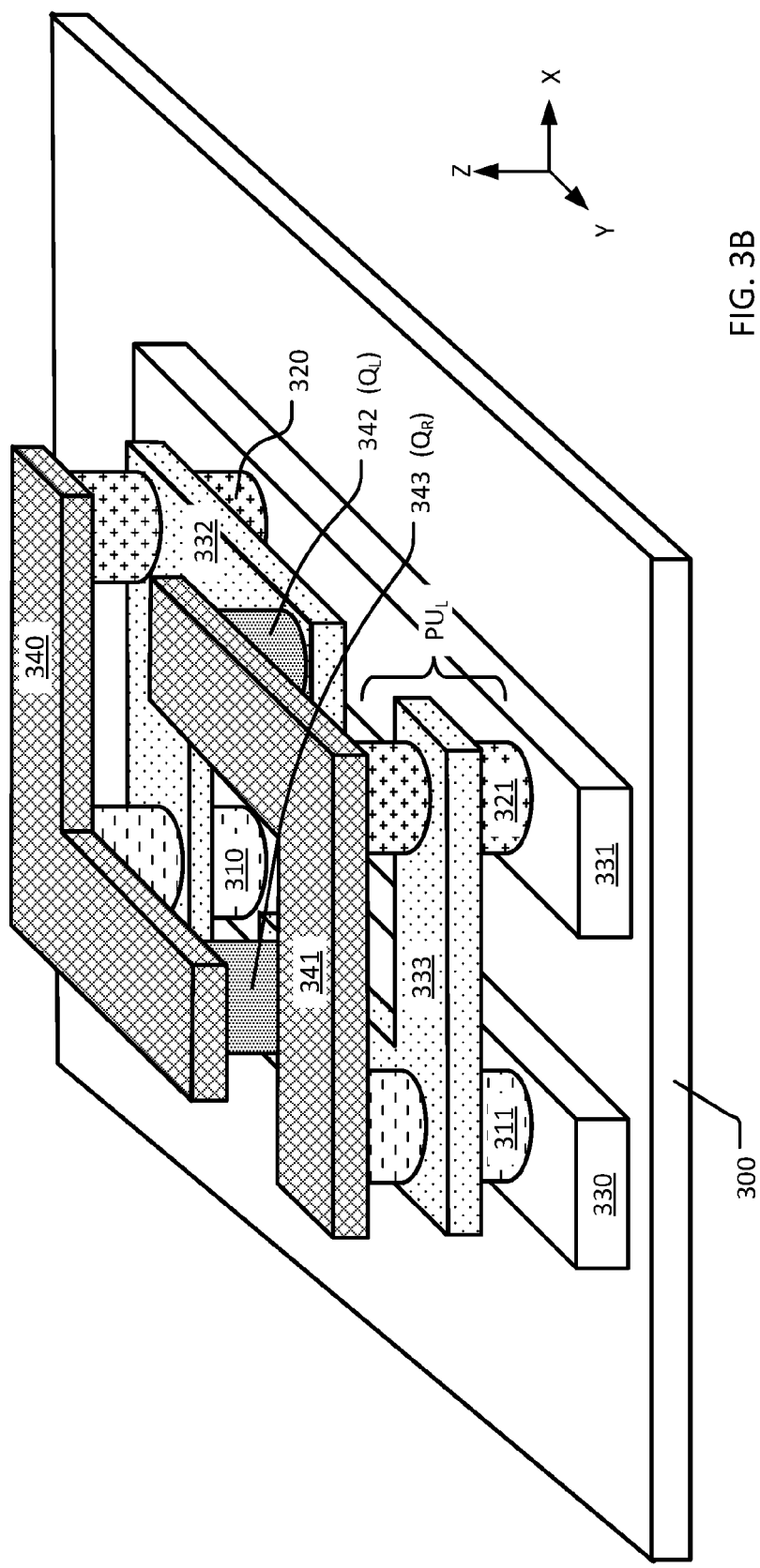

FIG. 3B illustrates the patterned interlayer conductors 340, 341 on the nanowire transistors in the first level and vias 342, 343 connecting the gate conductors 332 and 333, respectively, to the patterned interlayer conductors 340 and 341. The vias 342, 343 can be formed using a via etch to form openings in the insulating material (not shown) that stops at the gate conductors 332, 333. Next, a conductive material is deposited to fill the openings to form a plurality of vias, including a first via 343 and a second via 342. In one example, deposition of the conductive material can go on to form an interlayer conductor film, which is then patterned to form a plurality of patterned interlayer conductors, including a first patterned interlayer conductor 340 and a second patterned interlayer conductor 341. The vias and the patterned interlayer conductors can be made up of the same material in this example. In another example, the patterned interlayer conductors can comprise a different material than the vias.

A first intra-cell connector (e.g. $Q_R$) includes first patterned interlayer conductor 340 and first via 343. Similarly, a second intra-cell connector (e.g. $Q_L$) includes second patterned interlayer conductor 341 and second via 342.

Figure 3C:
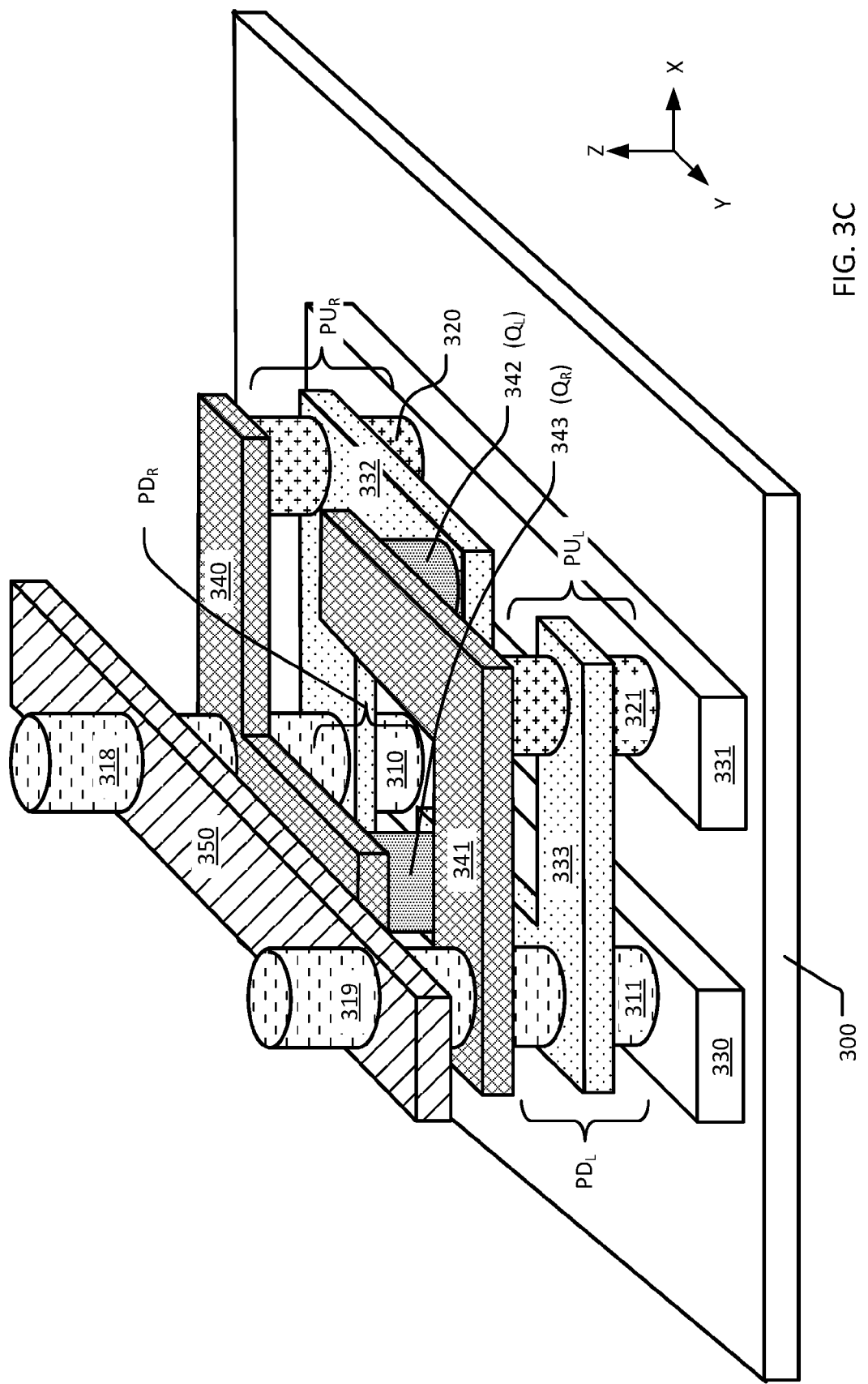

FIG. 3C illustrates a perspective view showing a second level of nanowire transistors. A plurality of n-type nanowire transistors is formed on the n-type nanowire transistors in the first level for example using the formation method of the nanowire transistor in the first level. The vertical nanowires (e.g. 318, 319) in the nanowire transistors in the second level are respectively connected to the first and second intra-cell connectors. A conductive film suitable for word lines is deposited and patterned so as to form a word line conductor (e.g. 350) providing the gates in the nanowire transistors along the y-axis in the second level. A fill step can be applied with an insulating material, and followed by a CMP process.

Figure 3D:
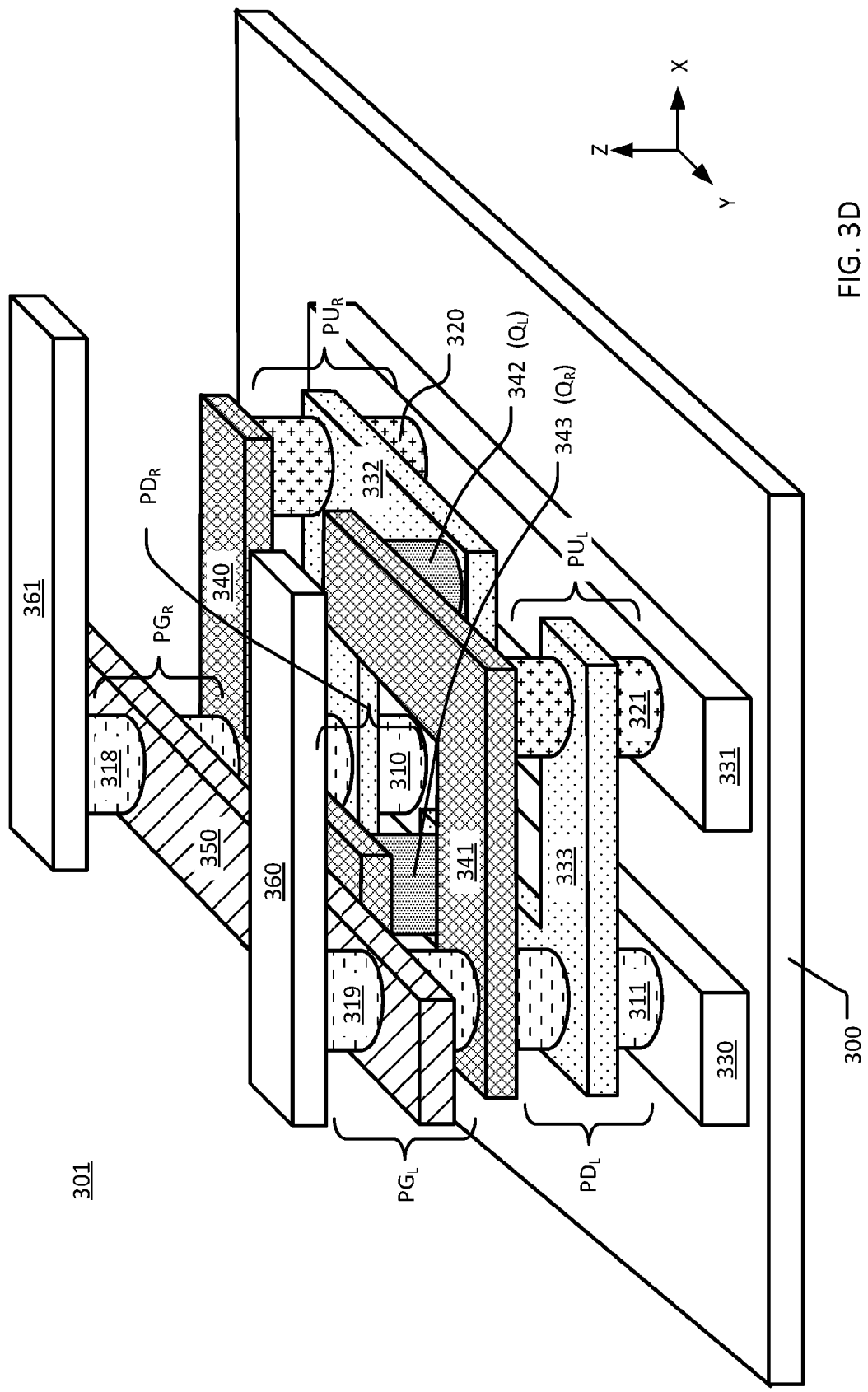

FIG. 3D illustrates a perspective view showing a plurality of bit lines. A conductive material suitable for bit lines is deposited over the structure of FIG. 3C, and then patterned to form a plurality of bit line conductors, including bit line conductors 360 and 361. The n-type and p-type nanowire transistors are disposed in two levels over an insulation layer on substrate 300. Because the transistors are arranged in a two-level structure, the cell includes nanowire transistors stacked on top of and connected in series to another nanowire transistor in the cell, allowing for a high density layout.

An SRAM cell 301 described herein comprises a set of vertical nanowire transistor columns, and each member of the set includes a vertical nanowire transistor, at least one member of the set being a vertical nanowire transistor column including two vertical nanowire transistors in series.

In this embodiment, SRAM cell 301 includes four vertical nanowire transistor columns, of which a first column includes two n-type vertical nanowire transistors (e.g. $PG_L$ and $PD_L$), a second column includes two n-type vertical nanowire transistors (e.g. $PG_R$ and $PD_R$), a third column includes one p-type vertical nanowire transistor (e.g. $PU_L$), and a fourth column includes one p-type vertical nanowire transistor (e.g. $PU_R$). The four vertical nanowire transistor columns can be arranged in layout at corners of a parallelogram, such as a square, a rectangle, and a rhombus.

The illustrated SRAM includes a first intra-cell connector (e.g. $Q_R$) comprising first via 343 and first patterned interlayer connector 340, and a second intra-cell connector (e.g. $Q_L$) comprising second via 342 and second patterned interlayer connector 341. The first intra-cell connector connects a current path terminal of the p-type vertical nanowire transistor ($PU_R$) in the fourth column to a current path terminal between the n-type vertical nanowire transistor ($PD_R$) in the first level and the n-type vertical nanowire transistor ($PG_R$) in the second level of the second column, and to gates of the n-type vertical nanowire transistor ($PD_L$) in first level of the first column and of the p-type vertical nanowire transistor ($PU_L$) in the third column. The second intra-cell connector connects a current path terminal of the p-type vertical nanowire transistor ($PU_L$) in the third column to a current path terminal between the n-type vertical nanowire transistor ($PD_L$) in the first level and the n-type vertical nanowire transistor ($PG_L$) in the second level of the first column, and to gates of the n-type vertical nanowire transistor ($PD_R$) in first level of the second column and of the p-type vertical nanowire transistor ($PU_R$) in the fourth column.

In one example, the n-type nanowire transistors (e.g. $PG_L$, $PD_L$) in the third column include a single vertical nanowire. Likewise, the n-type nanowire transistors (e.g. $PG_R$, $PD_R$) in the fourth column include a single vertical nanowire. In another example, the n-type nanowire transistors (e.g. $PG_L$, $PD_L$) in the third column are separated by and connected to the patterned interlayer conductor 341. Likewise, the n-type nanowire transistors (e.g. $PG_R$, $PD_R$) in the fourth column are separated by and connected to the patterned interlayer conductor 340.

The SRAM cell is formed on substrate 300 on which first conductor 330 is disposed in parallel with second conductor 331. Substrate 300 includes a top surface having an insulation layer (not shown), such as silicon oxide. First conductor 330 is connected to the cell ground voltage (e.g. $V_{SS}$), and second conductor 331 is connected to the cell supply voltage (e.g. $V_{DD}$). A plurality of n-type nanowires (e.g. 310, 311) is disposed vertically relative to the surface of the substrate and is disposed on first conductor 330. First conductor 330 is disposed beneath the n-type vertical nanowire transistors in the first and second vertical nanowire transistor columns and contacting current path terminals of vertical nanowire transistors in a first subset of the vertical nanowire transistor columns. Second conductor 331 is disposed beneath the p-type vertical nanowire transistors in the third and fourth vertical nanowire transistor columns and contacting current path terminals of vertical nanowire transistors in the second subset of the vertical nanowire transistor columns.

A plurality of p-type nanowires (e.g. 320, 321) is disposed vertically relative to the surface of the substrate and is disposed on second conductor 331. First gate conductor 332 is disposed across and insulated from an n-type nanowire 310 and a p-type nanowire 320 by gate oxides (502 of FIG. 5A, 506 of FIG. 5B) such that a first nanowire transistor (e.g. $PD_R$) and a second nanowire transistor (e.g. $PU_R$) are formed. Likewise, second gate conductor 333 is disposed across and insulated from an n-type nanowire 311 and a p-type nanowire 321 by the dielectric (not shown) such that a third nanowire transistor (e.g. $PD_L$) and a fourth nanowire transistor (e.g. $PU_L$) are formed. First gate conductor 332 and second gate conductor 333 are disposed in the same level and insulated from each other.

Word line conductor 350 is disposed across and insulated from a plurality of n-type nanowires (e.g. 318, 319) and connected to the gates of the n-type vertical nanowire transistors, i.e. a fifth nanowire transistor (e.g. $PG_R$) and a sixth nanowire transistor (e.g. $PG_L$), in the second level of the first and second vertical nanowire transistor columns. First patterned interlayer conductor 340 is interposed between and insulated from word line conductor 350 and first gate conductor 332, and is connected to second gate conductor 333 though first via 343. Second patterned interlayer conductor 341 is disposed in the same level as first patterned interlayer conductor 340, and is connected to first gate conductor 332 though second via 342. Thus, the first intra-cell connector and the second intra-cell connector include respective first and second vias (e.g. 343, 342) connecting the corresponding gates to the corresponding current path terminal. The first and second vias (e.g. 343, 342) is disposed on opposing sides of the parallelogram in this embodiment.

Disposed over word line conductor 350 are a pair of bit line conductors, of which a first bit line conductor 360 acts as BL and a second bit line conductor 361 acts as BL/ in complementary bit lines. First bit line conductor (BL) 360 is disposed above and contacting a current path terminal of the n-type vertical nanowire transistor in the second level of the first vertical nanowire transistor column. Second bit line conductor (BL/) 361 is disposed above and contacting a current path terminal of the n-type vertical nanowire transistor in the second level of the second vertical nanowire transistor column In the first level of nanowire transistors reside two n-type nanowire transistors (e.g. $PD_L$ and $PD_R$) and two p-type nanowire transistors (e.g. $PU_L$ and $PU_R$). In the second level reside pass gates $PG_L$ and $PG_R$ on the n-type nanowire transistors. The first column in the set of four vertical nanowire transistor columns includes two vertical transistors (e.g. $PG_L$, $PD_L$) in series. Also, the second column in the set of four vertical nanowire transistor columns includes two vertical transistors (e.g. $PG_R$, $PD_R$).

Figure 4A:
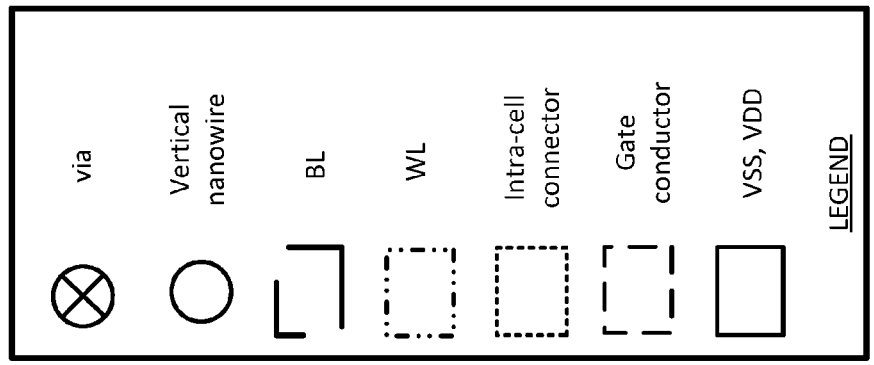
FIG. 4A is a legend applicable to FIG. 4.
Figure 4:
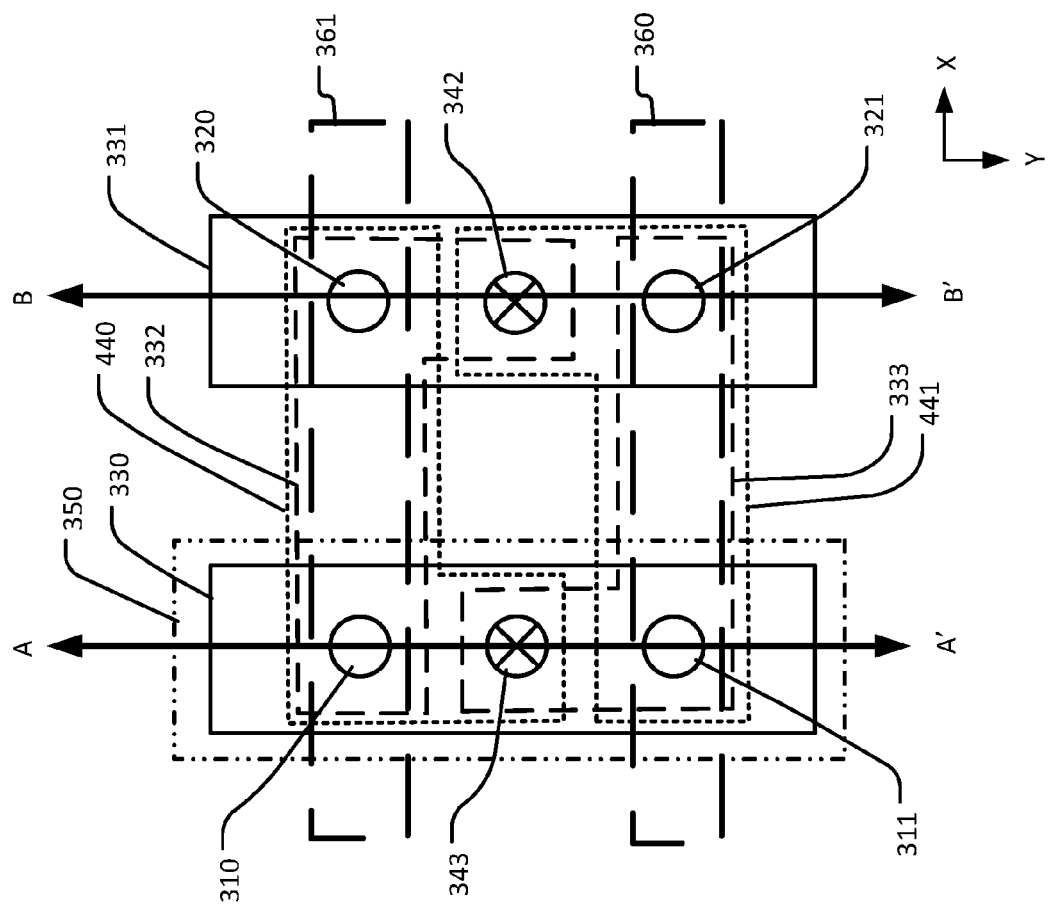
FIG. 4 is a simplified layout diagram showing a top view of an SRAM implemented with a set consisting of four nanowires arranged in a 2×2 layout shown in FIG. 3D.

FIG. 4 is a simplified layout diagram showing a top view of an SRAM implemented with 2×2 vertical nanowires as shown in FIG. 3D. FIG. 4A is a legend applicable to FIG. 4. The same reference numerals used in FIG. 3D are applied to FIG. 4 to refer to the same or like elements of an embodiment. Description about the same or like elements is not repeated. In the layout of FIG. 4, p-type nanowires 320 and 321 and the n-type nanowires 311 and 310 define a rectangle. Also, via 342 of the second intra-cell connector 441 is disposed on a line defining one side of the rectangle between the p-type nanowires 320 and 321, and via 343 of the first intra-cell connector 440 is disposed on a line defining an opposing side of the rectangle between the n-type nanowires 311 and 310.

In FIG. 4, the gate conductors 332 and 333 each consist of a segment along the x-axis and a segment along the y-axis that intersect in a right angle. Likewise, first and second intra-cell connectors 440, 441 each comprise a segment along the x-axis and a segment along the y-axis that intersect in a right angle.

Figure 5A:
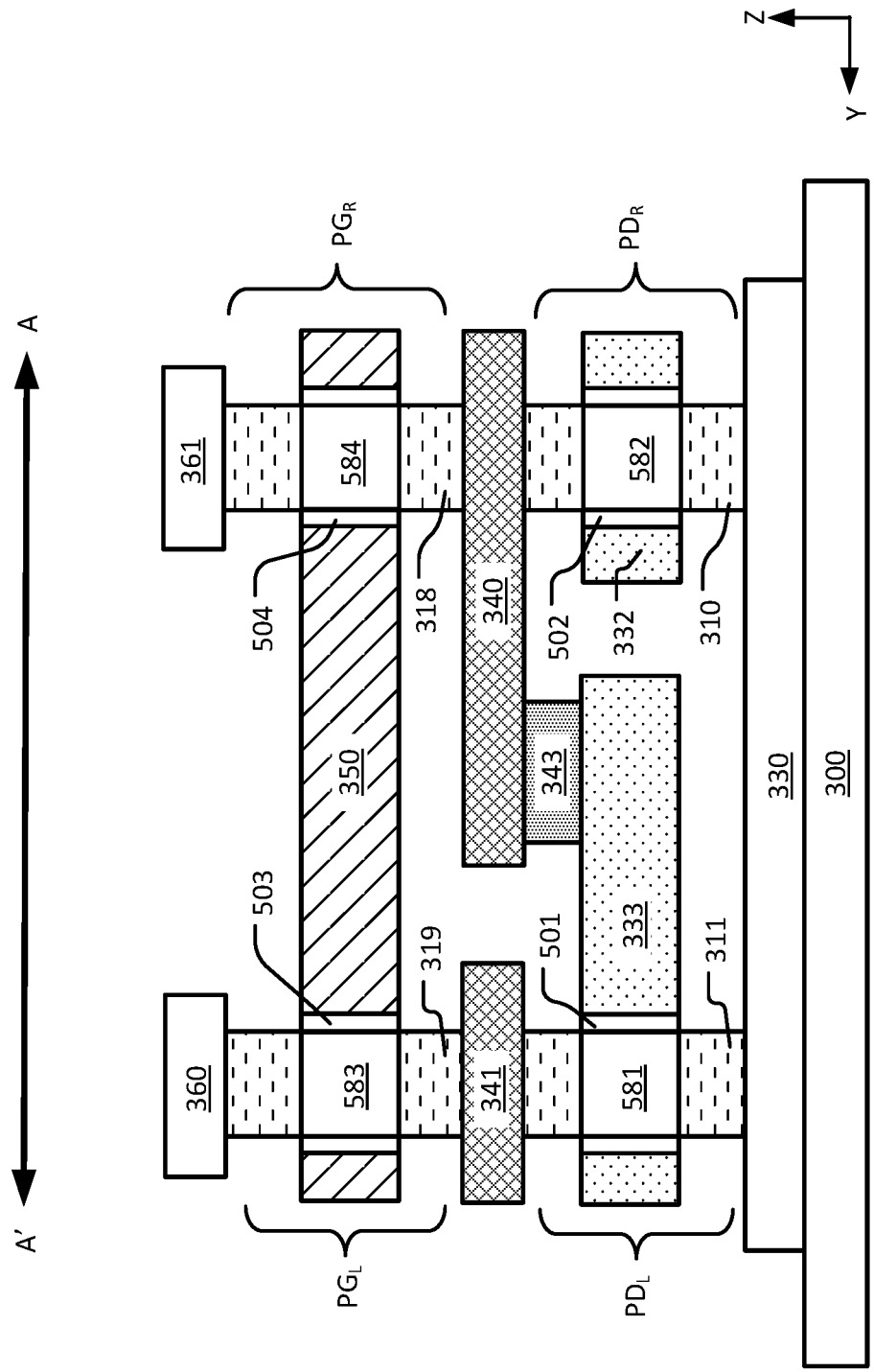
FIG. 5A is a cross-sectional view of the SRAM in FIG. 4 taken at A-A'.

FIG. 5A is a cross-sectional view of the SRAM in FIG. 4 taken at A-A'. Elements in the SRAM shown are disposed on an insulation layer (not shown) on substrate 300. Areas between the elements are filled with dielectric material such as silicon oxide, silicon nitride, low-k dielectric (having a relative permeability less than that of silicon dioxide, or less than 3.9, e.g. SiOC), or with combinations of materials.

As illustrated in FIG. 5A, the channels (e.g. 581, 582, 583, and 584) in the nanowires (e.g. 310, 311, 318, and 319) of the n-type nanowire transistor (e.g. $PD_R$, $PD_L$, $PG_R$, and $PG_L$) are surrounded by gate oxides (e.g. 502, 501, 504, and 503) such as silicon dioxide or a high-κ insulating material (having a relative permeability greater than that of silicon dioxide, or greater than 3.9), and the gate oxides (e.g. 501 and 502) in the first level are surrounded by the corresponding gate conductors (e.g. 333 and 332) and the gate oxides (e.g. 503 and 504) in the second level are surrounded by the same gate conductor, i.e. word line conductor (e.g. 350). The channels (e.g. 581, 582, 583, and 584) of the n-type nanowire transistor (e.g. $PD_R$, $PD_L$, $PG_R$, and $PG_L$) can comprise undoped, intrinsic silicon. The source/drain of the n-type nanowire transistors (e.g. $PD_R$, $PD_L$, $PG_R$, and $PG_L$) are at the opposing side of the channel (e.g. 581, 582, 583, and 584), and comprise n-type doping materials, such as phosphorous (P), arsenic (As), antimony (Sb) or other materials.

Figure 5B:
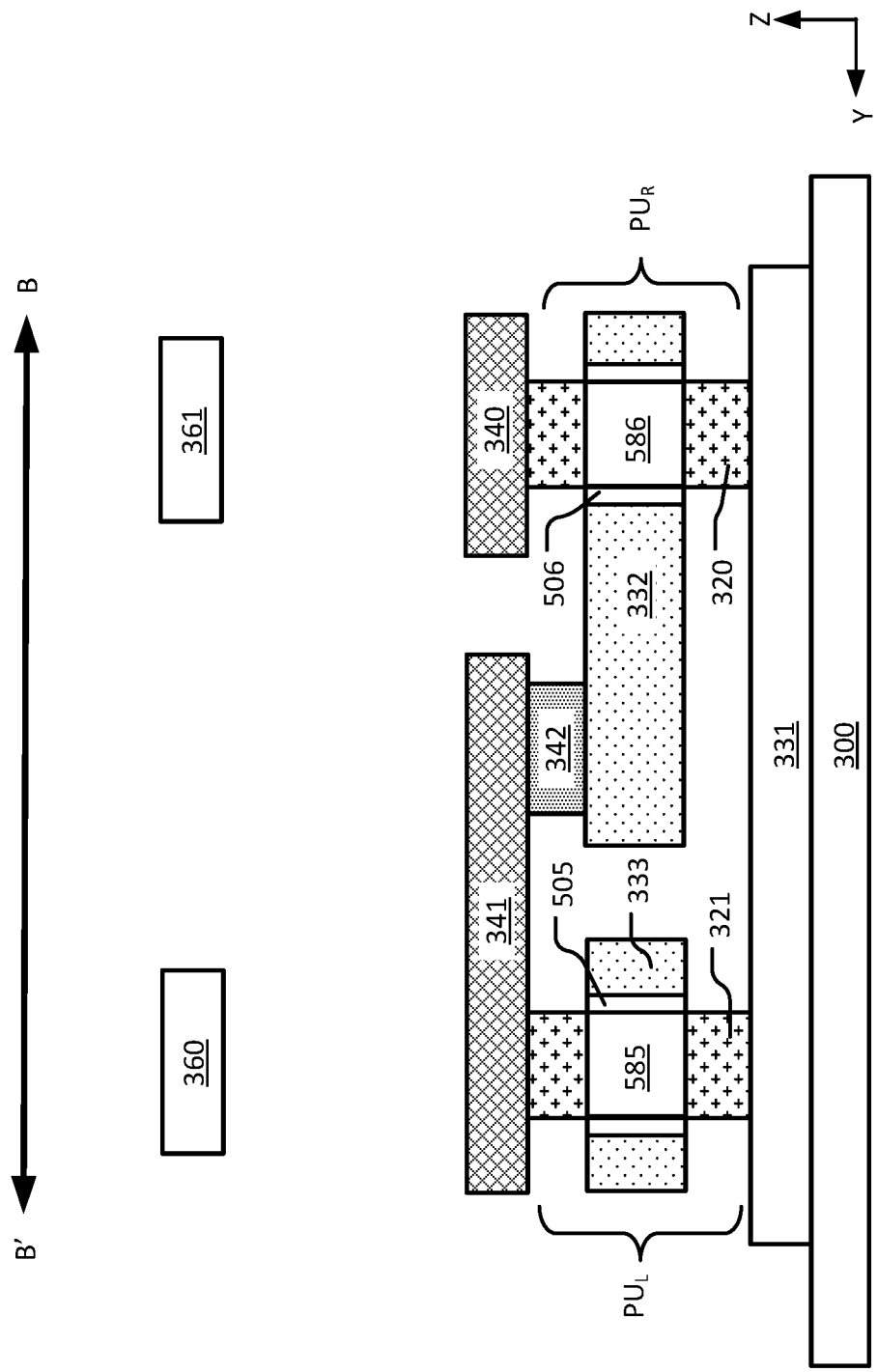
FIG. 5B is a cross-sectional view of the SRAM in FIG. 4 taken at B-B'.

FIG. 5B is a cross-sectional view of the SRAM in FIG. 4 taken at B-B'. The channels (e.g. 585 and 586) in the nanowires (e.g. 321 and 320) of the p-type nanowire transistor (e.g. $PU_L$ and $PU_R$) are surrounded by gate oxides (e.g. 505 and 506) such as silicon dioxide or a high-κ insulating material (having a relative permeability greater than that of silicon dioxide, or greater than 3.9), and the gate oxides (e.g. 505 and 506) are surrounded by the corresponding gate conductors (e.g. 333 and 332). The channels (e.g. 585 and 586) in the nanowire transistor (e.g. $PD_R$, $PD_L$, $PG_R$, and $PG_L$) can comprise undoped intrinsic silicon. The source/drain of the p-type nanowire transistors (e.g. $PU_L$ and $PU_R$) are at the opposing side of the channels (e.g. 585 and 586), and comprise p-type doping materials, such as boron (B), or other materials.

Figure 6A:
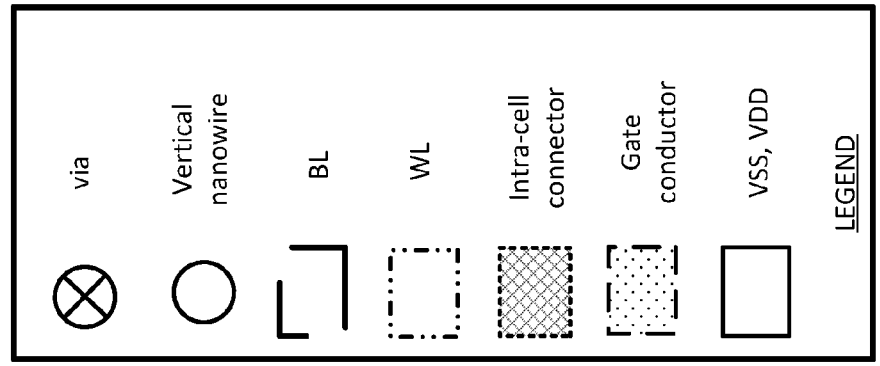
FIG. 6A is a legend applicable to FIGS. 6, 7, 8 and 10.
Figure 6:
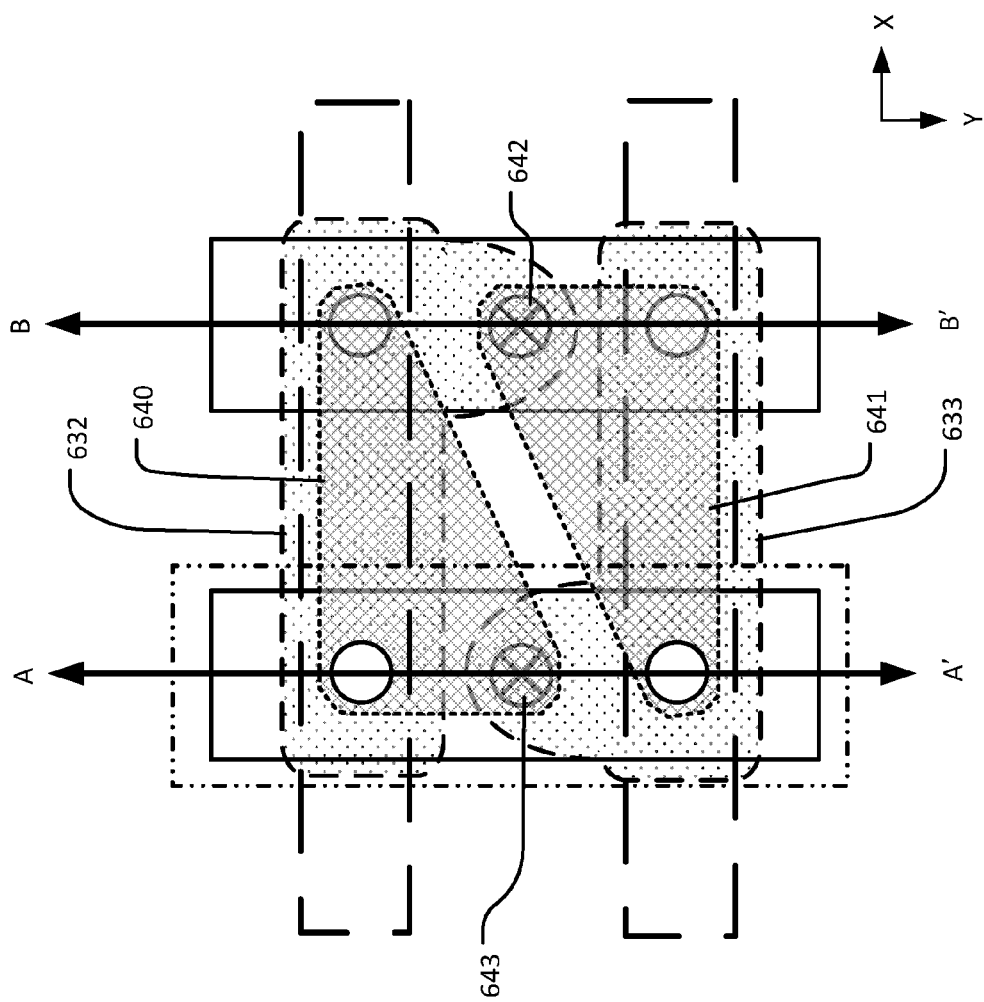
FIG. 6 is a layout diagram showing a top view of an SRAM implemented with a set consisting of four nanowires arranged in a 2×2 layout according to another embodiment.

FIG. 6 is another layout diagram showing a top view of an SRAM implemented with 2×2 vertical nanowire cell. FIG. 6A is a legend applicable to FIGS. 6-8 and 10. This embodiment, compared with the layout shown in FIG. 4, differs in the shapes of the gate conductors (e.g. 632 and 633) and the intra-cell conductors (e.g. 640 and 641). In FIG. 6, the intra-cell connectors (e.g. 640 and 641) are triangular, with rounded corners. The gate conductors (e.g. 632 and 633) each consist of a segment along the x-axis with rounded corners and a tab with a rounded end, extending along the y-axis. The first and second vias (e.g. 643 and 642) are disposed on opposing sides of the parallelogram defined by the vertical nanowires.

The cross-sections taken at A-A' and B-B' in FIG. 6 are substantially the same as the cross-sectional views in FIGS. 5A and 5B, and are not illustrated or described again.

FIG. 7 is yet another layout diagram showing a top view of an SRAM implemented with 2×2 vertical nanowire cells. In this embodiment, compared with the layout shown in FIGS. 4 and 6, the embodiment of FIG. 7 differs in the shapes of the gate conductors (e.g. 732 and 733) and the intra-cell connectors (e.g. 740 and 741), and differs in the position of the vias (e.g. 742 and 743). The vias 742 and 743 are disposed off of the lines defining the sides of the rectangle defined by the vertical nanowires. In this example, first via 743 is disposed at or near the center of the rectangle, and second via 742 is disposed outside of the rectangle by an amount of about one half the width of the rectangle along the x-axis. The intra-cell connectors (e.g. 740 and 741) comprise different shapes to accommodate the positions of the vias. For example, first intra-cell connector 740 is triangular with rounded corners, and second intra-cell connector 741 includes a segment along the x-axis and a tab extending outwardly at an angle of about 45 degrees from the x-axis with a rounded end. Likewise, the gate conductors 732 and 733 have different shapes, including disc-like regions surrounding the corresponding vertical nanowires connected together between the nanowires, with tabs extending to the corresponding vias. The tab on gate conductor 732 is disposed on the right side disc-like region, and extends outward and downward at an angle of about negative 45 degrees from the x-axis to the corresponding via (e.g. 742). The tab on the gate conductor 733 is disposed between the disc-like regions, and extends along the y-axis to the corresponding via (e.g. 743).

The cross-sections taken at A-A' and B-B' in FIG. 7 are substantially the same as the cross-sectional views in FIGS. 5A and 5B, and are not illustrated or described again.

Figure 8:
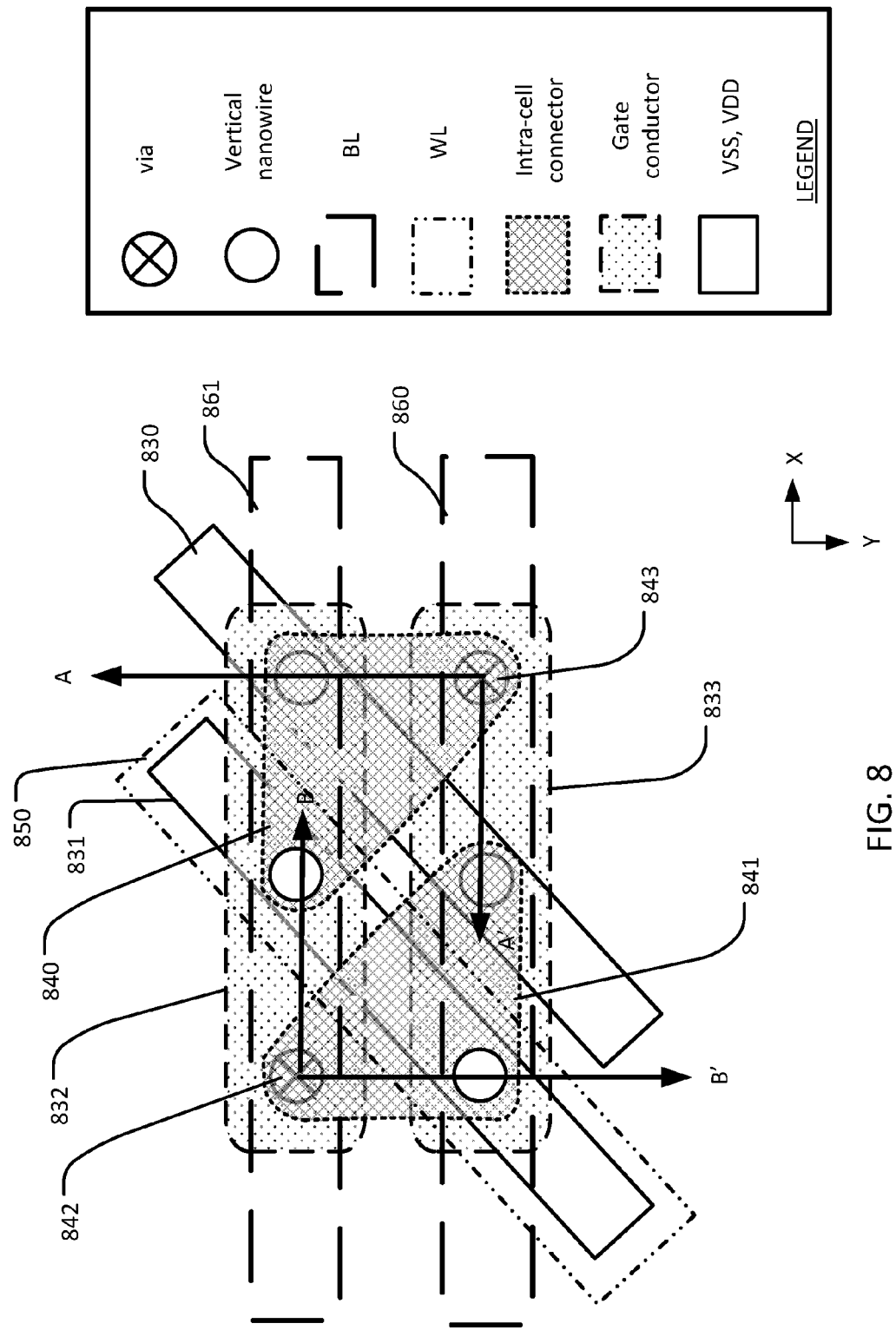
FIG. 8 is a layout diagram showing a top view of an SRAM implemented with a set consisting of four nanowires arranged in a 2×2 layout according to yet another embodiment.

FIG. 8 is yet another layout diagram showing a top view of an SRAM implemented with 2×2 vertical nanowire cells, which are arranged in a non-rectangular parallelogram. The first via 843 and the second via 842 are disposed outside of the parallelogram defined by the vertical nanowires, and on respective lines coincident with opposing sides of the parallelogram parallel with the x-axis. Compared with the rectangular layouts shown in FIGS. 4, 6 and 7, the embodiment of FIG. 8 differs in the shapes of the gate conductors (e.g. 832 and 833) which are straight segments parallel to the x-axis, and the intra-cell connectors (e.g. 840 and 841) which are isosceles right triangles with rounded corners having a hypotenuse disposed at an acute angle relative to the x-axis. Also, the embodiment of FIG. 8 differs in the arrangement of n-type and p-type nanowires such that first conductor 830, second conductor 831 and word line conductor 850 are not orthogonal to the bit lines conductors 860, 861. The word line conductor 850, and the patterned $V_{SS}$ and $V_{DD}$ conductors are disposed at an acute angle of for example 45 degrees to the x-axis in this example, while the bit lines are disposed parallel with the x-axis.

The cross-sections taken at A-A' and B-B' in FIG. 8 are substantially the same as the cross-sectional views in FIGS. 5A and 5B, and are not illustrated or described again.

Figure 9:
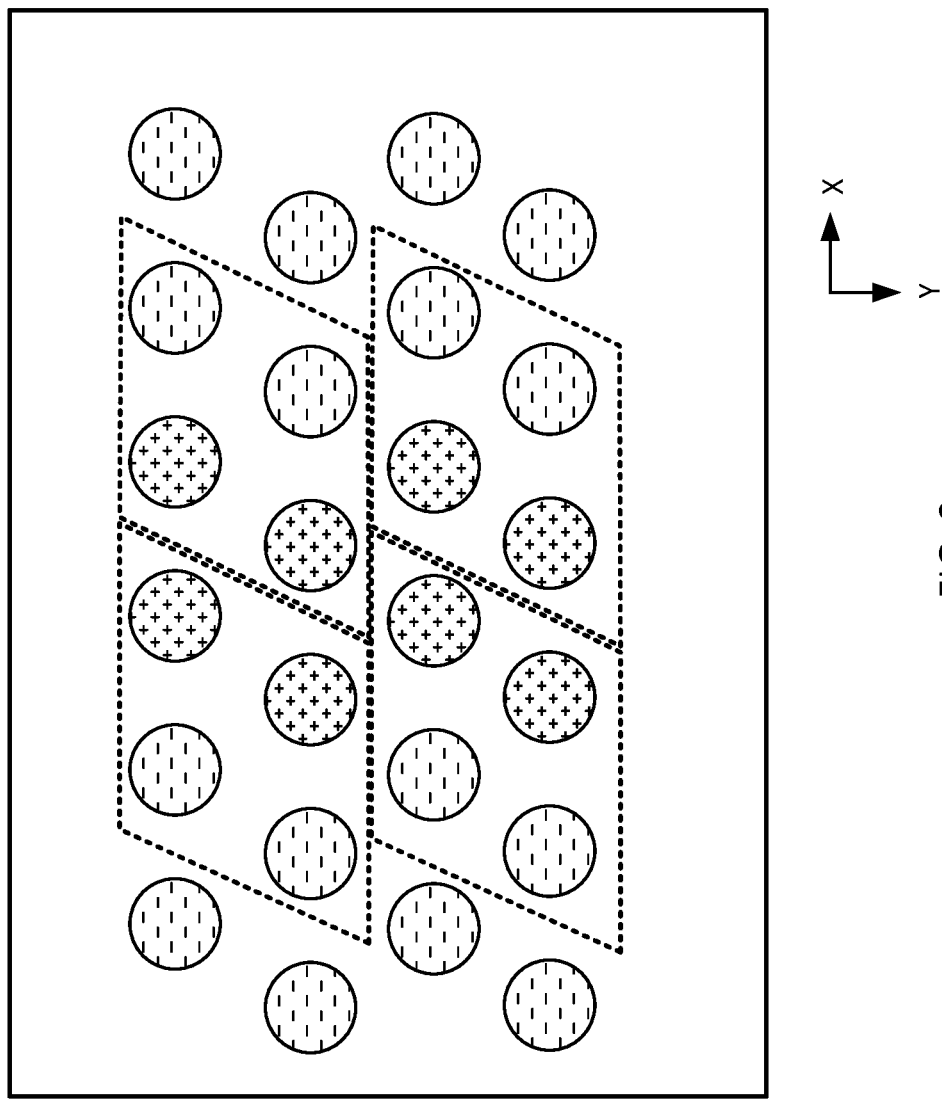
FIG. 9 is a top view of an array of vertical nanowires in a twisted arrangement.

FIG. 9 is a top view of an array of vertical nanowires in a twisted arrangement which can be used for cells laid out as shown in FIG. 4 or 6. Also, the twisted arrangement of the array of nanowires can be used with cells laid out as shown in FIGS. 7 and 8, with modifications to allow for placement of the vias. Compared with the nanowire arrangement shown in FIG. 2B, the twisted or honeycomb arrangement of FIG. 9 can be configured to have a greater density or a smaller chip size.

FIG. 10 is a layout diagram showing a top view of an SRAM implemented with vertical nanowire cells in a twisted arrangement. The vias 1042 and 1043 in the arrangement of FIG. 10 are disposed inside, outside, or on sides of the parallelogram defined by the four vertical nanowires, and closer to one corner of the parallelogram than the other. In this embodiment, the gate conductors (e.g. 1032 and 1033) are designed to have a shape of a long stripe and the intra-cell connectors (e.g. 1040 and 1041) are designed to have a triangle shape.

Figure 11:
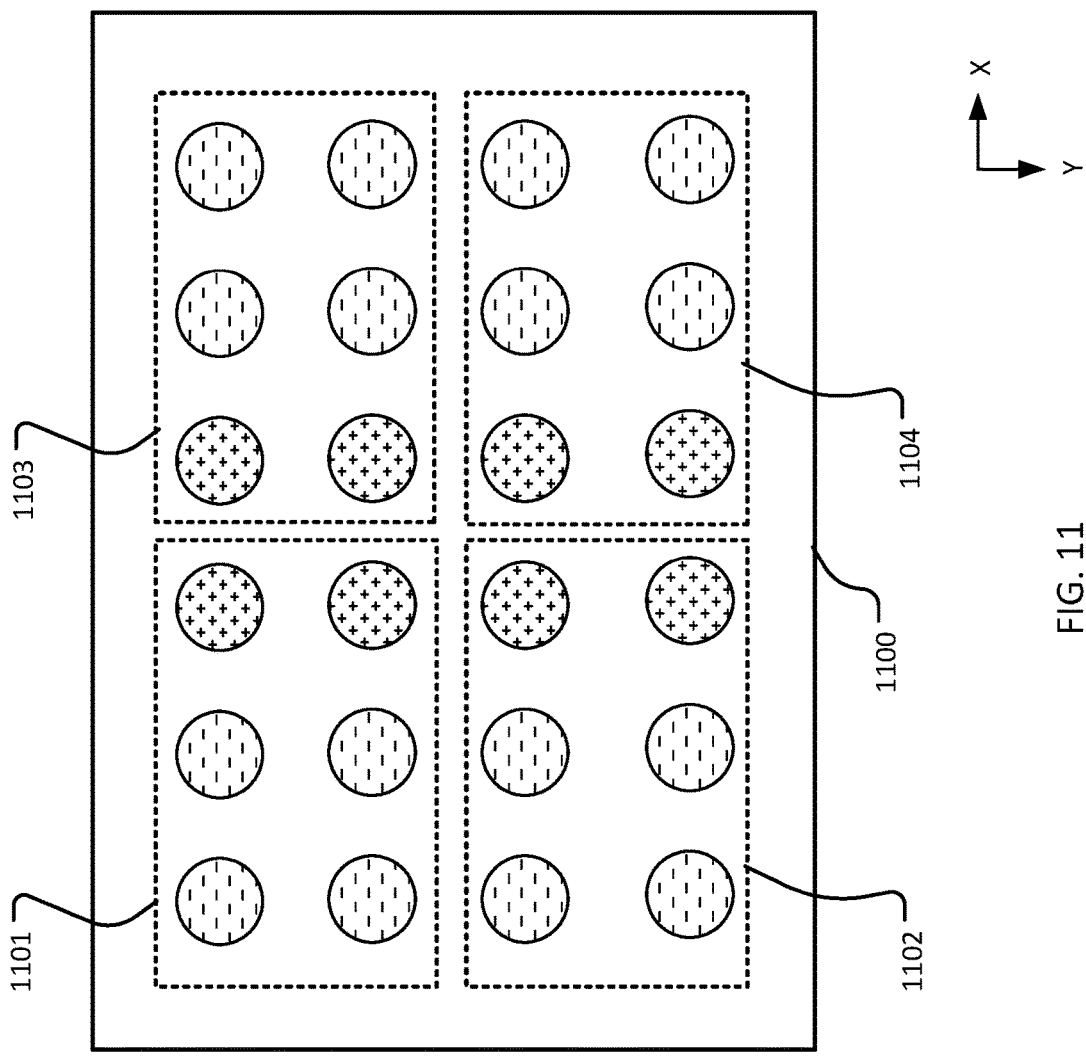
FIG. 11 is a top view of an array of vertical nanowires on a substrate 1100, on which each SRAM cell is implemented with 3×2 vertical nanowires.

FIG. 11 is a top view of an array of vertical nanowires on a substrate 1100, on which each SRAM cell (e.g. 1101, 1102, 1103 and 1104) is implemented with 3×2 vertical nanowire cells, which can comprise a single layer of transistors. In this example, the layout of an SRAM cell 1101 can be a mirror image along the y-axis of the layout of a cell 1103. Likewise, the layout of an SRAM cell 1102 can be a mirror image along the y-axis of the layout of a cell 1104.

FIGS. 12A through 12F illustrate layers of structure of an SRAM cell implemented with a set of six vertical nanowires arranged in a 3×2 layout.

Figure 12A:
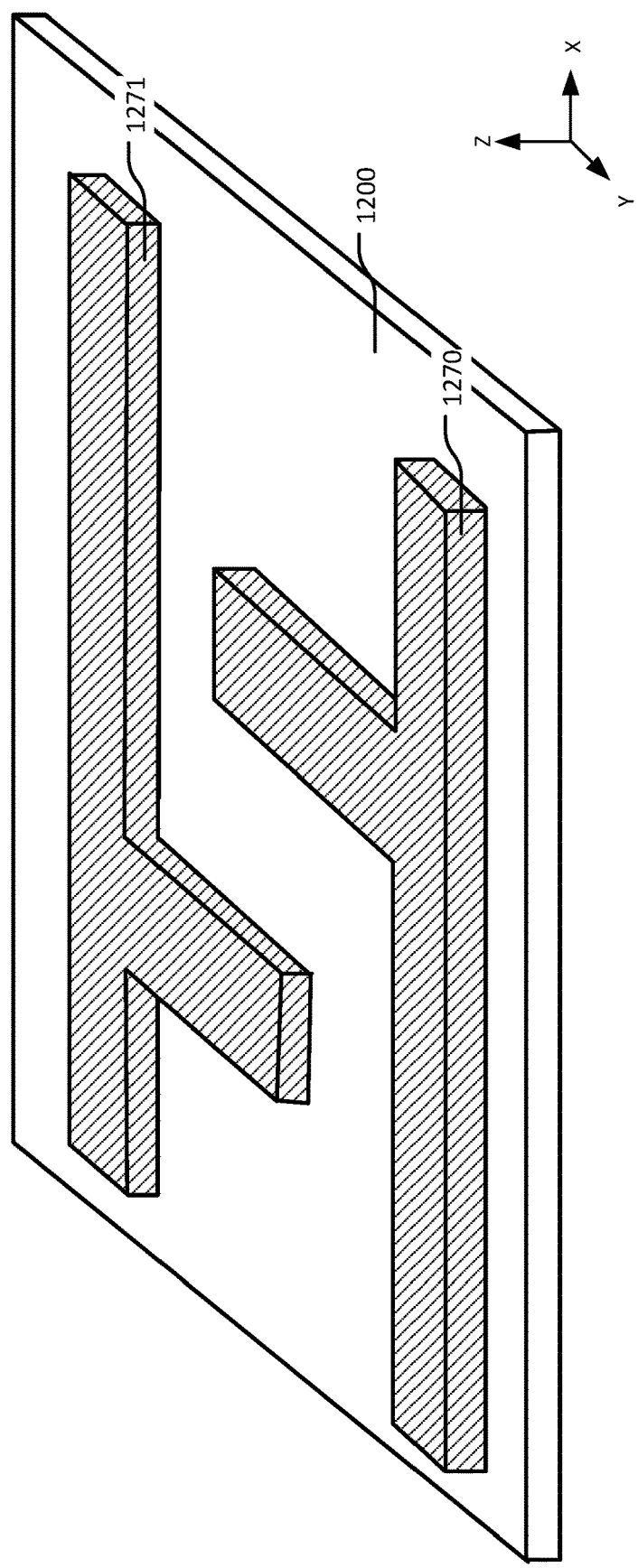
FIGS. 12A through 12F illustrate layers of SRAMs implemented with a set consisting of six vertical nanowires arranged in a 3×2 layout.

FIG. 12A illustrates a perspective view showing a plurality of conductors on a substrate 1200. Substrate 1200, like the silicon crystalline wafer, is provided, having an insulator layer such as a silicon oxide film (not shown), and a conductive film comprising conductive materials, examples of which include doped epitaxial silicon, doped polysilicon, tungsten silicide, titanium silicide, or combinations of materials. A photolithography technique or other patterning process can be applied to form a plurality of intra-cell connectors (e.g. 1270 and 1271). The intra-cell connectors comprise strips of conductive material having a segment along the x-axis configured as a landing pad conductor for three nanowire transistors, and a lateral extension configured as a landing pad for a via. The intra-cell connectors 1270 and 1271 in the plurality are insulated from each other. In one example, the conductors can be polysilicon or epitaxial silicon heavily doped with n-type material.

Figure 12B:
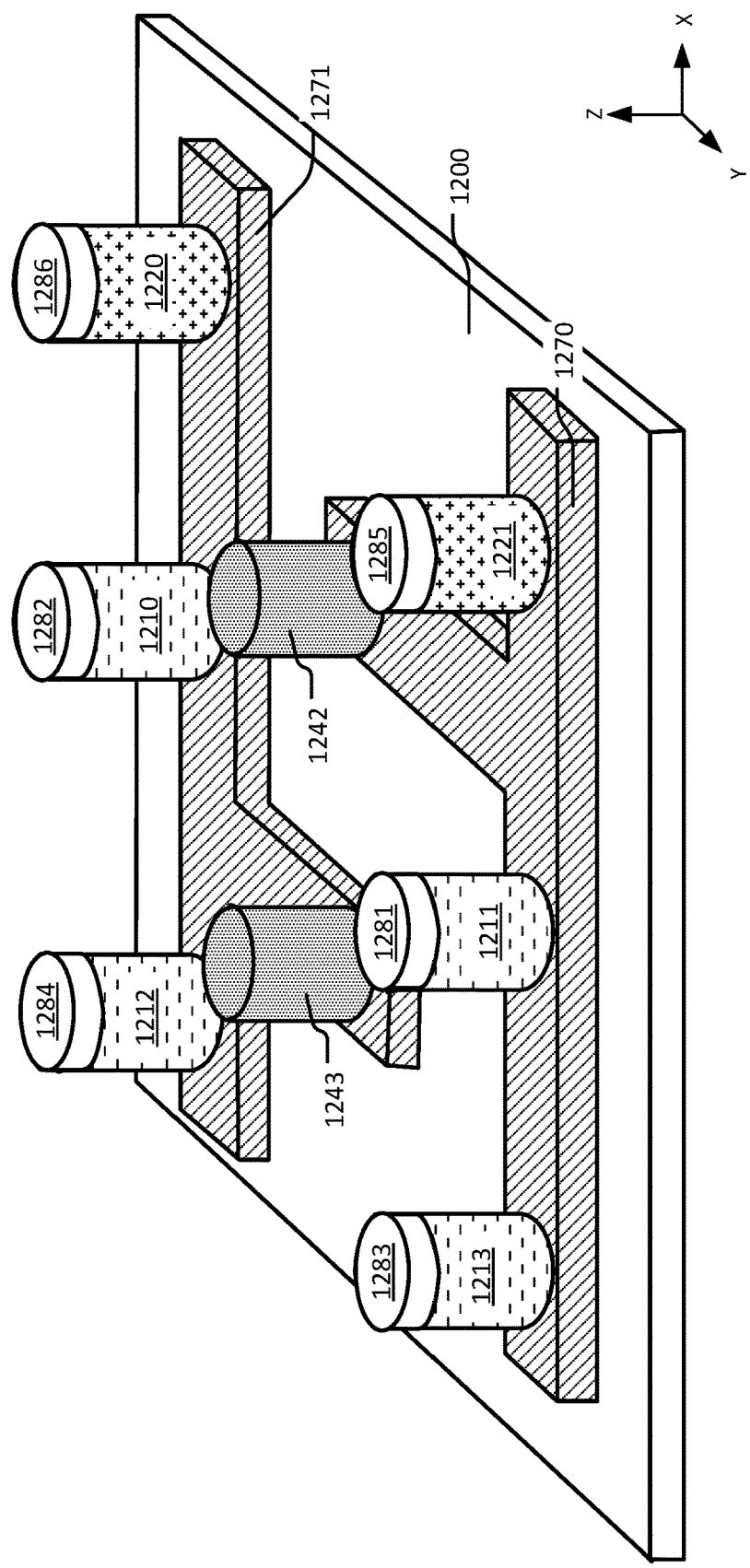

FIG. 12B illustrates a perspective view showing a layer of the n-type and p-type nanowires. A plurality of vertical nanowires is formed on the intra-cell connectors 1270 and 1271. P-type nanowire elements 1220 and 1221 comprise source/drain materials for p-type transistors, and n-type nanowire elements 1210, 1211, 1212, and 1213 comprise source/drain materials for n-type transistors.

Next, channel elements (e.g. 1281, 1282, 1283, 1284, 1285 and 1286) comprising channel materials for the n-type and p-type transistors are formed on top of the source/drain nanowire elements (e.g. 1210, 1211, 1212, 1213, 1220 and 1221), followed by depositing an insulating material (not shown) to fill the space between n-type and p-type nanowires. A gate dielectric is formed around the channel elements.

The nanowires described herein can be replaced with 2D material strips.

A via etch is applied to form openings in the insulating material that stop at the lateral extensions of the intra-cell connectors (1270 and 1271). A conductive material is then deposited to fill the openings to form a plurality of vias (1242 and 1243). The first intra-cell connector includes second via 1242, and the second intra-cell connector includes first via 1243.

Figure 12C:
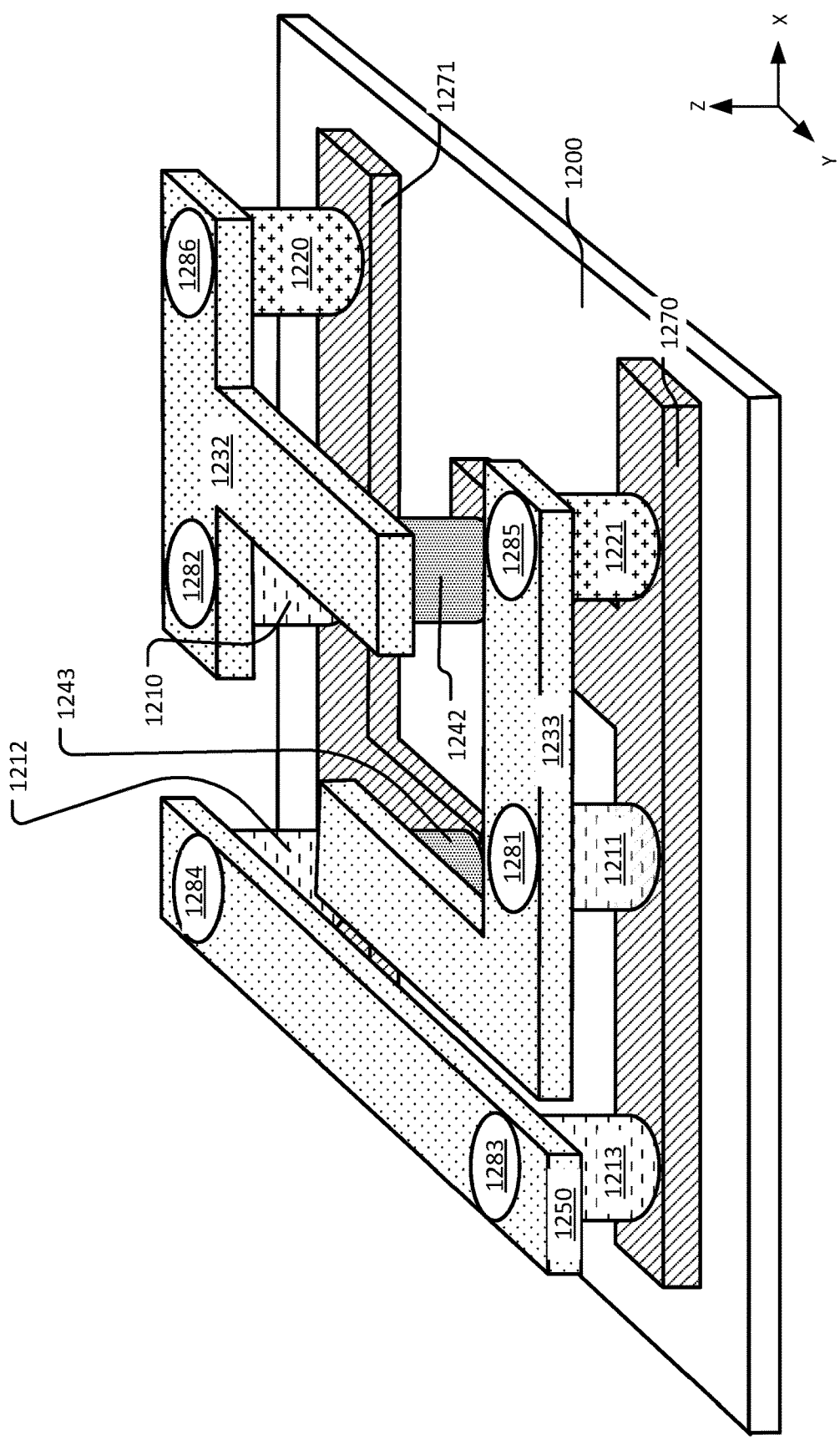

FIG. 12C illustrates a perspective view showing a layer including a plurality of gate conductors (e.g. 1232, 1233 and 1250). A gate conductor film comprising polysilicon can be deposited and patterned to form a first gate conductor 1232 surrounding the channel elements 1282, 1286, a second gate conductor 1233 surrounding the channel elements 1281, 1285, and a third gate conductor 1250 surrounding the channel elements 1283, 1284. First gate conductor 1232 is passively and electrically connected to a first intra-cell conductor 1270 through the second via 1242. Likewise, second gate conductor 1233 is passively and electrically connected to a second intra-cell conductor 1271 through a first via 1243.

Figure 12D:
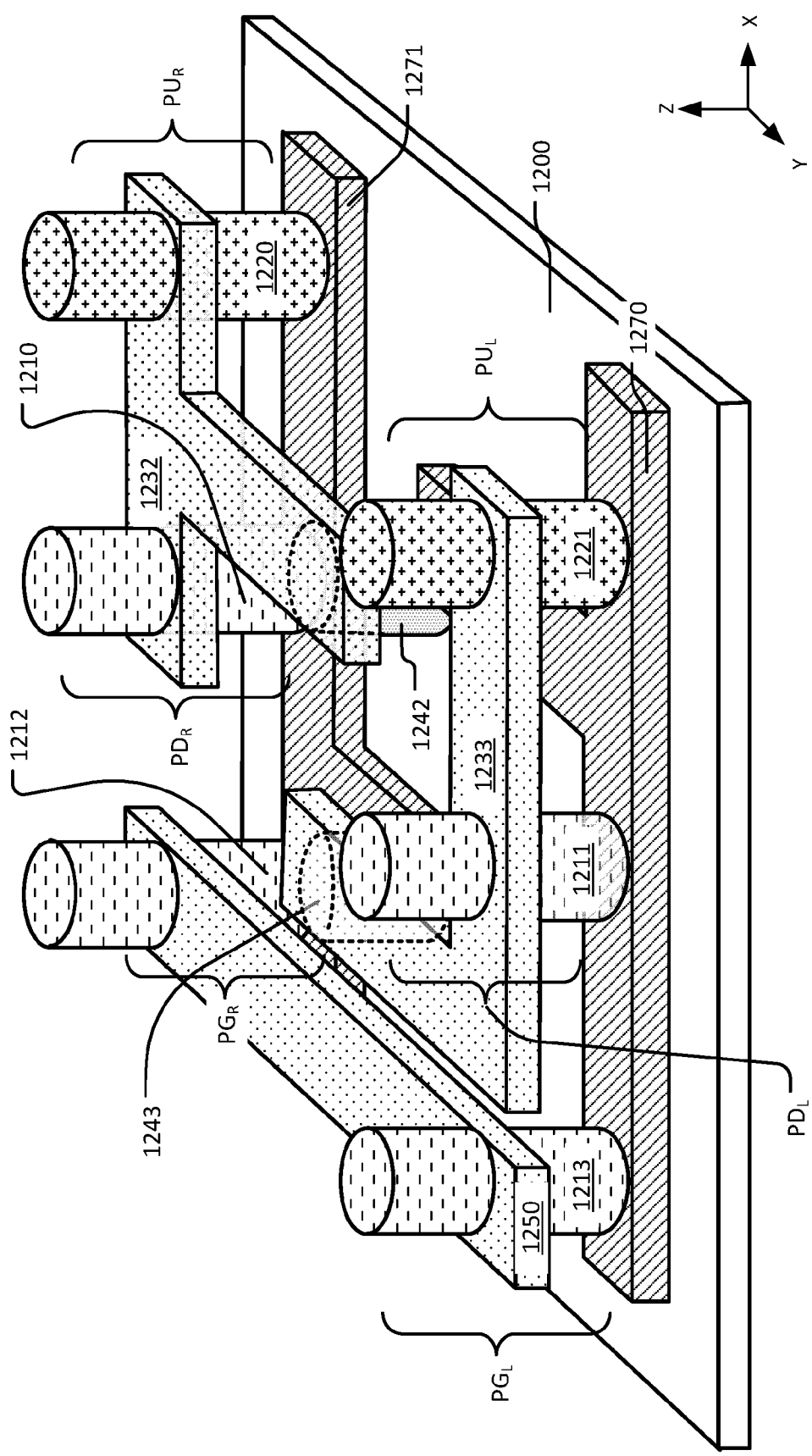

FIG. 12D illustrates a perspective view showing a layer including n-type and p-type source/drain nanowire elements on the corresponding channel elements, so as to complete the layer of four n-type and two p-type nanowire transistors (e.g. $PG_L$, $PG_R$, $PD_L$, $PD_R$, $PU_L$ and $PU_R$) of a six transistor SRAM cell.

Figure 12E:
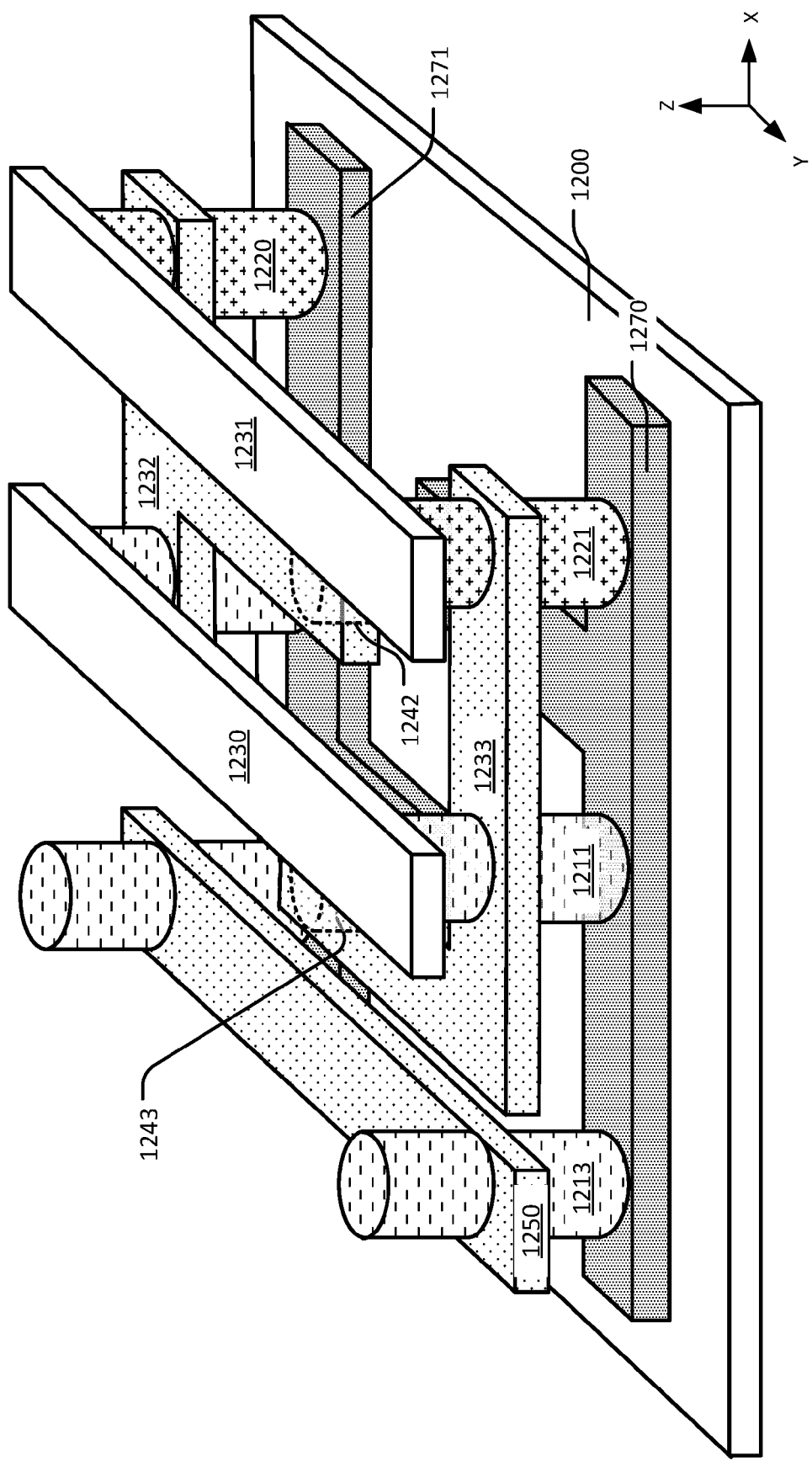

FIG. 12E illustrates a perspective view showing a next layer including a plurality of power terminal conductors (e.g. 1230 and 1231) in the first conductor level. The power terminal conductors 1230 and 1231 in the plurality can comprise a variety of conductive materials such as doped/undoped polysilicon, titanium silicide, tungsten silicide, titanium, or combinations of materials.

Figure 12F:
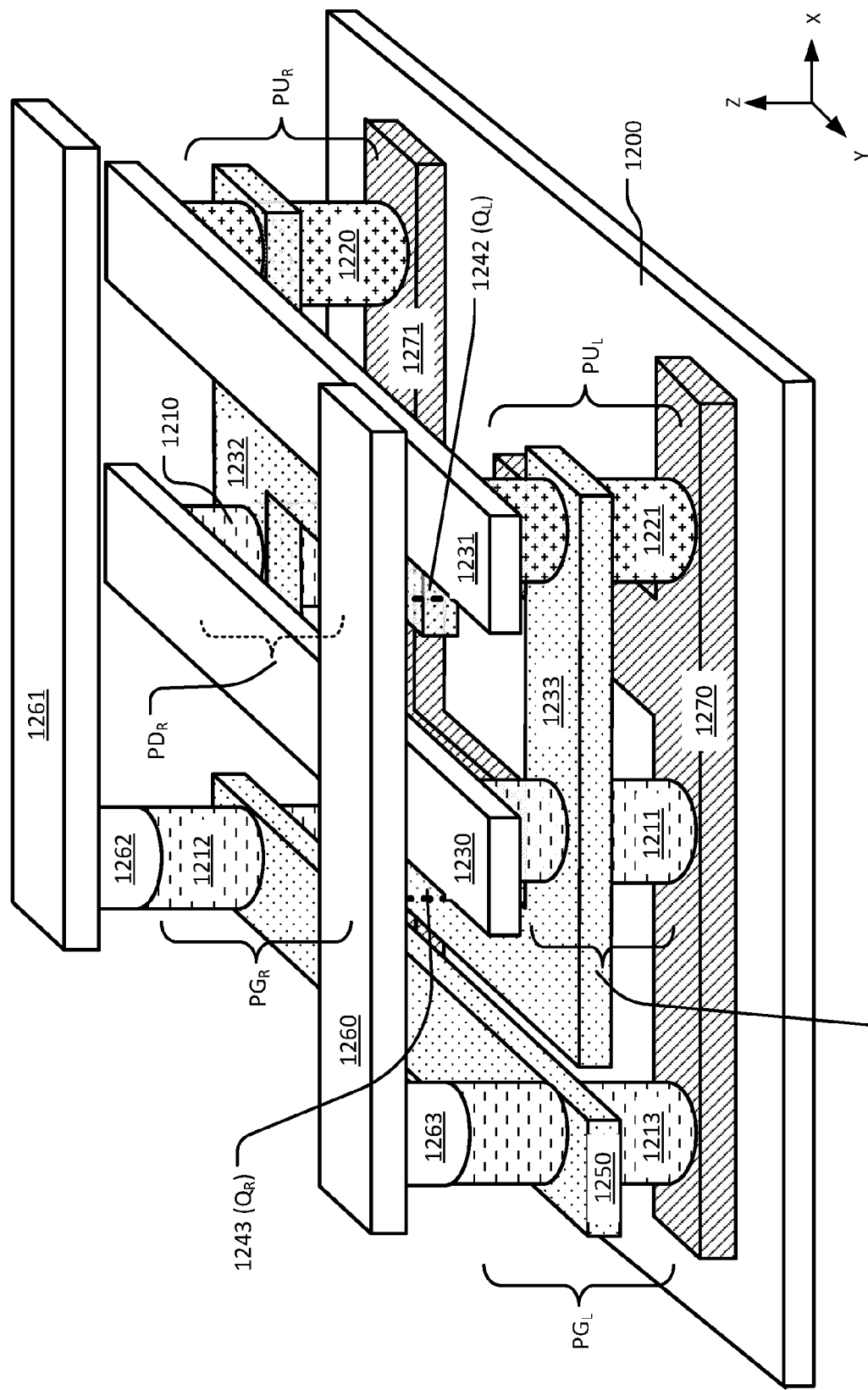

FIG. 12F illustrates a perspective view showing a layer including a plurality of bit line conductors in a second conductor level. A contact hole etch can be applied for example to form openings in the insulating material to expose the top surface of the nanowire transistors $PG_L$ and $PG_R$. Deposition of a conductor material such as tungsten, titanium or other metals or metallic alloys, and/or doped semiconductors, can be applied to fill the openings in the insulating material to form the contacts (e.g. 1262 and 1263) and to form a thin film over the insulating material. A photolithography technique or other patterning process is applied to form a plurality of bit line conductors (e.g. 1260 and 1261).

An SRAM cell described herein comprises a set consisting of six vertical nanowire transistor columns arranged in a 3×2 layout in a parallelogram, each member of the set including a single vertical nanowire transistor. The six columns include first through fourth columns including n-type vertical nanowire transistors, and fifth and sixth columns including p-type vertical nanowire transistors. The first column includes an n-type vertical nanowire transistor $PD_L$, the second column includes an n-type vertical nanowire transistor $PD_R$, the third column includes an n-type vertical nanowire transistor $PG_L$, the fourth column includes an n-type vertical nanowire transistor $PG_R$, the fifth column includes a p-type vertical nanowire transistor $PU_L$, and the sixth column includes a p-type vertical nanowire transistor $PU_R$.

In the illustration of FIG. 12F, the SRAM cell comprises nanowire transistors disposed in a single level over an insulation layer on substrate 1200. Because the transistors are in a single level, no nanowire transistor in the cell is stacked on top of and connected in series to another nanowire transistor in the cell. Also, the gates of all six nanowire transistors can be disposed in a single patterned conductor layer.

The first intra-cell connector 1270 and second intra-cell connector 1271 are disposed over substrate 1200 and are insulated from each other. The source/drain regions of the nanowire transistors $PG_L$, $PD_L$, and $PU_L$ are connected to first intra-cell connector 1270, and the source/drain regions of the nanowire transistors $PG_R$, $PD_R$, and $PU_R$ are connected to second intra-cell connector 1271. First gate conductor 1232 is the gate of the nanowire transistors $PD_R$ and $PU_R$ and is connected to first intra-cell connector 1270 through second via 1242. Second gate conductor 1233 is the gate of the nanowire transistors $PD_L$ and $PU_L$ and is connected to second intra-cell connector 1271 through first via 1243. A third gate conductor 1250 is the gate of the nanowire transistors $PG_L$ and $PG_R$, and also acts as the word line of the cell. All of the nanowire transistors $PG_L$, $PD_L$, $PU_L$, $PG_R$, $PD_R$, and $PU_R$ are disposed in the same level of the structure.

The first intra-cell connector includes a conductor below the first, third and fifth columns, and connects a current path terminal of the p-type vertical nanowire transistor ($PU_L$) in the fifth column to a current path terminal of the n-type vertical nanowire transistor ($PD_L$) in the first column and the n-type vertical nanowire transistor ($PG_L$) in the third column, and connects to gates of the n-type vertical nanowire transistor ($PD_R$) in the second column and to the p-type vertical nanowire transistor ($PU_R$) in the sixth column. Likewise, the second intra-cell connector includes a conductor below the second, fourth and sixth columns, and connects a current path terminal of the p-type vertical nanowire transistor ($PU_R$) in the sixth column to a current path terminal of the n-type vertical nanowire transistor ($PD_R$) in the second column and the n-type vertical nanowire transistor ($PG_R$) in the fourth column, and connects to gates of the n-type vertical nanowire transistor ($PD_L$) in the first column and to the p-type vertical nanowire transistor ($PU_L$) in the fifth column. The first intra-cell connector and the second intra-cell connector include respective first and second vias connecting the corresponding gates to the corresponding current path terminal, and the first and second vias are disposed inside the parallelogram.

A first conductor 1230 connects the source/drain regions of the n-type nanowire transistors $PD_L$ and $PD_R$, and is connected to the cell ground voltage (e.g. $V_{SS}$). A second conductor 1231 connects the source/drain regions of the p-type nanowire transistors $PU_L$ and $PU_R$, and is also connected to the cell supply voltage (e.g. $V_{DD}$). A first bit line conductor 1260 acts as BL and a second bit line conductor 1261 acts as BL/ in complementary bit lines of an SRAM.

First conductor 1230 ($V_{SS}$) is disposed over and contacts current path terminals of n-type vertical nanowire transistors $PD_L$ and $PD_R$ in the first and second columns, and second conductor 1231 ($V_{DD}$) is disposed over and contacts current path terminals of p-type vertical nanowire transistors $PU_L$ and $PU_R$ in the fifth and sixth columns.

First bit line conductor 1260 (BL) is disposed above and contacts a current path terminal of the n-type vertical nanowire transistor $PG_L$ in the third column. Second bit line conductor 1261 (BL/) is disposed above and contacts a current path terminal of the n-type vertical nanowire transistor $PG_R$ in the fourth column.

Figure 13A:
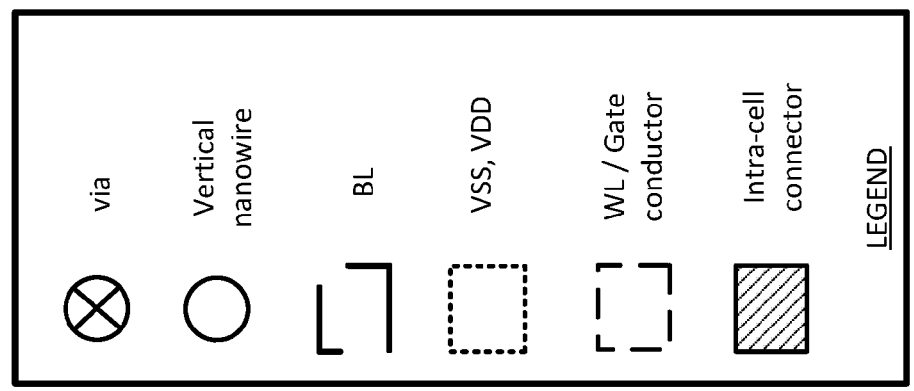
FIG. 13A is a legend applicable to FIG. 13.
Figure 13:
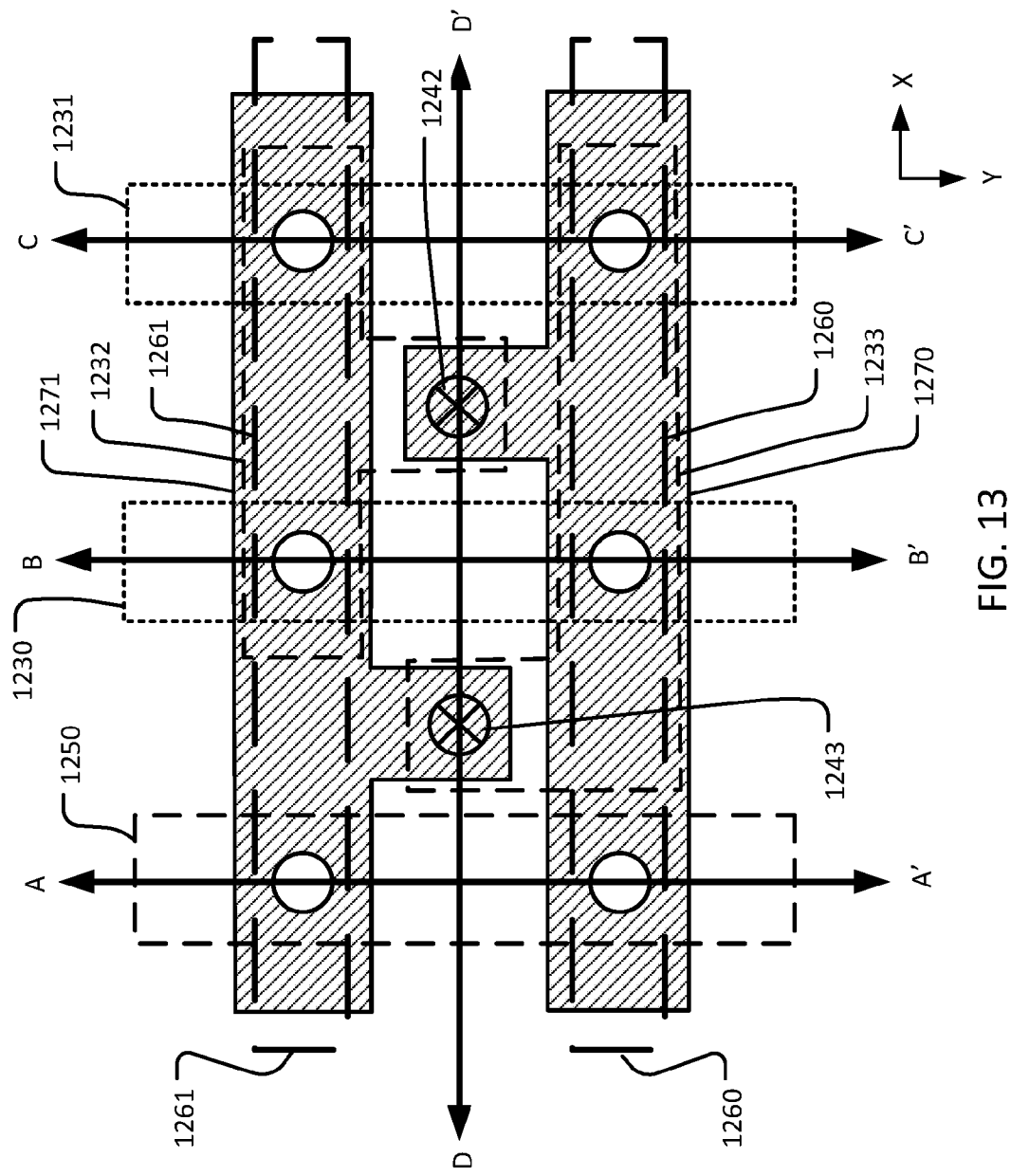
FIG. 13 is a simplified layout diagram showing a top view of an SRAM implemented with a set consisting of six vertical nanowires arranged in a 3×2 layout shown in FIG. 12F.

FIG. 13 is a simplified layout diagram showing a top view of an SRAM implemented with 3×2 vertical nanowire cells like those shown in FIG. 12F.

FIG. 13A is a legend applicable to FIG. 13. The same reference numerals used in FIG. 12F are applied to FIG. 13 to refer to the same or like elements of an embodiment. Description about the same or like elements is not repeated.

Figure 14A:
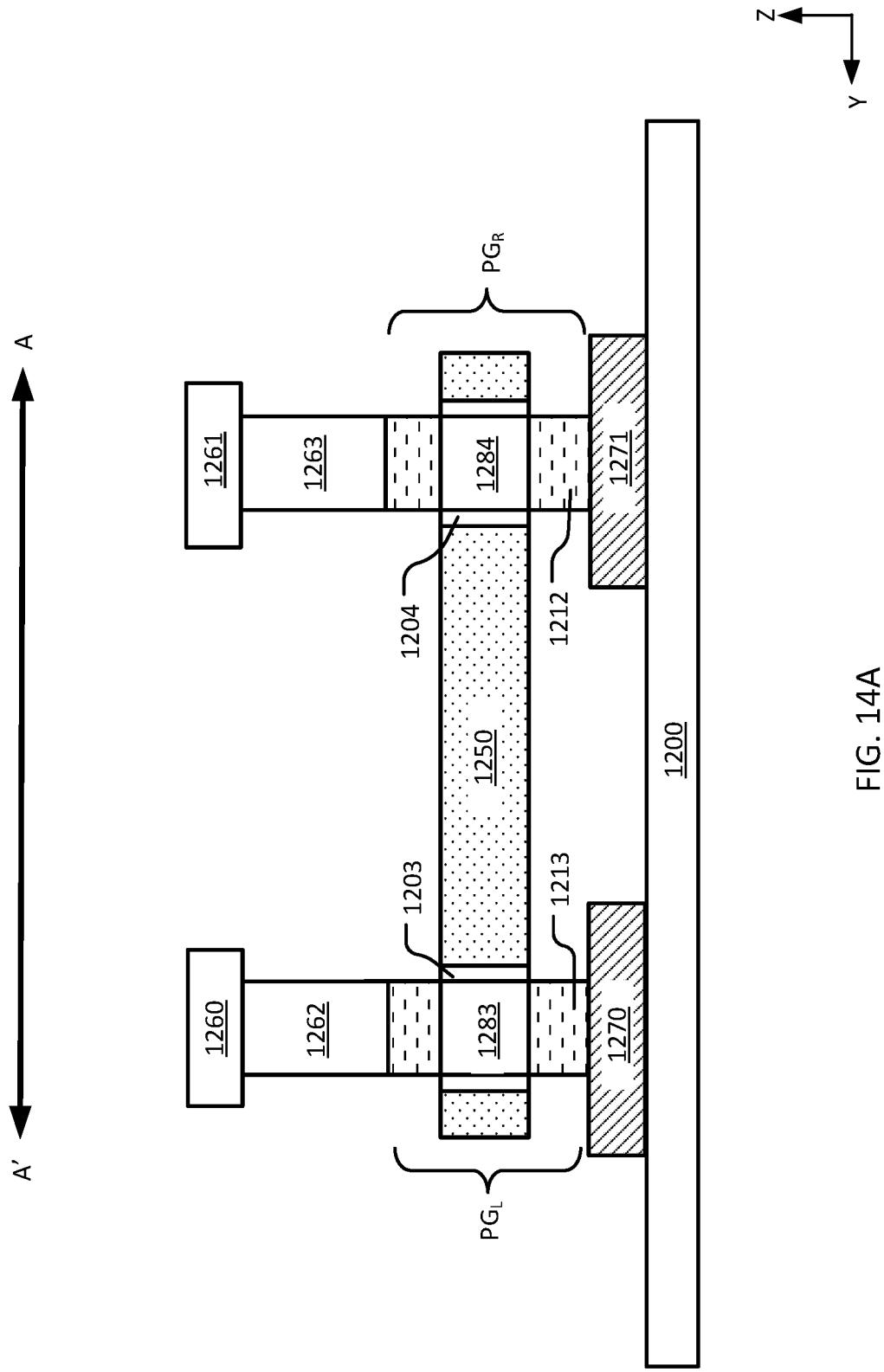
FIG. 14A is a cross-sectional view of the SRAM in FIG. 13 taken at A-A'.

FIG. 14A is a cross-sectional view of the SRAM in FIG. 13 taken at A-A'. Elements in the SRAM shown are disposed on an insulation layer (not shown) on substrate 300. Areas between the elements are filled with dielectric material such as silicon oxide, silicon nitride, low-k dielectric (having a relative permeability less than that of silicon dioxide, or less than 3.9, e.g. SiOC), or with combinations of materials.

As illustrated in FIG. 14A, the channel elements (e.g. 1283 and 1284) of the n-type nanowire transistors $PG_L$ and $PG_R$ are surrounded by dielectric material (e.g. 1203 and 1204), which acts as gated oxide and can comprise materials such as silicon dioxide or a high-κ insulating material. The channel elements (e.g. 1283 and 1284) are also surrounded by the gates, i.e. third gate conductor 1250. The contacts (e.g. 1263 and 1262) can have the same material as the bit line conductors (e.g. 1260 and 1261) in this example. In another example, the contacts can have other materials, such as titanium nitride, to be a liner to enhance adhesion and avoid voids caused by the contact between silicon and metal.

Figure 14B:
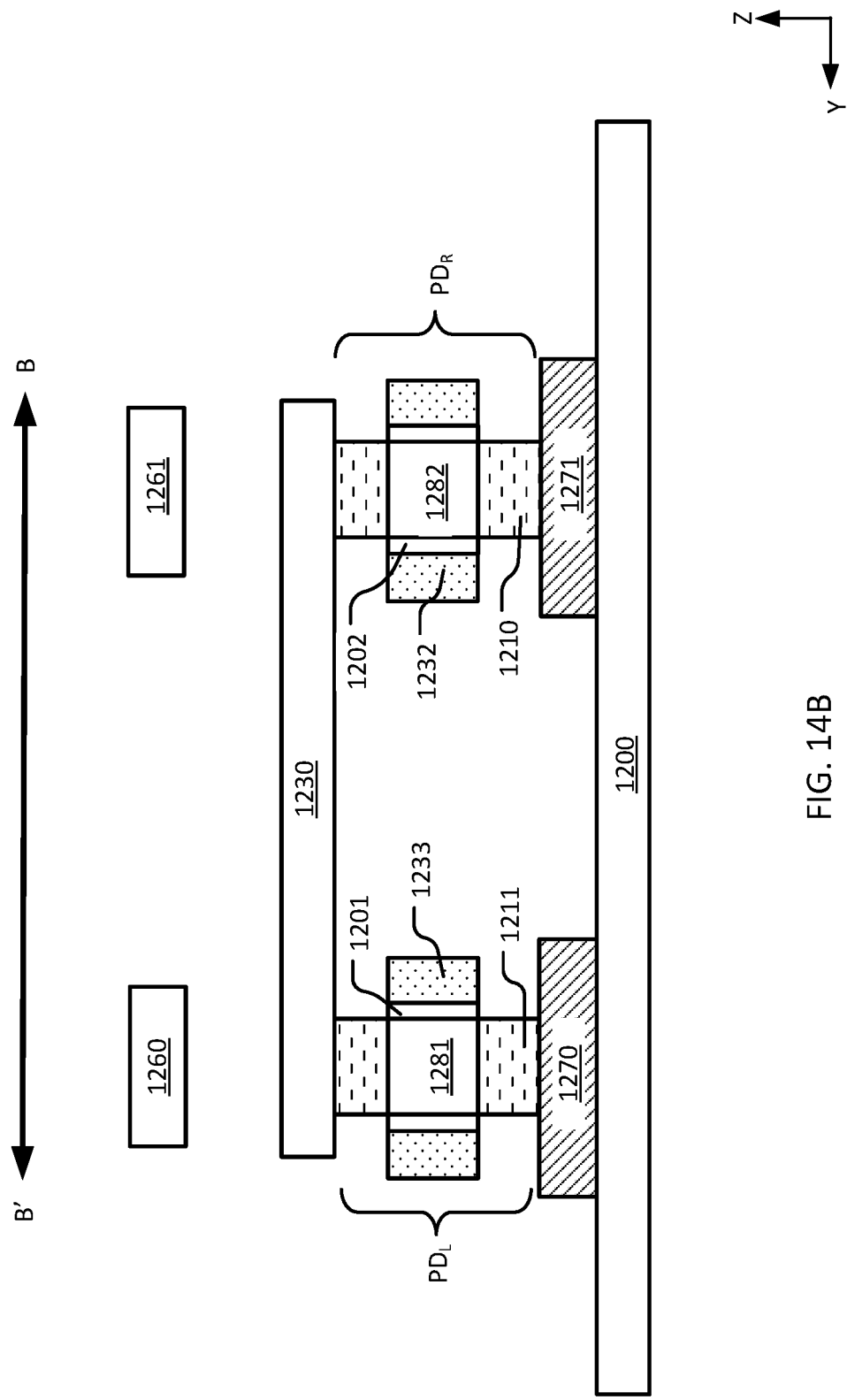
FIG. 14B is a cross-sectional view of the SRAM in FIG. 13 taken at B-B'.

FIG. 14B is a cross-sectional view of the SRAM in FIG. 13 taken at B-B'. The channel elements (e.g. 1281 and 1282) of the n-type nanowire transistors $PD_L$ and $PD_R$ are surrounded by dielectric material (e.g. 1201 and 1202), which acts as gate oxide and can comprise materials such as silicon dioxide or a high-κ insulating material. The channel elements (e.g. 1281 and 1282) are also surrounded by the gates, i.e. first gate conductor 1232 and second gate conductor 1233. First conductor 1230 connects the n-type source/drain regions of the nanowire transistors $PD_L$ and $PD_R$, and is separated from the bit line conductors (e.g. 1260 and 1261).

Figure 14C:
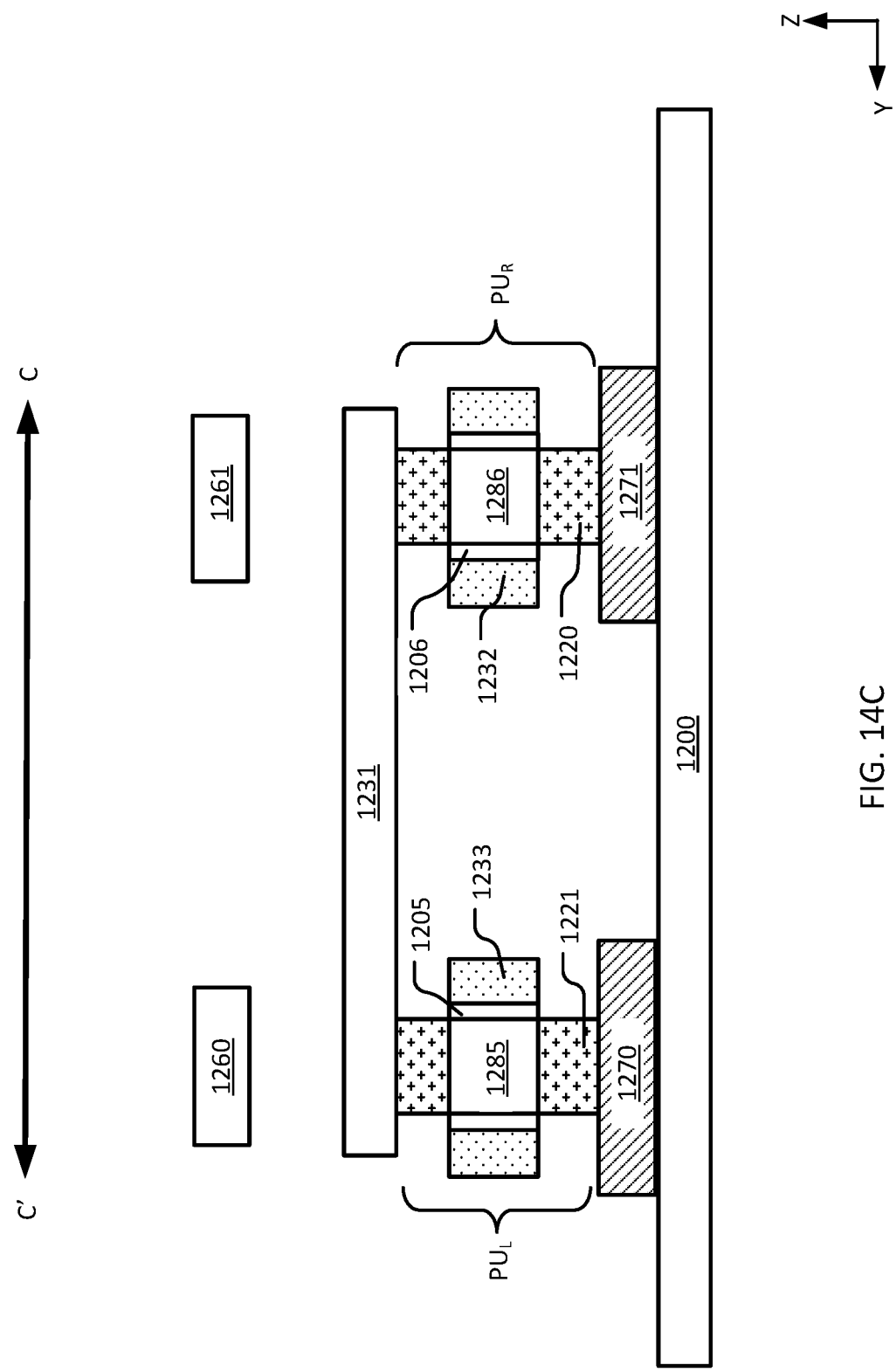
FIG. 14C is a cross-sectional view of the SRAM in FIG. 13 taken at C-C'.

FIG. 14C is a cross-sectional view of the SRAM in FIG. 13 taken at C-C'. The channel elements (e.g. 1285 and 1286) of the p-type nanowire transistors $PU_L$ and $PU_R$ are surrounded by dielectric material (e.g. 1205 and 1206), which acts as gate oxide and can comprise materials such as silicon dioxide or a high-κ insulating material. The channel elements (e.g. 1285 and 1286) are also surrounded by the gates, i.e. second gate conductor 1233 and first gate conductor 1232. Second conductor 1231 connects the p-type source/drain regions of the nanowire transistors $PU_L$ and $PU_R$, and is separated from the bit line conductors (e.g. 1260 and 1261).

Figure 14D:
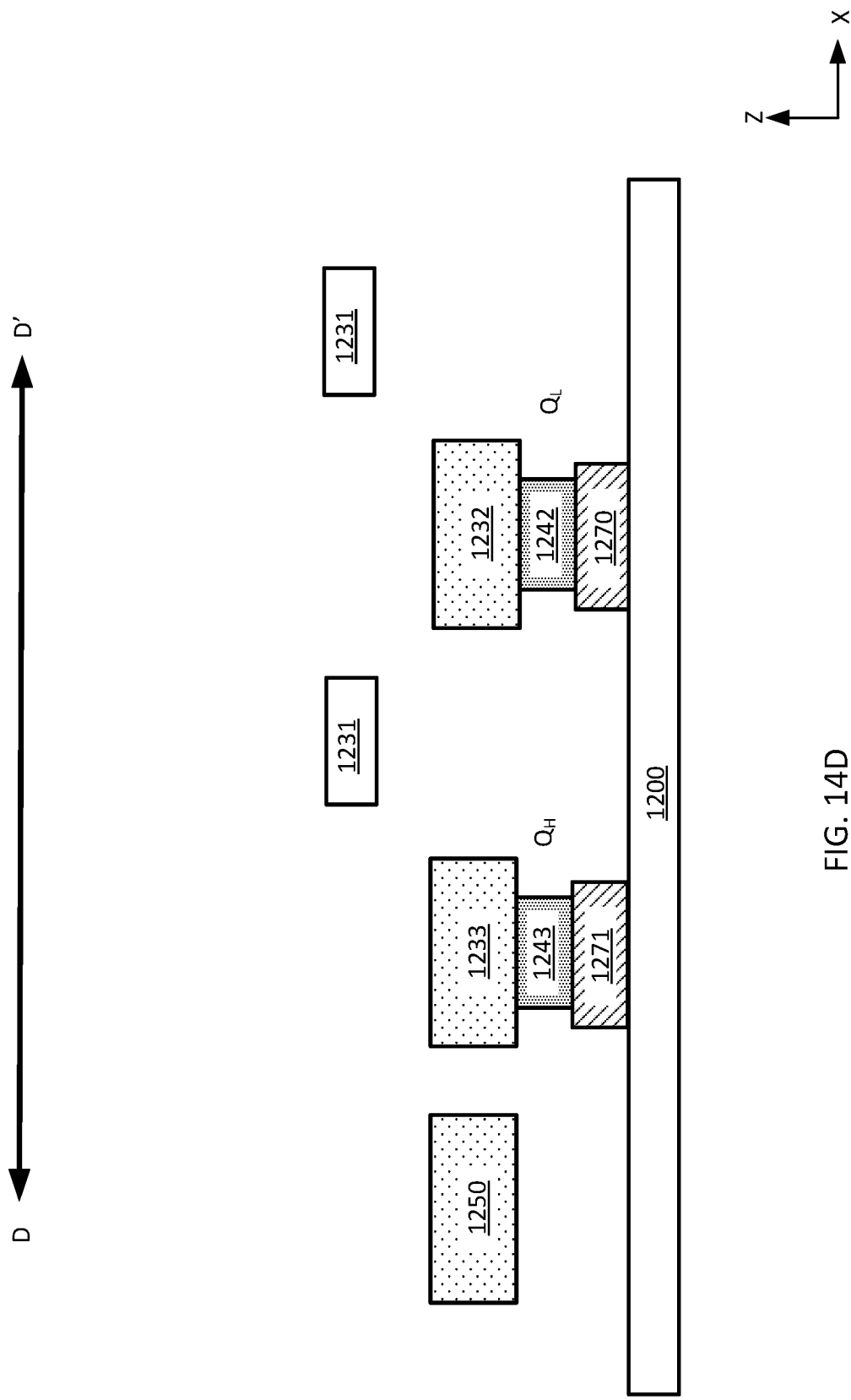
FIG. 14D is a cross-sectional view of the SRAM in FIG. 13 taken at D-D'.

FIG. 14D is a cross-sectional view of the SRAM in FIG. 13 taken at D-D'. In the illustrated cross-section, first via ($Q_H$) connects second gate conductor 1233 and second intra-cell connector 1271, and second via ($Q_L$) connects first gate conductor 1232 and first intra-cell connector 1270.

FIG. 15 is a simplified layout diagram showing a top view of an SRAM implemented with 3×2 vertical nanowires according to another embodiment. FIG. 15A is a legend applicable to FIG. 15. The like reference numerals used in FIG. 12F are applied to FIG. 15 to refer to the same or like elements of an embodiment. Description about the same or like elements is not repeated.

Compared with the layout shown in FIG. 13, the embodiment of FIG. 15 differs in the structure of the intra-cell connector and the shape of the first and second gate conductors (e.g. 1532 and 1533). The gate conductors 1532 and 1533 can have simpler shapes in the structure of FIG. 15, at the expense of two additional contact vias for intra-cell connection. The intra-cell connectors (e.g 1570 or 1571) each include an intra-cell connector segment on the substrate and a bridge conductor (e.g 1590 or 1591). Vias (1592, 1593 or 1594, 1595) couple the bridge conductor to the intra-cell connector segment on the substrate, and connect the bridge conductor to the corresponding gate conductor. This two-via and bridge structure replaces the one via with a single intra-cell connector on the substrate used in FIG. 13 to connect first gate conductor 1532 to first intra-cell connector 1570 and to connect second gate conductor 1533 to second intra-cell connector 1571. The cross-sections taken at A-A', B-B' and C-C' in FIG. 15 are substantially the same as the cross-sectional views in FIGS. 14A, 14B and 14C, and are not illustrated or described again.

FIG. 16 is a cross-sectional view of the SRAM in FIG. 15 taken at D-D'. As illustrated, the first bridge conductor 1590 passively and electrically connects second gate conductor 1533 and second intra-cell connector 1571 together by the vias 1592 and 1593, and is separated from the bit line conductors (e.g. 1560 and 1561). The first intra-cell connector includes the first bridge conductor (e.g. 1590) in a patterned conductor layer over the gates of the vertical nanowire transistors, and the first pair of vias (e.g. 1592, 1593) connects the corresponding gate conductor (e.g. 1533) to the first bridge conductor (e.g. 1590), and the first bridge conductor (e.g. 1590) to the conductor of the first intra-cell connector (e.g. 1570) below the columns. the first and second pairs of vias being disposed inside the parallelogram.

Similarly, the second bridge conductor 1591 of FIG. 15 passively and electrically connects first gate conductor 1532 and first intra-cell connector 1570. The second intra-cell connector includes the second bridge conductor (e.g. 1591 of 15) in a patterned conductor layer over the gates of the vertical nanowire transistors, and a second pair of vias (e.g.

1594, 1595) connecting the corresponding gate conductor (e.g. 1532) to the second bridge conductor (e.g. 1591), and the second bridge conductor (e.g. 1591) to the conductor of the second intra-cell connector (e.g. 1571) below the columns.

The first and second pairs of vias are disposed inside the parallelogram.

Figure 17:
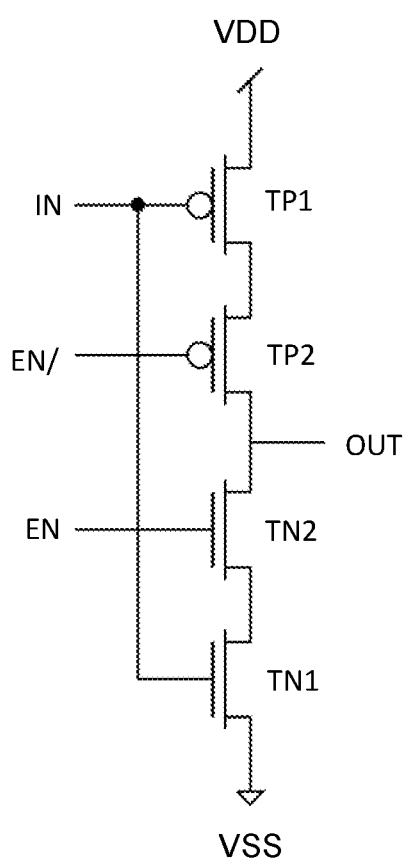
FIG. 17 illustrates a circuit schematic diagram of a tri-state buffer.

FIG. 17 illustrates a circuit schematic diagram of a tri-state buffer circuit. The tri-state buffer circuit includes a first p-type transistor TP1, a second p-type transistor TP2, a first n-type transistor TN1, and a second n-type transistor TN2 connected in series. The source of the first p-type transistor TP1 is connected to the buffer supply voltage (e.g. $V_{DD}$), while the source of the first n-type transistor TN1 is connected to ground (e.g. $V_{SS}$). The control signal EN is applied to the gate of the second n-type transistor TN2 and the control signal EN/ is applied to the gate of the second p-type transistor TP2.

In a first state, the control signal EN/ applied to the gate of the transistor TP2 is at low level and the input signal is at low level. As the control signal EN/ is applied to the gate of the transistor, TP2 is at low level, and as the control signal EN is applied to the gate of the transistor, TN2 is at high level, the transistor TP2 and TN2 both are switched to the ON state, which causes the transistors TP1 and TN1 to operate as an inverter circuit. Therefore, the input signal IN at low level is inverted and an output signal OUT at high level is outputted.

In a second state, the control signal EN/ applied to the gate of the transistor TP2 is at low level and the input signal IN is at high level. Similar to the first state, the transistors TP1 and TN1 operate as an inverter circuit. Therefore, the input signal IN at high level is inverted and an output signal OUT at low level is outputted.

In a third state, the control signal EN/ applied to the gate of the transistor TP2 is at high level. As the control signal EN/ applied to the gate of the transistor TP2 is at high level and the control signal EN applied to the gate of the transistor TP2 is at low level, the transistors TP2 and TN2 both are switched to OFF state. Therefore, a high impedance is placed at the output node, whereby causing disconnection at the output node coupled to another circuit.

Figure 18:
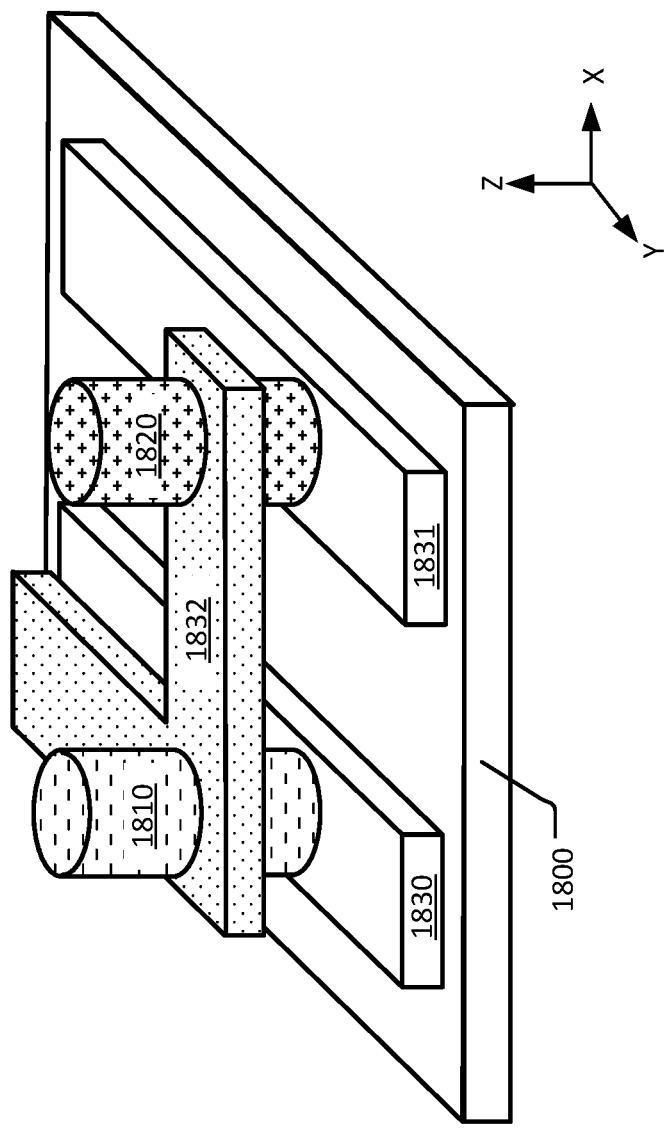
FIGS. 18 through 21 illustrate layers of a logic cell, in which comprises a tri-state buffer implemented with a set consisting of two vertical nanowires.

FIGS. 18 through 21 illustrate layers of a logic cell, which comprises a tri-state buffer implemented with a set consisting of two vertical nanowire columns arranged in a 1×2 layout. The same reference numerals used in FIG. 18 are generally applied to FIGS. 19-21 to refer to the same or like elements of an embodiment. Description about the same or like elements is not repeated FIG. 18 illustrates a perspective view showing a first level of nanowire transistors. A substrate 1800 having an insulating surface area is provided, on which a first conductor 1830 and a second conductor 1831 are formed using for example standard photolithography or other patterning techniques. First and second conductors 1830, 1831 can comprise epitaxial silicon, polysilicon, doped polysilicon, and tungsten silicide, titanium silicide, or combinations of materials.

Next, an n-type vertical nanowire transistor is formed on first conductor 1830, and a p-type vertical nanowire transistor is formed on second conductor 1831. The channels elements in the nanowires (e.g. 1810, 1820) of the n-type and p-type vertical nanowire transistors are insulated from and surrounded by a gate conductor 1832. The gate conductor consists of a segment along the x-axis and a segment along the y-axis that intersect in a right angle.

The nanowires described herein can be replaced with 2D material strips.

A fill step is applied with an insulating material (not shown), such as silicon oxide, to fill the space between nanowire transistors, followed by a planarization technique, such as CMP, to form an even surface.

Figure 19:
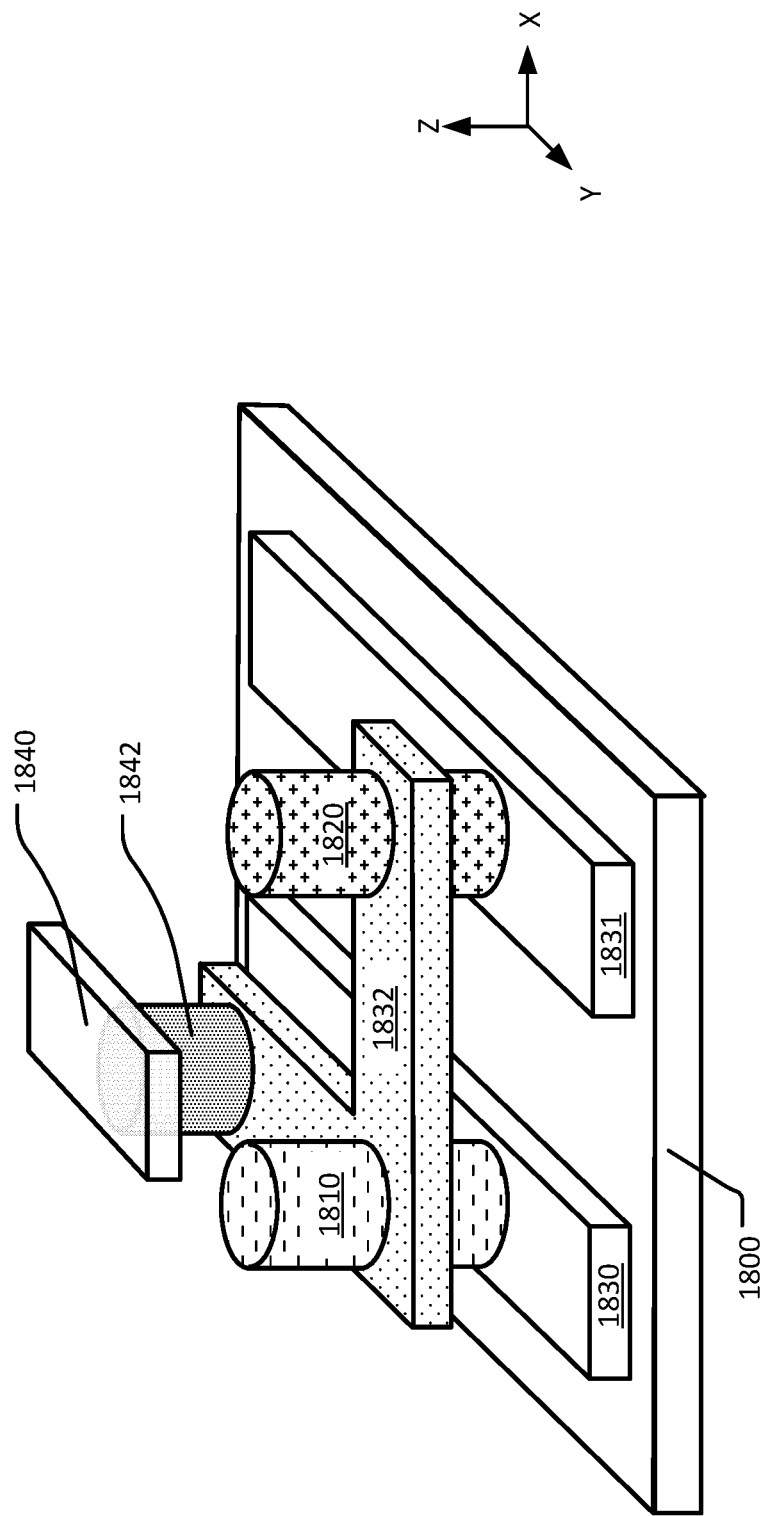

FIG. 19 illustrates a perspective view showing a patterned conductor 1840 overlying a via 1842, which provides connection between the overlying patterned conductor and the gates of the nanowire transistors in the first level. The via 1842 can be formed using a via etch to form an opening in the insulating material (not shown) that stops at the gate conductor 1832. Next, a conductive material is deposited to fill the opening to form via 1842 disposed on a lateral extension of a gate conductor 1832.

In one example, deposition of the conductive material can go on to form an interlayer conductor film, which is then patterned to form the patterned conductor 1840. The via and the patterned conductor can be made up of the same material in this example. In another example, the patterned conductor can comprise a different material than the via.

Figure 20:
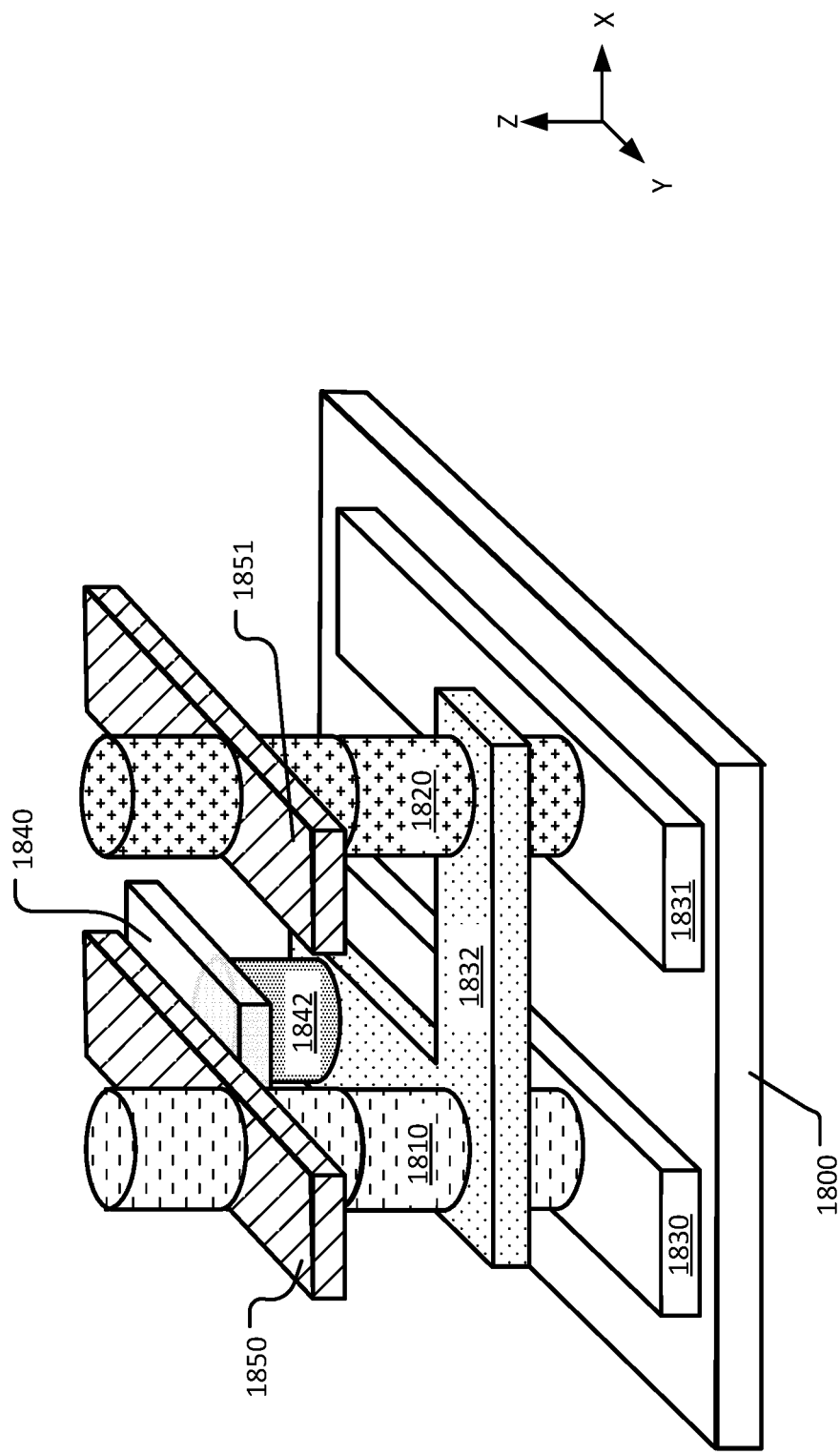

FIG. 20 illustrates a perspective view showing a second level of nanowire transistors. An n-type vertical nanowire transistor is disposed on the n-type nanowire transistors in the first level, and a p-type vertical nanowire transistor is disposed on the p-type nanowire transistors in the first level. The n-type vertical nanowire transistor in the second level comprises a first gate conductor 1850 in the second level, and the p-type vertical nanowire transistor in the second level comprises a second gate conductor 1851 in the second level. The first and second gate conductors extend along the y-axis and are separated from each other.

Figure 21:
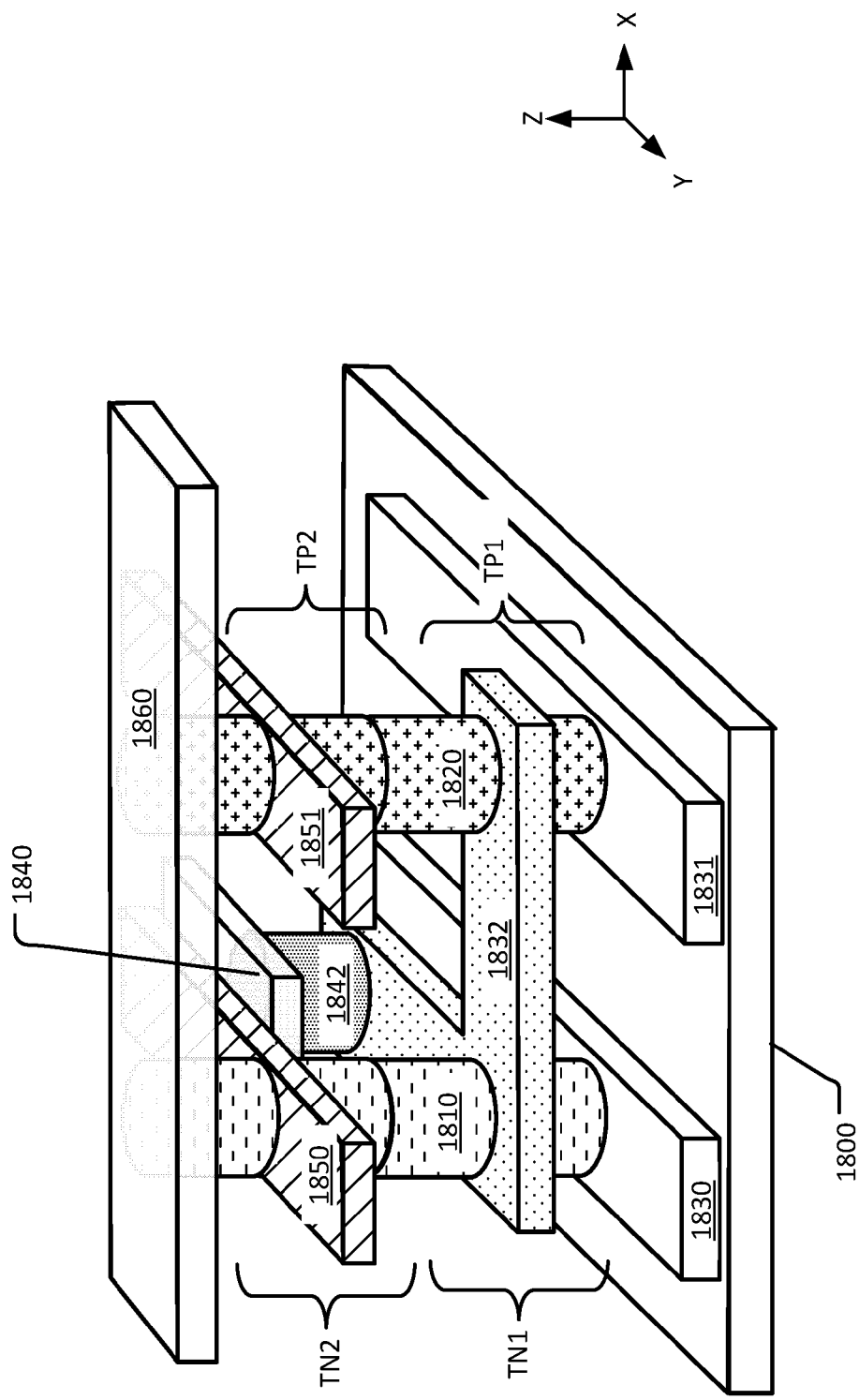

FIG. 21 illustrates a perspective view showing an output conductor 1860 over the nanowire transistors in the second level. A conductive material is deposited over the structure of FIG. 20, and then patterned to form the output conductor 1860 connecting the source/drain elements of the n-type and p-type nanowire transistors in the second level.

The illustrated tri-state buffer circuit is an example of a logic cell which comprises a set of vertical nanowire transistor columns. Logic cells other than a tri-state buffer can be configured using vertical nanowire columns, including one vertical nanowire column with two n-type cells and one vertical nanowire column with two p-type cells. Generally each member of the set in the logic cell includes a vertical nanowire transistor, and at least one member of the set is a vertical nanowire transistor column including two vertical nanowire transistors in series. The set consists in the tri-state buffer cell of two vertical nanowire transistor columns, a first column including two n-type vertical nanowire transistors, and a second column including two p-type vertical nanowire transistors. The two vertical nanowire columns in one set and those in an adjacent set can be arranged in layout at corners of a parallelogram, such as a square, a rectangle, and a rhombus.

A first vertical nanowire transistor column comprises the first n-type nanowire transistor TN1 and the second n-type nanowire transistor TN2 connected in series. A second vertical nanowire transistor column comprises the first p-type nanowire transistor TP1 and the second p-type nanowire transistor TP2 connected in series. Each vertical nanowire transistor column in the set comprises a single vertical nanowire.

First conductor 1830 is disposed beneath and contacts a current path terminal of a vertical nanowire transistor in the first vertical nanowire transistor column, and second conductor 1831 is disposed beneath and contacts a current path terminal of a vertical nanowire transistor in the second vertical nanowire transistor column.

First conductor 1830 connects the source/drain elements of the n-type nanowire transistors (e.g. TN1) to the ground voltage (e.g. $V_{SS}$). Second conductor 1831 connects the source/drain elements of the p-type nanowire transistors (e.g. TP1) to the supply voltage (e.g. $V_{DD}$). Patterned conductor 1840 is connected to the input node and connected to gate conductor 1832 though via 1842. First gate conductor 1850 in the second level is connected to the control signal EN, acting as the gate of the second n-type transistor TN2. Likewise, second gate conductor 1851 in the second level is connected to the control signal EN/, acting as the gate of the second p-type transistor TP2. An output conductor 1860 connects the source/drain elements of nanowire transistors (e.g. TN2, TP2) in the second level and is connected to the output node.

An intra-cell connector including a conductor (e.g. 1860) connects a current path terminal of a p-type vertical nanowire transistor in the second column to the current path terminal of an n-type vertical nanowire transistor in the first column. A second intra-cell connector including a conductor (e.g. 1832) connects a gate of an n-type vertical nanowire transistor in a first level of the first column and a gate of a p-type vertical nanowire transistor in a first level of the second column. The second intra-cell connector includes a conductor (e.g. 1832) forming an all-around gate structure for the gates of the n-type vertical nanowire transistor in the first level of the first column, and the p-type vertical nanowire transistor in the first level of the second column, and the conductor (e.g. 1832) has a lateral extension. Also, the second intra-cell connector includes a via (e.g. 1842) disposed on the lateral extension connecting the conductor (e.g. 1832) to an overlying patterned conductor (e.g. 1840).

In this example, the via (e.g. 1842) is configured to bring up a standard cell's pin (e.g. input signal) to the top. Likewise, to bring up other signals, such as EN and EN/, can be done using a via or a set of vias.

In another example, a via or a set of vias may not be needed in a complex cell structure, in which the local interconnect at the level of gate conductor 1832 may be sufficient.

In yet another example, the second intra-cell connector can have a conductor in a triangular shape or in other shapes configured to connect the overlying patterned conductor.

Figure 22:
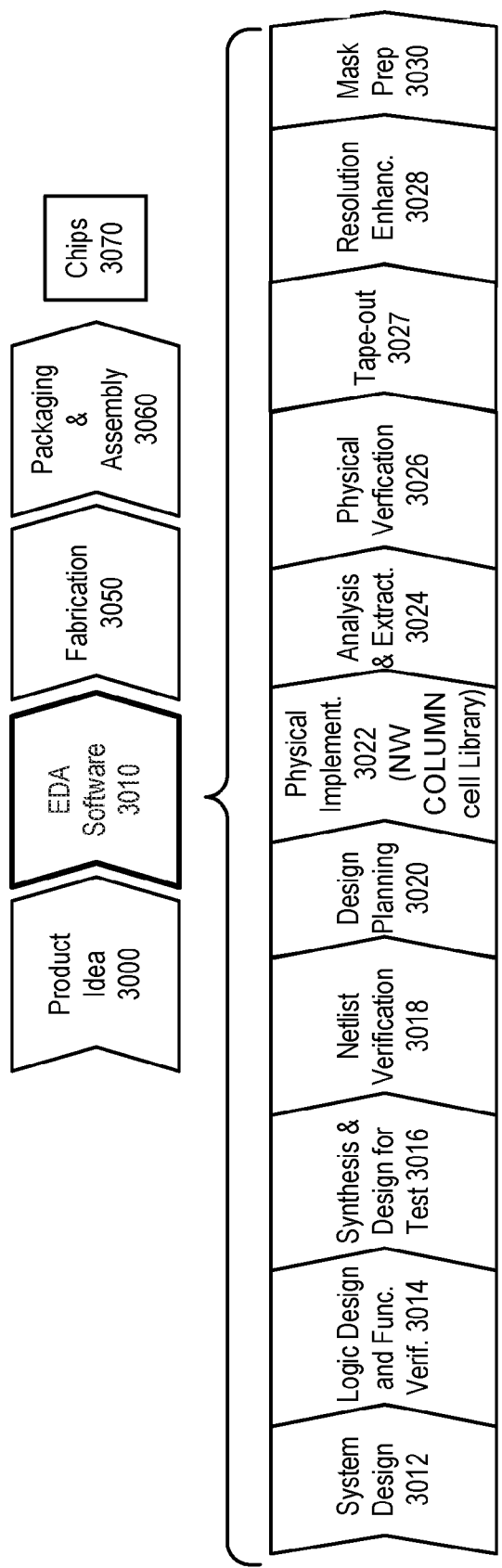
FIG. 22 illustrates a simplified representation of an example integrated circuit design flow.

FIG. 22 shows a simplified representation of an illustrative integrated circuit design flow. As with all flow charts herein, it will be appreciated that many of the steps of FIG. 22 can be combined, performed in parallel or performed in a different sequence without affecting the functions achieved. In some cases, a rearrangement of steps will achieve the same results only if certain other changes are made as well, and in other cases a rearrangement of steps will achieve the same results only if certain conditions are satisfied.

At a high level, the process of FIG. 22 starts with the product idea (block 3000) and is realized in an EDA (Electronic Design Automation) software design process (block 3010). When the design is finalized, the fabrication process (block 3050) and packaging and assembly processes (block 3060) occur, ultimately resulting in finished integrated circuit chips (result 3070).

The EDA software design process (block 3010) is actually composed of a number of steps 3012-3030, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (block 3010) will now be provided.

System design (block 3012): The designers describe the functionality that they want to implement; they can perform what-if planning to refine functionality; check costs; etc. Hardware-software architecture selection can occur at this stage. Example EDA software products that have been available from Synopsys, Inc. that could be used at this step include Model Architect, Saber, System Studio, and DesignWare® products.

Logic design and functional verification (block 3014): At this stage, high level description language (HDL) code, such as the VHDL or Verilog code, for modules in the system is written and the design is checked for functional accuracy. More specifically, the design is checked to ensure that it produces the correct outputs in response to particular input stimuli. Example EDA software products that have been available from Synopsys, Inc. that could be used at this step include VCS, VERA, DesignWare®, Magellan, Formality, ESP and LEDA products.

Synthesis and design for test (block 3016): Here, the VHDL/Verilog is translated to a netlist. The netlist can be optimized for the target technology. Additionally, the design and implementation of tests to permit checking of the finished chip occur. Example EDA software products that have been available from Synopsys, Inc. that could be used at this step include Design Compiler®, Physical Compiler, Test Compiler, Power Complier, FPGA Compiler, TetraMAX, and DesignWare® products. Optimization of design for use of nanowire and 2D material strip cells as described herein can occur in this stage.

Netlist verification (block 3018): At this step, the netlist is checked for compliance with timing constraints and for correspondence with the VHDL/Verilog source code. Example EDA software products that have been available from Synopsys, Inc. that could be used at this step include Formality, PrimeTime, and VCS products.

Design planning (block 3020): Here, an overall floor plan for the chip is constructed and analyzed for timing and top-level routing. Example EDA software products that have been available from Synopsys, Inc. that could be used at this step include Astro and IC Compiler products. Nanowire based, and/or 2D material strip based, cell selection, layout and optimization can occur at this stage.

Physical implementation (block 3022): The placement (positioning of circuit elements) and routing (connection of the same) occurs at this step. Example EDA software products that have been available from Synopsys, Inc. that could be used at this step include AstroRail, Primetime, and Star RC/XT products. Nanowire based, and/or 2D material strip based, cell layout, mapping and interconnect arrangements can be implemented or optimized at this stage, using for example nanowire cells based on nanowire transistor columns and structures described herein.

Analysis and extraction (block 3024): At this step, the circuit function is verified at a transistor level; this in turn permits what-if refinement. Example EDA software products that have been available from Synopsys, Inc. that could be used at this stage include Custom Designer, AstroRail, PrimeRail, Primetime, and Star RC/XT products.

Physical verification (block 3026): At this stage various checking functions are performed to ensure correctness for: manufacturing, electrical issues, lithographic issues, and circuitry. Example EDA software products that have been available from Synopsys, Inc. that could be used at this stage include the Hercules product.

Tape-out (block 3027): This stage provides the "tape-out" data for production of masks for lithographic use to produce finished chips. Example EDA software products that have been available from Synopsys, Inc. that could be used at this stage include the CATS(R) family of products.

Resolution enhancement (block 3028): This stage involves geometric manipulations of the layout to improve manufacturability of the design. Example EDA software products that have been available from Synopsys, Inc. that could be used at this stage include Proteus/Progen, ProteusAF, and PSMGen products.

Mask preparation (block 3030): This stage includes both mask data preparation and the writing of the masks themselves. Example EDA software products that have been available from Synopsys, Inc. that could be used at this stage include CATS(R) family of products.

Embodiments of the nanowire based, and/or 2D material strip based, technologies described herein can be used during one or more of the above-described stages, including for example one or more of stages 3016 through 3022 and 3030. Also, nanowire transistor column cell technology provides flexibility that enables the implementation of engineering change orders ECOs, including modification of the cell sizes during design verification stages.

Figure 23:
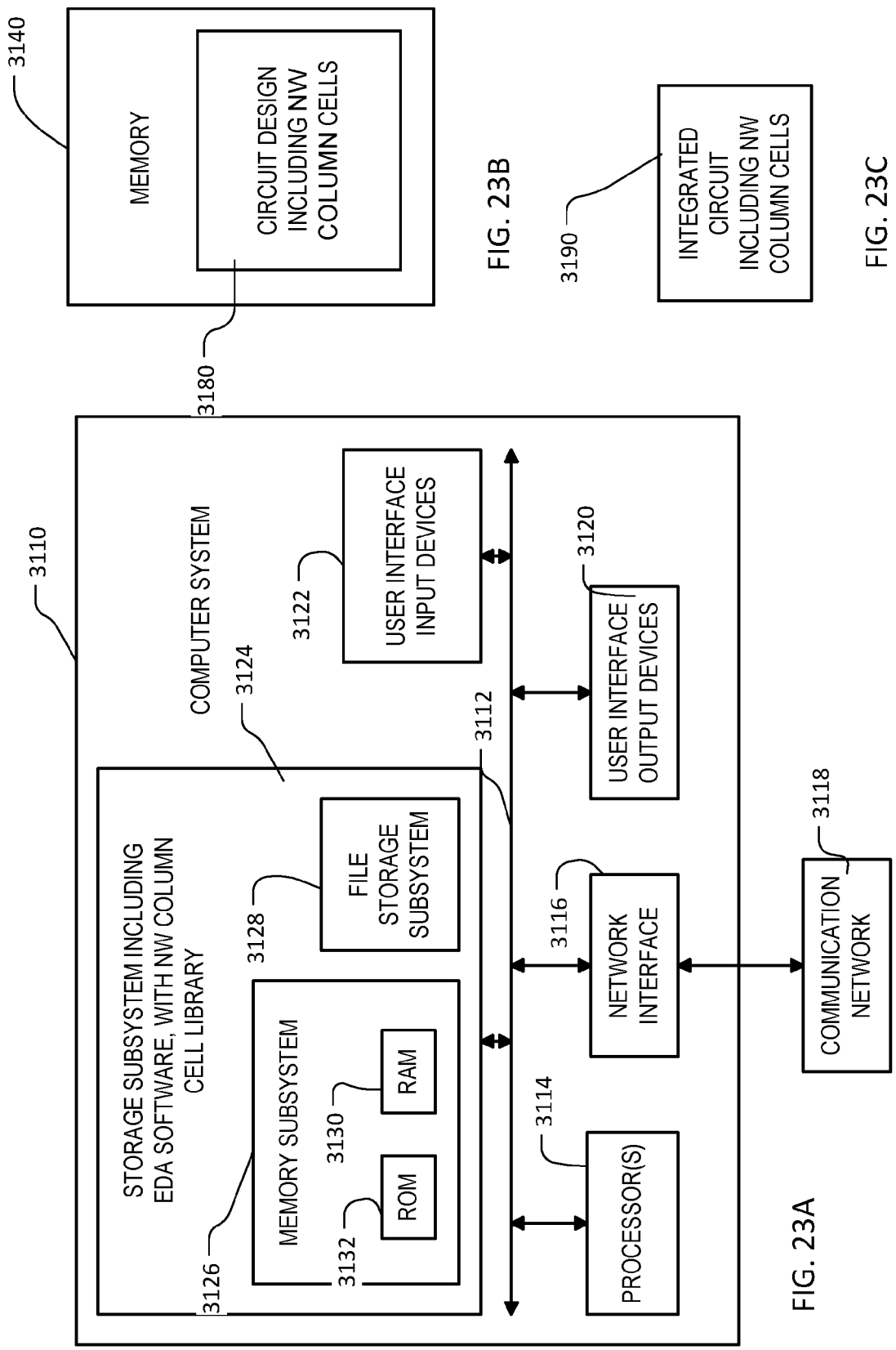
FIGS. 23A, 23B and 23C are simplified block diagrams of a computer system suitable for use with embodiments of the technology, as well as circuit design and circuit embodiments of the technology.

FIGS. 23A, 23B and 23C are simplified block diagrams of a computer system suitable for use with embodiments of the technology, as well as circuit design and circuit embodiments of the technology. Computer system 3110 typically includes at least one processor 3114 which communicates with a number of peripheral devices via bus subsystem 3112. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110. Network interface subsystem 3116 provides an interface to outside networks, including an interface to communication network 3118, and is coupled via communication network 3118 to corresponding interface devices in other computer systems. Communication network 3118 may comprise many interconnected computer systems and communication links. These communication links may be wireline links, optical links, wireless links, or any other mechanisms for communication of information. While, in one embodiment, communication network 3118 is the Internet, communication network 3118 may be any suitable computer network.

User interface input devices 3122 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 3110 or onto communication network 3118.

User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 3110 to the user or to another machine or computer system.

Storage subsystem 3124 stores the basic programming and data constructs that provide the functionality of some or all of the EDA tools described herein, including the nanowire transistor column cell library in which at least one cell specifies a circuit implementation utilizing sets of vertical nanowire transistors arranged in sets of nanowire transistor columns as described herein, and tools applied for development of cells for the library and for physical and logical design using the library. These software modules are generally executed by processor 3114.

Memory subsystem 3126 typically includes a number of memories including a main random access memory (RAM) 3130 for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 3128.

Bus subsystem 3112 provides a mechanism for letting the various components and subsystems of computer system 3110 communicate with each other as intended. Although bus subsystem 3112 is shown schematically as a single bus, alternative embodiments of the bus subsystem may use multiple busses.

Computer system 3110 itself can be of varying types including a personal computer, a portable computer, a workstation, a computer terminal, a network computer, a television, a mainframe, or any other data processing system or user device. Due to the ever-changing nature of computers and networks, the description of computer system 3110 depicted in FIG. 18A is intended only as a specific example for purposes of illustrating the preferred embodiments. Many other configurations of computer system 3110 are possible having more or less components than the computer system depicted in FIG. 23A.

FIG. 23B shows a memory 3140 such as a non-transitory, computer readable data storage medium associated with file storage subsystem 3128, and/or with network interface subsystem 3116, and can include a data structure specifying a circuit design that includes cells from the nanowire and/or 2D material strip cell library, or other nanowire cell-based or 2D material strip-based cells. In other embodiments, the memory 3140 stores a cell library that includes cells implemented using a flexible nanowire and/or 2D material strip cell structure. The memory 3140 can be a hard disk, a floppy disk, a CD-ROM, an optical medium, removable media cartridge, or other medium that stores computer readable data in a volatile or non-volatile form. The memory 3140 is shown storing a circuit design 3180, including for example a description of geometric features of a circuit implementing a cell or macrocell that includes a circuit implementation utilizing sets of vertical nanowire transistors arranged in sets of nanowire transistor columns as described herein.

FIG. 23C is a block representing an integrated circuit 3190 created with the described technology that includes a circuit implementation utilizing sets of vertical nanowire transistors arranged in sets of nanowire transistor columns as described herein, and/or cells selected from a nanowire cell library.

Figure 24:
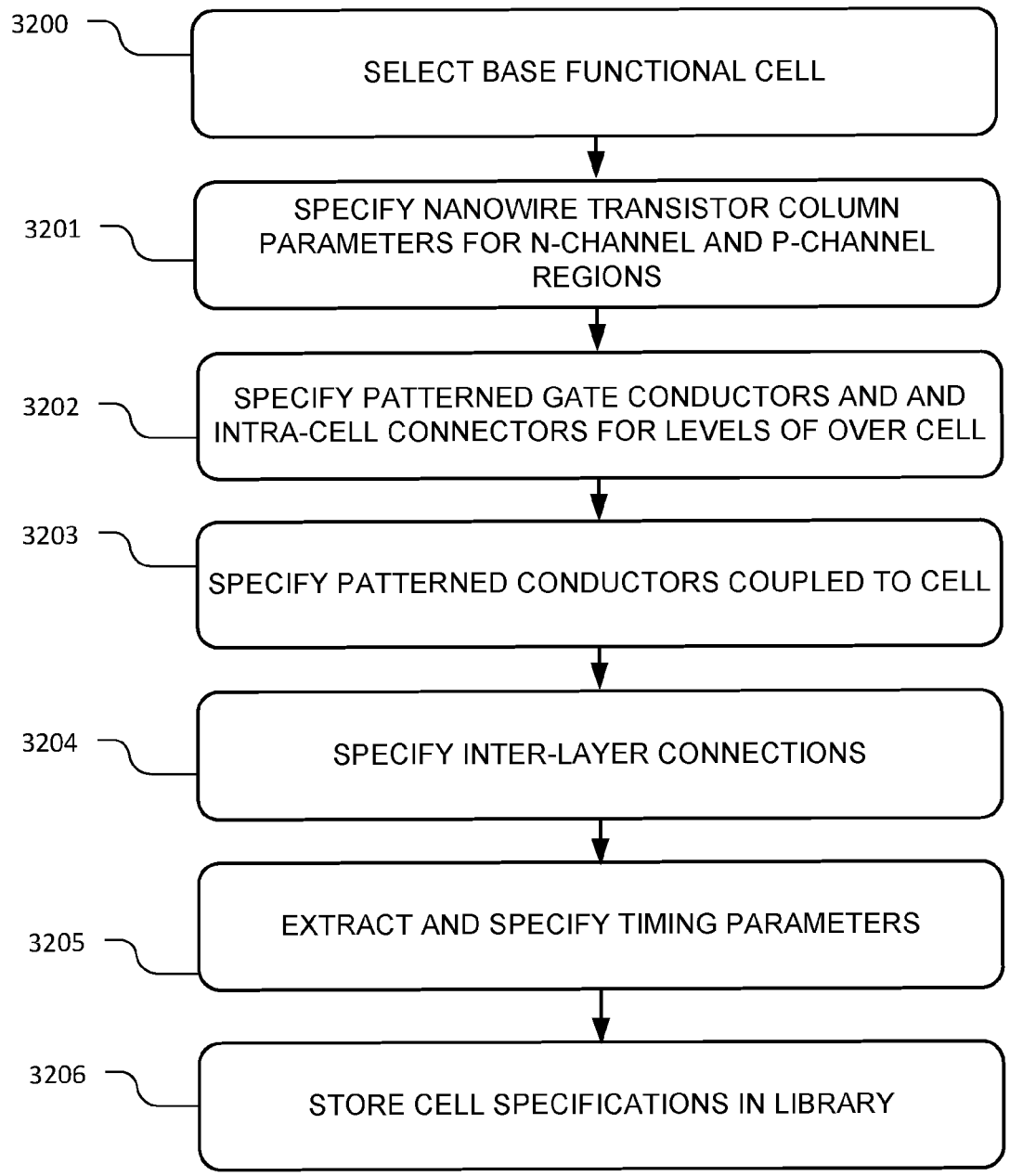
FIG. 24 is a simplified flow diagram of a process for designing a nanowire or 2D material cell for a cell library.

FIG. 24 is a simplified flow diagram of a process for designing a nanowire or 2D material cell, for a circuit implementation utilizing sets of vertical nanowire transistors arranged in sets of nanowire transistor columns, for a cell library. The method may be performed, for example, by an interactive software tool that is used by a cell designer to create a library of cells. The order of the steps can be modified as suits a particular design. According to the simplified flow diagram, a base cell to be included in a cell library is selected (3200). Such a base cell can be an inverter as described above, a flip-flop, logic gates, logic blocks or other cell structures.

In other examples, the user may specify a cell characteristic, such as conductance of the transistors in the on state, or drivability of the cell. The design tool could use the user specified characteristic to determine cell features including the layout arrangement of nanowire transistor columns, and the shapes and locations of intra-cell connectors and gate conductors. User input may specify or provide input used to determine other features, including gate dimensions for example, and features relating to the shape and location of objects in the cell (e.g., cell boundary, location and width of power conductors, gates, active areas) and so on (3201).

The base cell input can comprise a specification of an SRAM cell or logic cell for a circuit implementation utilizing sets of vertical nanowire transistors arranged in sets of nanowire transistor columns as described herein. In this embodiment, the process converts a circuit having a particular transistor having a channel comprising a plurality of fins configured in parallel into a converted circuit, the converted circuit replacing the particular transistor with a converted transistor having a channel comprising one or a plurality of sets of vertical nanowire transistors arranged in sets of nanowire transistor columns as described herein.

Then, the patterned gate conductor layer is specified to form gates in levels of the transistor nanowire transistor columns for transistors in the cell (3202). Then, the patterned conductor layers are specified to establish appropriate interconnections (3203). The plurality of patterned conductor layers includes power conductors. Then, the interlayer connections are specified to locate connections among the vertical nanowire transistors, the gate conductors, nanowire interconnects or 2D material strip interconnects and the conductors, in the one or more patterned conductor layers (3204).

The process of creating the machine readable specifications for an entry in a cell library can include performing extraction processes to define physical characteristics and behaviors of the circuit such as timing parameters like delay, input and output capacitance, gain, area and so on. The extraction processes can be performed using electronic design automation tools like those referred to in connection with FIG. 24 (3205). The specifications produced in this method can comprise layout files implemented in an executable file using Open Architecture System Interchange Standard OASIS format or a Graphic Data System GDS II format file representing the specified geometric shapes of the elements including the sets of nanowire transistor columns. The specifications can include timing files in an executable Liberty Timing File formal (.lib) or in another computer executable format. Entries for a cell library can be created and stored in computer readable memory using the specification, where the entries include the computer readable specifications.

The specified cells are then stored as entries in a cell library for use in integrated circuit design (3206). The specifications in entries in the cell library are executable by a computer running a placement process to control physical placement of the circuit with other circuits or components.

As such, a machine readable specification of a circuit in the context of this description includes a functional configuration of the elements, such as hierarchical configurations, and configurations matching application programmer interfaces (APIs), necessary for execution by the tools for mapping cells from netlists, tools for placement and routing, tools for optimization and/or other tools involved in the production of an integrated circuits and integrated circuit designs utilizing the circuits.

The process may be repeated to define a large number of circuits used as building blocks in integrated circuits. The specifications of the circuits can be used to generate a cell library that includes a large number of cells implementing different functions and performance specifications. In addition, a cell library can be implemented in which a plurality of entries specify implementations of a common circuit configuration, such as an SRAM cell circuit as shown in FIG. 1.

Figure 25:
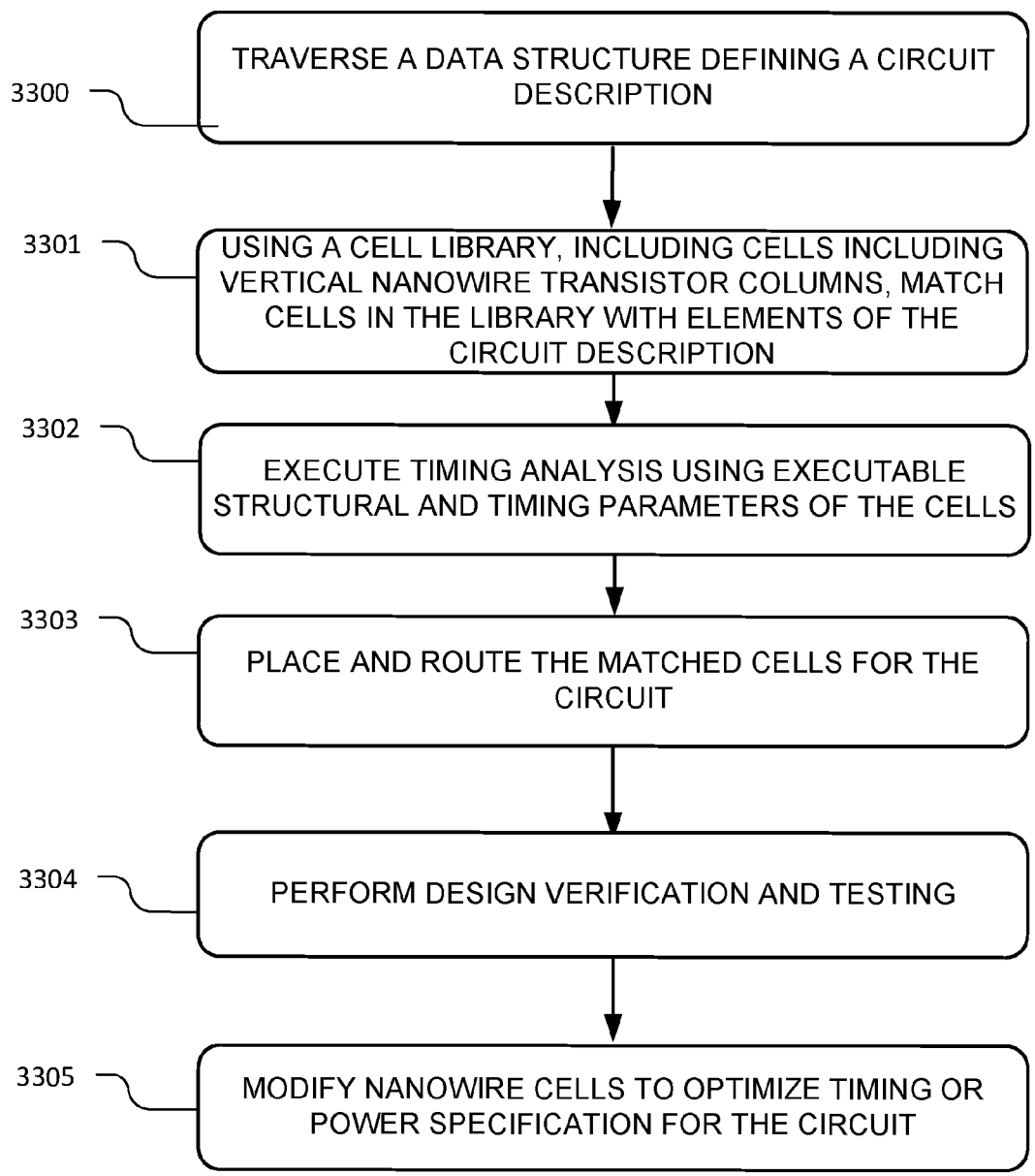
FIG. 25 is a flowchart for a representative design automation process which can be implemented as logic executed by a system like that represented by FIGS. 23A, 23B and 23C, including a nanowire or 2D material strip cell library having cells implemented using at least one nanowire cell and/or at least one 2D material strip cell as described herein.

FIG. 25 is a flowchart for a representative design automation process which can be implemented as logic executed by a system like that represented by FIGS. 23A, 23B and 23C, including a vertical nanowire transistor column cell library having cells implemented using at least one vertical nanowire cell as described herein. According to a first step of the process, a data structure that defines a circuit description, such as a netlist, is traversed in a data processing system (3300). A cell library stored in a database or other computer readable medium coupled with the data processing system, that includes vertical nanowire transistor cell as described herein, is accessed by the data processing system, and utilized to match cells in the library with the elements of the circuit description (3301). Timing analysis can be performed using the executable structural and timing specifications in the cell library, based on other components and circuits, and based on estimates about the other components and circuits. (3302). The matched cells are then placed and routed for an integrated circuit layout (3303). Next, design verification and testing is executed (3304). Finally, the vertical nanowire cells can be modified to optimize timing or power specifications for the circuit (3305). The modifications of the vertical nanowire cells can comprise mask changes that result in changes to the conductors in the patterned conductor layers, and in the pattern of intra-cell connectors, to change the layout arrangement of vertical nanowires or 2D material strips utilized in a particular transistor. These changes can be accomplished in some instances without changing the area on the integrated circuit occupied by the cell.

A vertical nanowire transistor column architecture described above can be utilized to create a flexible library that comprises a plurality of vertical nanowires meeting different functional specifications.

In general, in the creation of a vertical nanowire transistor column architecture, a flexible library is enabled using the architectures described herein. In such library, the standard cells can consist of "soft macros" that could be populated with some flexibility as to the exact location, or the exact layout arrangement of vertical nanowires used in implementation, of their underlying elements.

A library can be comprised of a plurality of nanowire or 2D material strip cells and at least one cell comprising a set of vertical nanowire transistor columns, which exploit subsets of the available nanowire or 2D material strip options in the cells, leaving room for optimization procedures that need not alter the area of the layout consumed by the cell in placement.

The following table provides a heuristic representation of an organization of a nanowire cell library having a plurality of entries. Alternative embodiments can include 2D material strip cells in the library. Some of the information which can be included in the entries in computer readable form is illustrated in the table.

| | |
|---|---|
| NAND-1 | Layout file including transistors T1, T2, . . . and interconnects X1, X2 . . . |
| | n-channel T1 having parallel nanowire channel - 3 stacks of 3 layers each, |
| | p-channel T2 having parallel nanowire channel - 4 stacks of 3 layers each, |
| | n-channel T3 having 6 parallel nanowire channel - 2 stacks of 3 layers each, |
| | . . . |
| | Interconnect X1 having 16 parallel nanowires |
| | Interconnect X2 having 8 parallel nanowires |
| | . . . |
| | Structure and Timing parameters (e.g. GDS and .lib files) |
| NAND-2 | Layout file including transistors T1, T2, . . . and interconnects X1, X2 . . . |
| | n-channel T1 having vertical nanowire channel, |
| | p-channel T2 having vertical nanowire channel |
| | n-channel T3 having vertical nanowire channel |
| | . . . |
| | Interconnect X1 having 16 parallel nanowires |
| | Interconnect X2 having 8 parallel nanowires |
| | . . . |
| | Structure and Timing parameters (e.g. GDS and .lib files) |
| . . . | |
| NOR-1 | Layout file including transistors T1, T2, . . . and interconnects X1, X2 . . . |
| | n-channel T1 having a vertical nanowire channel, |
| | p-channel T2 having a vertical nanowire channel |
| | n-channel T3 having a vertical nanowire channel |
| | . . . |
| | Interconnect X1 having 16 parallel nanowires |
| | Interconnect X2 having 8 parallel nanowires |
| | Structure and Timing parameters (e.g. GDS and .lib files) |
| NOR-2 | Layout file including transistors T1, T2, . . . and interconnects X1, X2 . . . |
| | n-channel T1 having a vertical nanowire channel in a first vertical nanowire transistor column, |
| | p-channel T2 having a vertical nanowire channel in a second vertical nanowire transistor column |
| | n-channel T3 h having a vertical nanowire channel in the first vertical nanowire transistor column |
| | . . . |
| | Interconnect X1 having 16 parallel nanowires |
| | Interconnect X2 having 8 parallel nanowires |
| | Structure and Timing parameters (e.g. GDS and .lib files) |
| . . . | |
| 3-STATE BUFFER 1 | Layout file including transistors T1, T2, . . . and interconnects X1, X2 . . . |
| | Two n-channel vertical nanowire transistors in two nanowire transistor columns, |
| | Two p-channel vertical nanowire transistors in two nanowire transistor columns . . . |
| | Interconnect X1 |
| | Interconnect X2 |
| | Structure and Timing parameters (e.g. GDS and .lib files) |
| 3-STATE BUFFER 2 | Layout file including transistors T1, T2, . . . and interconnects X1, X2 . . . |
| | Two n-channel vertical nanowire transistors in one nanowire transistor column, |
| | Two p-channel vertical nanowire transistors in one nanowire transistor column . . . |
| | Interconnect X1 |
| | Interconnect X2 |
| | Structure and Timing parameters (e.g. GDS and .lib files) |
| . . . | |
| SRAM ARRAY MACROCELL | Unit cell file including transistors T1, T2, . . . and intra-cell connectors X1, X2 . . . |
| | n-channel T1 having a vertical nanowire channel in the first level of a first vertical nanowire transistor column |
| | n-channel T3 having a vertical nanowire channel in the second level of the first vertical nanowire transistor column, |
| | p-channel T2 having a vertical nanowire channel in the first level of a second vertical nanowire transistor column |
| | p-channel T4 having a vertical nanowire channel in the second level of the second vertical nanowire transistor column |
| | . . . |
| | Intra-cell connector X1 having . . . |
| | Intra-cell connectors X2 having . . . |
| | Bit lines . . . |
| | Word lines . . . |
| | Structure and Timing parameters (e.g. GDS and .lib files) |
| . . . | |

In the cell library represented by the above table there is a set of entries for NAND cells, including NAND-1 and NAND-2. The entries in the set of entries specifying NAND cells can specify a functional circuit having in common a circuit configuration for a NAND cell. Entries in the set specifying a functional circuit having a common circuit configuration specify implementation of the same number of transistors interconnected in the same manner. Entries for the SRAM cells can define cell structures including sets of vertical nanowire columns as described herein. The entries for logic cells can define cell structures including sets of vertical nanowire columns as described herein.

The entries include computer readable parameters specifying structural features of physical implementations of circuits, such as geometric layout files for the structural elements of each layer of material in the circuit structure, which can be implemented using a computer program language, such as GDS II for example.

The entries also include computer readable parameters specifying parameters used to simulate timing characteristics of a physical implementation of the circuit when placed with other circuits or components. For example, the cell can include a Liberty Timing File (i.e., a .lib file) which contains the computer readable timing, delay and power parameters associated with the cell. These timing parameters can be obtained by doing the SPICE (Simulation Program with Integrated Circuit Emphasis) simulation of the cells under a variety of conditions, using machine readable parameters specifying the structure features of the cell. The entries in the cell library can be selected according to performance specifications provided by a user to satisfy the elements in a circuit design, such as a netlist.

Also, the entries can define or be utilized to define lithographic mask layers for each cell or macrocell and for a circuit incorporating the cells or macrocells. The specifications can then be utilized by a computer program to produce a set of masks for a manufacturing process implementing the cells or macrocells selected for the circuit design.

Thus, the entries have functional control of the results of a computer running a placement process to control physical placement of the circuit with other circuits or components. A placement process utilizes the entry to estimate the area and timing behavior of the cell specified by the entry, based on assumptions about the proximity to other cells and capacitance of interconnections among cells and other components. The placement process utilizes this estimate to make a placement of the cell with other cells of a circuit design, to be utilized in an iterative process that determines final placement and routing of interconnections among cells.

Also, or in the alternative to an entry in a cell library, a specification of an SRAM cell as described herein can be used as a bit cell by a memory compiler to compile a physical layout (expressed for example as a GDS instance in a non-transitory machine readable memory) of a memory circuit bases on the specification of the SRAM cell and other requirements of the memory circuit. The output of a memory compiler is a circuit layout file for a memory circuit meeting the requirements, such as a dense, pitch-matched array with supporting word lines, bit lines and peripheral circuits or leaf cells such as word line drivers, sense amplifiers and so on. The compiled memory circuits can have selected numbers of cells implemented as specified, selected array areas, selected array aspect ratios and other features. Example memory compiler embodiments can be based on the structures of commercial memory compilers including Synopsys DesignWare Memory Compilers, available from Synopsys, Inc of Mountain View, Calif.

Aspects of the technology described herein also include:
a circuit, comprising an SRAM cell, the SRAM cell comprising a set consisting of six vertical nanowire transistor columns arranged in layout in a parallelogram, each member of the set including a single vertical nanowire transistor, the six columns including first through fourth columns including n-type vertical nanowire transistors, and fifth and sixth columns including p-type vertical nanowire transistors, and including:
a first intra-cell connector including a conductor below the first, third and fifth columns, and connecting a current path terminal of the p-type vertical nanowire transistor ($PU_L$) in the fifth column to a current path terminal of the n-type vertical nanowire transistor ($PD_L$) in the first column and the n-type vertical nanowire transistor ($PG_L$) in the third column, and a connection to gates of the n-type vertical nanowire transistor ($PD_R$) in the second column and of the p-type vertical nanowire transistor ($PU_R$) in the sixth column; and
a second intra-cell connector including a conductor below the second, fourth and sixth columns, and connecting a current path terminal of the p-type vertical nanowire transistor ($PU_R$) in the sixth column to a current path terminal of the n-type vertical nanowire transistor ($PD_R$) in the second column and the n-type vertical nanowire transistor ($PG_R$) in the fourth column, and a connection to gates of the n-type vertical nanowire transistor ($PD_L$) in the first column and of the p-type vertical nanowire transistor ($PU_L$) in the fifth column.

The first intra-cell connector and the second intra-cell connector includes respective first and second vias connecting the corresponding gates to the corresponding current path terminal, the first and second vias being disposed inside the parallelogram.

The first intra-cell connector and the second intra-cell connector includes respective bridge conductors in a patterned conductor layer over the gates of the vertical nanowire transistors and first and second pairs of vias connecting the corresponding gates to the respective bridge conductors and the respective bridge conductors to the conductors of the first and second intra-cell connectors below the columns, the first and second pairs of vias being disposed inside the parallelogram.

The SRAM cell includes a first conductor ($V_{SS}$) disposed over and contacting current path terminals of n-type vertical nanowire transistors in the first and second columns, and a second conductor ($V_{DD}$) disposed over and contacting current path terminals of p-type vertical nanowire transistors in the fifth and sixth columns.

The SRAM cell includes:
a first bit line conductor (BL) disposed above and contacting a current path terminal of the n-type vertical nanowire transistor in the third column;
a second bit line conductor (BL/) disposed above and contacting a current path terminal of the n-type vertical nanowire transistor in the fourth column; and
a word line conductor (WL) connected to the gates of the n-type vertical nanowire transistors in the third and fourth columns.

Aspects of the technology described herein also include a computer system adapted to process a computer implemented representation of circuit design, comprising:
a first intra-cell connector including a conductor below the first, third and fifth columns, and connecting a current path terminal of the p-type vertical nanowire transistor ($PU_L$) in the fifth column to a current path terminal of the n-type vertical nanowire transistor ($PD_L$) in the first column and the n-type vertical nanowire transistor ($PG_L$) in the third column, and a connection to gates of the n-type vertical nanowire transistor ($PD_R$) in the second column and of the p-type vertical nanowire transistor ($PU_R$) in the sixth column; and
a second intra-cell connector including a conductor below the second, fourth and sixth columns, and connecting a current path terminal of the p-type vertical nanowire transistor ($PU_R$) in the sixth column to a current path terminal of the n-type vertical nanowire transistor ($PD_R$) in the second column and the n-type vertical nanowire transistor ($PG_R$) in the fourth column, and a connection to gates of the n-type vertical nanowire transistor ($PD_L$) in the first column and of the p-type vertical nanowire transistor ($PU_L$) in the fifth column.

The first intra-cell connector and the second intra-cell connector include respective first and second vias connecting the corresponding gates to the corresponding current path terminal, the first and second vias being disposed inside the parallelogram.

The first intra-cell connector and the second intra-cell connector include respective bridge conductors in a patterned conductor layer over the gates of the vertical nanowire transistors and first and second pairs of vias connecting the corresponding gates to the respective bridge conductors and the respective bridge conductors to the conductors of the first and second intra-cell connectors below the columns, the first and second pairs of vias being disposed inside the parallelogram.

The SRAM cell includes a first conductor ($V_{SS}$) disposed over and contacting current path terminals of n-type vertical nanowire transistors in the first and second columns, and a second conductor ($V_{DD}$) disposed over and contacting current path terminals of p-type vertical nanowire transistors in the fifth and sixth columns.

The SRAM cell includes:
a first bit line conductor (BL) disposed above and contacting a current path terminal of the n-type vertical nanowire transistor in the third column;
a second bit line conductor (BL/) disposed above and contacting a current path terminal of the n-type vertical nanowire transistor in the fourth column; and
a word line conductor (WL) connected to the gates of the n-type vertical nanowire transistors in the third and fourth columns.

The instructions further include logic to utilize the specification in said at least one entry to determine a physical placement of the cell.

Aspects of the technology described herein also include a computer program product, comprising:
a memory device having stored thereon a machine readable specification of a cell, the specification of the cell including computer readable parameters specifying structural features of a physical implementation of a circuit, the specification being executable by a computer running a placement process to control physical placement of the circuit with other circuits or components or for use by a memory compiler to compile a memory array using the cell, the circuit including:
an SRAM cell, the SRAM cell comprising a set consisting of six vertical nanowire transistor columns arranged in layout in a parallelogram, each member of the set including a single vertical nanowire transistor, the six columns including first through fourth columns including n-type vertical nanowire transistors, and fifth and sixth columns including p-type vertical nanowire transistors; and including:
a first intra-cell connector including a conductor below the first, third and fifth columns, and connecting a current path terminal of the p-type vertical nanowire transistor ($PU_L$) in the fifth column to a current path terminal of the n-type vertical nanowire transistor ($PD_L$) in the first column and the n-type vertical nanowire transistor ($PG_L$) in the third column, and a connection to gates of the n-type vertical nanowire transistor ($PD_R$) in the second column and of the p-type vertical nanowire transistor ($PU_R$) in the sixth column; and
a second intra-cell connector including a conductor below the second, fourth and sixth columns, and connecting a current path terminal of the p-type vertical nanowire transistor ($PU_R$) in the sixth column to a current path terminal of the n-type vertical nanowire transistor ($PD_R$) in the second column and the n-type vertical nanowire transistor ($PG_R$) in the fourth column, and a connection to gates of the n-type vertical nanowire transistor ($PD_L$) in the first column and of the p-type vertical nanowire transistor ($PU_L$) in the fifth column.

The first intra-cell connector and the second intra-cell connector include respective first and second vias connecting the corresponding gates to the corresponding current path terminal, the first and second vias being disposed inside the parallelogram.

The first intra-cell connector and the second intra-cell connector include respective bridge conductors in a patterned conductor layer over the gates of the vertical nanowire transistors and first and second pairs of vias connecting the corresponding gates to the respective bridge conductors and the respective bridge conductors to the conductors of the first and second intra-cell connectors below the columns, the first and second pairs of vias being disposed inside the parallelogram.

The SRAM cell includes a first conductor ($V_{SS}$) disposed over and contacting current path terminals of n-type vertical nanowire transistors in the first and second columns, and a second conductor ($V_{DD}$) disposed over and contacting current path terminals of p-type vertical nanowire transistors in the fifth and sixth columns.

The SRAM cell includes:
a first bit line conductor (BL) disposed above and contacting a current path terminal of the n-type vertical nanowire transistor in the third column;
a second bit line conductor (BL/) disposed above and contacting a current path terminal of the n-type vertical nanowire transistor in the fourth column; and
a word line conductor (WL) connected to the gates of the n-type vertical nanowire transistors in the third and fourth columns.

The computer program product further includes logic to utilize the specification of the cell to determine a physical placement of the circuit.

Aspects of the technology described herein also include a circuit, comprising a logic cell, the logic cell comprising a set of vertical nanowire transistor columns, each member of the set including a vertical nanowire transistor, and at least one member of the set being a vertical nanowire transistor column including two vertical nanowire transistors in series.

The set consists of two vertical nanowire transistor columns, a first column including two n-type vertical nanowire transistors, and a second column including two p-type vertical nanowire transistors.

The logic cell includes an intra-cell connector connecting a current path terminal of a p-type vertical nanowire transistor in the second column to a current path terminal of a n-type vertical nanowire transistor in the first column; and a second intra-cell connector connecting a gate of an n-type vertical nanowire transistor in a first level of the first column and a gate of a p-type vertical nanowire transistor in a first level of the second column.

The logic cell includes a first conductor disposed beneath and contacting a current path terminal of a vertical nanowire transistor in the first vertical nanowire transistor column, and a second conductor disposed beneath and contacting a current path terminal of a vertical nanowire transistor in the second vertical nanowire transistor column.

The second intra-cell connector includes: a conductor forming an all-around gate structure for the gates of the n-type vertical nanowire transistor in the first level of the first column and the p-type vertical nanowire transistor in the first level of the second column, the conductor having a lateral extension; and a via disposed on the lateral extension connecting the conductor to an overlying patterned conductor.

Aspects of the technology described herein also include a computer system adapted to process a computer implemented representation of a circuit design, comprising:
a processor and memory coupled to the processor, the memory storing instructions executable by the processor, including instructions to select cells from a cell library; the cell library including entries for a plurality of cells, entries in the cell library including specifications of particular cells in a computer executable language; and at least one entry in the cell library comprising a specification of physical structures and timing parameters of a logic cell, the logic cell comprising a set of vertical nanowire transistor columns, each member of the set including a vertical nanowire transistor, and at least one member of the set being a vertical nanowire transistor column including two vertical nanowire transistors in series.

The set consists of two vertical nanowire transistor columns, a first column including two n-type vertical nanowire transistors, and a second column including two p-type vertical nanowire transistors.

The logic cell includes: an intra-cell connector connecting a current path terminal of a p-type vertical nanowire transistor in the second column to a current path terminal of an n-type vertical nanowire transistor in the first column; and a second intra-cell connector connecting a gate of an n-type vertical nanowire transistor in a first level of the first column to a gate of a p-type vertical nanowire transistor in a first level of the second column.

The logic cell includes a first conductor disposed beneath and contacting a current path terminal of a vertical nanowire transistor in the first vertical nanowire transistor column, and a second conductor disposed beneath and contacting a current path terminal of a vertical nanowire transistor in the second vertical nanowire transistor column.

The second intra-cell connector includes a conductor forming an all-around gate structure for the gates of the n-type vertical nanowire transistor in the first level of the first column and the p-type vertical nanowire transistor in the first level of the second column, the conductor having a lateral extension; and a via disposed on the lateral extension connecting the conductor to an overlying patterned conductor.

The instructions further include logic to utilize the specification in said at least one entry to determine a physical placement of the cell.

Aspects of the technology described herein also include a computer program product, comprising:

a memory device having stored thereon a machine readable specification of a cell, the specification of the cell including computer readable parameters specifying structural features of a physical implementation of a circuit, the specification being executable by a computer running a placement process to control physical placement of the circuit with other circuits or components, the circuit including:

a logic cell, the logic cell comprising a set of vertical nanowire transistor columns, each member of the set including a vertical nanowire transistor, and at least one member of the set being a vertical nanowire transistor column including two vertical nanowire transistors in series.

The set consists of two vertical nanowire transistor columns, a first column including two n-type vertical nanowire transistors, and a second column including two p-type vertical nanowire transistors.

The logic cell includes: an intra-cell connector connecting a current path terminal of a p-type vertical nanowire transistor in the second column to a current path terminal of an n-type vertical nanowire transistor in the first column; and a second intra-cell connector connecting a gate of an n-type vertical nanowire transistor in a first level of the first column and a gate of a p-type vertical nanowire transistor in a first level of the second column.

The logic cell includes a first conductor disposed beneath and contacting a current path terminal of a vertical nanowire transistor in the first vertical nanowire transistor column, and a second conductor disposed beneath and contacting a current path terminal of a vertical nanowire transistor in the second vertical nanowire transistor column.

The second intra-cell connector includes: a conductor forming an all-around gate structure for the gates of the n-type vertical nanowire transistor in the first level of the first column and the p-type vertical nanowire transistor in the first level of the second column, the conductor having a lateral extension; and a via disposed on the lateral extension connecting the conductor to an overlying patterned conductor.

The computer program product further includes logic to utilize the specification of the cell to determine a physical placement of the circuit.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A circuit, comprising:
   an SRAM cell, the SRAM cell comprising a set of vertical nanowire transistor columns, each member of the set including a vertical nanowire transistor, and at least one member of the set being a vertical nanowire transistor column including a first vertical nanowire transistor on top of and connected in series to a second vertical nanowire transistor.

2. The circuit of claim 1, wherein the set consists of four vertical nanowire transistor columns, a first column including two n-type vertical nanowire transistors, a second column including two n-type vertical nanowire transistors, a third column including one p-type vertical nanowire transistor and a fourth column including one p-type vertical nanowire transistor.

3. The circuit of claim 2, wherein the four vertical nanowire transistor columns are arranged in layout at corners of a parallelogram.

4. The circuit of claim 2, wherein the four vertical nanowire transistor columns are arranged in layout at corners of a rectangle.

5. The circuit of claim 2, wherein the SRAM cell includes:
   a first intra-cell connector ($Q_R$) connecting a current path terminal of the p-type vertical nanowire transistor ($PU_R$) in the fourth column to a current path terminal between the n-type vertical nanowire transistor ($PD_R$) in a first level and the n-type vertical nanowire transistor ($PG_R$) in a second level of the second column, and to gates of the n-type vertical nanowire transistor ($PD_L$) in first level of the first column and of the p-type vertical nanowire transistor ($PU_L$) in the third column; and
   a second intra-cell connector ($Q_L$) connecting a current path terminal of the p-type vertical nanowire transistor ($PU_L$) in the third column to a current path terminal between the n-type vertical nanowire transistor ($PD_L$) in the first level and the n-type vertical nanowire transistor ($PG_L$) in the second level of the first column, and to gates of the n-type vertical nanowire transistor ($PD_R$) in first level of the second column and of the p-type vertical nanowire transistor ($PU_R$) in the fourth column.

6. The circuit of claim 5, wherein the four vertical nanowire transistor columns are arranged in layout at corners of a parallelogram, and the first intra-cell connector and the second intra-cell connector include respective first and second vias connecting the corresponding gates to the corresponding current path terminal, the first and second vias being disposed on opposing sides of the parallelogram.

7. The circuit of claim 5, wherein the four vertical nanowire transistor columns are arranged in layout at corners of a parallelogram, and the first intra-cell connector and the second intra-cell connector include respective first and second vias connecting the corresponding gates to the corresponding current path terminal, the first and second vias being disposed outside of the parallelogram.

8. The circuit of claim 5, wherein the four vertical nanowire transistor columns are arranged in layout at corners of a parallelogram, and the first intra-cell connector and the second intra-cell connector include respective first and second vias connecting the corresponding gates to the corresponding current path terminal, the first via being disposed inside of the parallelogram and the second via being disposed outside of the parallelogram.

9. The circuit of claim 1, wherein the SRAM cell includes a first conductor disposed beneath and contacting current path terminals of vertical nanowire transistors in a first subset of the vertical nanowire transistor columns, and a second conductor disposed beneath and contacting current path terminals of vertical nanowire transistors in a second subset of the vertical nanowire transistor columns.

10. The circuit of claim 2, wherein the SRAM cell includes a first conductor ($V_{SS}$) disposed beneath and contacting current path terminals of n-type vertical nanowire transistors in the first and second vertical nanowire transistor columns, and a second conductor ($V_{DD}$) disposed beneath and contacting current path terminals of p-type vertical nanowire transistors in the third and fourth vertical nanowire transistor columns.

11. The circuit of claim 2, where the SRAM cell includes:
a first bit line conductor (BL) disposed above and contacting a current path terminal of the n-type vertical nanowire transistor in the second level of the first vertical nanowire transistor column;
a second bit line conductor (BL/) disposed above and contacting a current path terminal of the n-type vertical nanowire transistor in the second level of the second vertical nanowire transistor column; and
a word line conductor (WL) connected to the gates of the n-type vertical nanowire transistors in the second level of the first and second vertical nanowire transistor columns.

12. A computer system adapted to process a computer implemented representation of a circuit design, comprising:
a processor and memory coupled to the processor, the memory storing instructions executable by the processor, including instructions to select cells from a cell library and/or to compile a memory layout using a selected cell;
the cell library including entries for a plurality of cells, entries in the cell library including specifications of particular cells in a computer executable language; and
at least one entry in the cell library, or the selected cell, comprising a specification of physical structures and timing parameters of an SRAM cell, the SRAM cell comprising a set of vertical nanowire transistor columns, each member of the set including a vertical nanowire transistor, and at least one member of the set being a vertical nanowire transistor column including a first vertical nanowire transistor on top of and connected in series to a second vertical nanowire transistor.

13. The computer system of claim 12, wherein the set consists of four vertical nanowire transistor columns, a first column including two n-type vertical nanowire transistors, a second column including two n-type vertical nanowire transistors, a third column including one p-type vertical nanowire transistor and a fourth column including one p-type vertical nanowire transistor.

14. The computer system of claim 13, wherein the four vertical nanowire transistor columns are arranged in layout at corners of a parallelogram.

15. The computer system of claim 13, wherein the four vertical nanowire transistor columns are arranged in layout at corners of a rectangle.

16. The computer system of claim 13, wherein the SRAM cell includes
a first intra-cell connector ($Q_R$) connecting a current path terminal of the p-type vertical nanowire transistor ($PU_R$) in the fourth column to a current path terminal between the n-type vertical nanowire transistor ($PD_R$) in a first level and the n-type vertical nanowire transistor ($PG_R$) in a second level of the second column, and to gates of the n-type vertical nanowire transistor ($PD_L$) in first level of the first column and of the p-type vertical nanowire transistor ($PU_L$) in the third column; and
a second intra-cell connector ($Q_L$) connecting a current path terminal of the p-type vertical nanowire transistor ($PU_L$) in the third column to a current path terminal between the n-type vertical nanowire transistor ($PD_L$) in the first level and the n-type vertical nanowire transistor ($PG_L$) in the second level of the first column, and to gates of the n-type vertical nanowire transistor ($PD_R$) in the first level of the second column and of the p-type vertical nanowire transistor ($PU_R$) in the fourth column.

17. The computer system of claim 16, wherein the four vertical nanowire transistor columns are arranged in layout at corners of a parallelogram, and the first intra-cell connector and the second intra-cell connector include respective first and second vias connecting the corresponding gates to the corresponding current path terminal, the first and second vias being disposed on opposing sides of the parallelogram.

18. The computer system of claim 16, wherein the four vertical nanowire transistor columns are arranged in layout at corners of a parallelogram, and the first intra-cell connector and the second intra-cell connectors include respective first and second vias connecting the corresponding gates to the corresponding current path terminal, the first and second vias being disposed outside of the parallelogram.

19. The computer system of claim 16, wherein the four vertical nanowire transistor columns are arranged in layout at corners of a parallelogram, and the first intra-cell connector and the second intra-cell connector include respective first and second vias connecting the corresponding gates to the corresponding current path terminal, the first via being disposed inside of the parallelogram and the second via being disposed outside of the parallelogram.

20. The computer system of claim 12, wherein the SRAM cell includes a first conductor disposed beneath and contacting current path terminals of vertical nanowire transistors in a first subset of the vertical nanowire transistor columns, and a second conductor disposed beneath and contacting current path terminals of vertical nanowire transistors in a second subset of the vertical nanowire transistor columns.

21. The computer system of claim 13, wherein the SRAM cell includes a first conductor ($V_{SS}$) disposed beneath and contacting current path terminals of n-type vertical nanowire transistors in the first and second vertical nanowire transistor columns, and a second conductor ($V_{DD}$) disposed beneath and contacting current path terminals of p-type vertical nanowire transistors in the third and fourth vertical nanowire transistor columns.

22. The computer system of claim 13, where the SRAM cell includes:
a first bit line conductor (BL) disposed above and contacting a current path terminal of the n-type vertical nanowire transistor in the second level of the first vertical nanowire transistor column;
a second bit line conductor (BL/) disposed above and contacting a current path terminal of the n-type vertical nanowire transistor in the second level of the second vertical nanowire transistor column; and
a word line conductor (WL) connected to the gates of the n-type vertical nanowire transistors in the second level of the first and second vertical nanowire transistor columns.

23. The computer system of claim 12, wherein the instructions further include logic to utilize the specification in said at least one entry to determine a physical placement of the cell.

24. A computer program product, comprising:
a memory device having stored thereon a machine readable specification of a cell, the specification of the cell including computer readable parameters specifying structural features of a physical implementation of a circuit, the specification being executable by a computer running a placement process to control physical placement of the circuit with other circuits or components or for use by a memory compiler to compile a memory array using the cell, the circuit including:
an SRAM cell, the SRAM cell comprising a set of vertical nanowire transistor columns, each member of the set including a vertical nanowire transistor, and at least one member of the set being a vertical nanowire transistor column including a first vertical nanowire transistor on top of and connected in series to a second vertical nanowire transistor.

25. The computer program product of claim 24, wherein the set consists of four vertical nanowire transistor columns, a first column including two n-type vertical nanowire transistors, a second column including two n-type vertical nanowire transistors, a third column including one p-type vertical nanowire transistor and a fourth column including one p-type vertical nanowire transistor.

26. The computer program product of claim 25, wherein the four vertical nanowire transistor columns are arranged in layout at corners of a parallelogram.

27. The computer program product of claim 25, wherein the four vertical nanowire transistor columns are arranged in layout at corners of a rectangle.

28. The computer program product of claim 25, wherein the SRAM cell includes:
a first intra-cell connector ($Q_R$) connecting a current path terminal of the p-type vertical nanowire transistor ($PU_R$) in the fourth column to a current path terminal between the n-type vertical nanowire transistor ($PD_R$) in a first level and the n-type vertical nanowire transistor ($PG_R$) in a second level of the second column, and to gates of the n-type vertical nanowire transistor ($PD_L$) in the first level of the first column and of the p-type vertical nanowire transistor ($PU_L$) in the third column; and
a second intra-cell connector ($Q_L$) connecting a current path terminal of the p-type vertical nanowire transistor ($PU_L$) in the third column to a current path terminal between the n-type vertical nanowire transistor ($PD_L$) in the first level and the n-type vertical nanowire transistor ($PG_L$) in the second level of the first column, and to gates of the n-type vertical nanowire transistor ($PD_R$) in the first level of the second column and of the p-type vertical nanowire transistor ($PU_R$) in the fourth column.

29. The computer program product of claim 28, wherein the four vertical nanowire transistor columns are arranged in layout at corners of a parallelogram, and the first intra-cell connector and the second intra-cell connector include respective first and second vias connecting the corresponding gates to the corresponding current path terminal, the first and second vias being disposed on opposing sides of the parallelogram.

30. The computer program product of claim 28, wherein the four vertical nanowire transistor columns are arranged in layout at corners of a parallelogram, and the first intra-cell connector and the second intra-cell connector include respective first and second vias connecting the corresponding gates to the corresponding current path terminal, the first and second vias being disposed outside of the parallelogram.

31. The computer program product of claim 28, wherein the four vertical nanowire transistor columns are arranged in layout at corners of a parallelogram, and the first intra-cell connector and the second intra-cell connector include respective first and second vias connecting the corresponding gates to the corresponding current path terminal, the first via being disposed inside of the parallelogram and the second via being disposed outside of the parallelogram.

32. The computer program product of claim 24, wherein the SRAM cell includes a first conductor disposed beneath and contacting current path terminals of vertical nanowire transistors in a first subset of the vertical nanowire transistor columns, and a second conductor disposed beneath and contacting current path terminals of vertical nanowire transistors in a second subset of the vertical nanowire transistor columns.

33. The computer program product of claim 25, wherein the SRAM cell includes a first conductor ($V_{SS}$) disposed beneath and contacting current path terminals of n-type vertical nanowire transistors in the first and second vertical nanowire transistor columns, and a second conductor ($V_{DD}$) disposed beneath and contacting current path terminals of p-type vertical nanowire transistors in the third and fourth vertical nanowire transistor columns.

34. The computer program product of claim 25, where the SRAM cell includes:
a first bit line conductor (BL) disposed above and contacting a current path terminal of the n-type vertical nanowire transistor in the second level of the first vertical nanowire transistor column;
a second bit line conductor (BL/) disposed above and contacting a current path terminal of the n-type vertical nanowire transistor in the second level of the second vertical nanowire transistor column; and
a word line conductor (WL) connected to the gates of the n-type vertical nanowire transistors in the second level of the first and second vertical nanowire transistor columns.

35. The computer program product of claim 24, further including logic to utilize the specification of the cell to determine a physical placement of the circuit.

36. A circuit, comprising:
an SRAM cell, the SRAM cell comprising a set of vertical nanowire transistor columns, each member of the set including a vertical nanowire transistor, and at least one member of the set being a vertical nanowire transistor column including two vertical nanowire transistors in series,
wherein the set consists of four vertical nanowire transistor columns, a first column including two n-type vertical nanowire transistors, a second column including two n-type vertical nanowire transistors, a third column including one p-type vertical nanowire transistor and a fourth column including one p-type vertical nanowire transistor.

* * * * *